(12) United States Patent
Komatsuda et al.

(10) Patent No.: US 6,563,567 B1
(45) Date of Patent: May 13, 2003

(54) METHOD AND APPARATUS FOR ILLUMINATING A SURFACE USING A PROJECTION IMAGING APPARATUS

(75) Inventors: Hideki Komatsuda, Kawasaki (JP); Osamu Tanitsu, Funabashi (JP); Akihiko Goto, Setagaya (JP); Nobumichi Kanayamaya, Kawasaki (JP); Masato Shibuya, Ohmiya (JP); Tetsuo Takahashi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/540,874

(22) Filed: Mar. 31, 2000

Related U.S. Application Data

(63) Continuation-in-part of application No. 09/765,697, filed on Dec. 17, 1999, now abandoned.

(30) Foreign Application Priority Data

| Dec. 17, 1998 | (JP) | ............................................ | 10-358749 |
| Mar. 31, 1999 | (JP) | ............................................ | 11-090735 |
| Sep. 9, 1999 | (JP) | ............................................ | 11-255636 |
| Oct. 5, 1999 | (JP) | ............................................ | 11-284213 |

(51) Int. Cl.[7] ......................... G03B 27/72; G03B 27/42; G03B 27/54
(52) U.S. Cl. .............................. 355/71; 355/53; 355/67
(58) Field of Search ............................ 355/52, 53, 55, 355/67–71, 77; 356/399–401; 250/548; 359/618–622

(56) References Cited

U.S. PATENT DOCUMENTS

| 4,497,015 A | 1/1985 | Konno et al. | |
| 5,237,367 A | 8/1993 | Kudo | ........................... 355/67 |
| 5,305,054 A | 4/1994 | Suzuki et al. | .................. 355/53 |
| 5,307,207 A | 4/1994 | Ichihara | ....................... 359/622 |
| 5,345,292 A | 9/1994 | Shiozawa et al. | ............. 355/67 |

(List continued on next page.)

FOREIGN PATENT DOCUMENTS

| EP | A1-0 687 956 | 12/1995 |
| EP | B1-0 720 970 | 7/1996 |
| EP | A1-0 747 772 | 12/1996 |

(List continued on next page.)

OTHER PUBLICATIONS

Partial translation of selective excerpts from JP-A-10-270312.

(List continued on next page.)

Primary Examiner—Henry Hung Nguyen
(74) Attorney, Agent, or Firm—Oliff & Berridge, PLC

(57) ABSTRACT

A method and illumination optical system forms a modified illumination configuration on an optical integrator so that a secondary light source having a desired modified illumination configuration is formed and light loss is minimized. A light beam shape changing element that diffuses illumination in a plurality of directions, and an angular light beam forming element that forms a plurality of light source images operate together to create a modified illumination configuration on the optical integrator. Since the secondary light source has a desired modified illumination configuration, an aperture stop used to restrict the size and/or shape of the secondary light source blocks only a small amount of illumination, or can be eliminated altogether. It is possible to alter the annular ratio and outer diameter of an annular or quadrupole modified illumination configuration by changing the magnification of a zoom optical system positioned between the light beam shape changing element and the angular light beam forming element. Furthermore, by changing the focal length of a zoom optical system (which is positioned upstream of the optical integrator), it is possible to change the outer diameter of the annular or quadrupole secondary light source without changing the annular ratio thereof.

24 Claims, 45 Drawing Sheets

U.S. PATENT DOCUMENTS

| | | | |
|---|---|---|---|
| 5,383,000 A | 1/1995 | Michaloski et al. | 355/67 |
| 5,392,094 A | 2/1995 | Kudo | |
| 5,420,417 A | 5/1995 | Shiraishi | 250/205 |
| 5,452,054 A * | 9/1995 | Dewa et al. | 355/67 |
| 5,459,547 A | 10/1995 | Shiozawa | 355/67 |
| 5,572,287 A | 11/1996 | Wangler et al. | 355/53 |
| 5,574,492 A | 11/1996 | Suzuki | 347/256 |
| 5,598,250 A | 1/1997 | Bae | 355/67 |
| 5,608,575 A | 3/1997 | Suzuki | 359/558 |
| 5,631,721 A | 5/1997 | Stanton et al. | |
| 5,636,003 A | 6/1997 | Tanitsu et al. | 355/67 |
| 5,640,284 A | 6/1997 | Tanitsu et al. | 359/869 |
| 5,646,715 A | 7/1997 | Wangler | 355/67 |
| 5,675,401 A | 10/1997 | Wangler et al. | |
| 5,695,274 A * | 12/1997 | Kamihara et al. | 362/268 |
| 5,707,908 A | 1/1998 | Komine et al. | 501/53 |
| 5,712,698 A | 1/1998 | Poschenrieder et al. | 355/71 |
| 5,719,704 A | 2/1998 | Shiraishi et al. | 359/558 |
| 5,850,300 A | 12/1998 | Kathman et al. | |
| 5,896,188 A | 4/1999 | McCullough | |
| 5,908,482 A | 6/1999 | Komine et al. | |
| 5,920,380 A | 7/1999 | Sweatt | |
| 5,994,006 A | 11/1999 | Nishi | 430/22 |
| 6,078,380 A | 6/2000 | Taniguchi et al. | 355/52 |
| 6,127,095 A | 10/2000 | Kudo | 430/311 |
| 6,198,793 B1 | 3/2001 | Schultz et al. | 378/34 |
| 6,211,944 B1 | 4/2001 | Shiraishi | 355/53 |
| 6,236,449 B1 | 5/2001 | Tanitsu | 355/67 |
| 6,238,063 B1 | 5/2001 | Tanitsu et al. | 362/268 |
| 6,243,206 B1 | 6/2001 | Wangler | 359/621 |
| 6,259,512 B1 * | 7/2001 | Mizouchi | 355/67 |
| 6,259,513 B1 | 7/2001 | Gallatin et al. | 355/71 |
| 6,285,443 B1 * | 9/2001 | Wangler et al. | 355/67 |
| 6,285,855 B1 * | 9/2001 | Tsuji | 399/618 |
| 6,327,022 B1 | 12/2001 | Nishi | 355/53 |
| 6,445,442 B2 | 9/2002 | Von Bunau et al. | 355/67 |
| 2001/0001247 A1 | 5/2001 | Finders et al. | 355/53 |
| 2001/0046038 A1 | 11/2001 | Mulkens et al. | 355/67 |
| 2001/0055107 A1 | 12/2001 | Tsuji | 355/67 |
| 2002/0036763 A1 | 3/2002 | Krikke et al. | 355/67 |

FOREIGN PATENT DOCUMENTS

| | | |
|---|---|---|
| EP | A2-0 949 541 | 10/1999 |
| EP | 1 069 600 A1 | 1/2001 |
| JP | A-5-251308 | 9/1993 |
| JP | 06-118331 | 4/1994 |
| JP | 06-204123 | 7/1994 |
| JP | 09-219358 | 8/1997 |
| JP | 10-070070 | 3/1998 |
| JP | A-10-270312 | 10/1998 |
| JP | A-11-174365 | 7/1999 |
| WO | WO99/49505 | 9/1999 |

OTHER PUBLICATIONS

Partial translation of EP–0 747 772 (col. 2, line 52–col. 6, line 21).

SPIE, vol. 2726, "Challenges to depth–of–focus enhancement with a practical super–resolution technique", Ogawa et al., pp. 34–45), 1997.

* cited by examiner

FIG. 4A
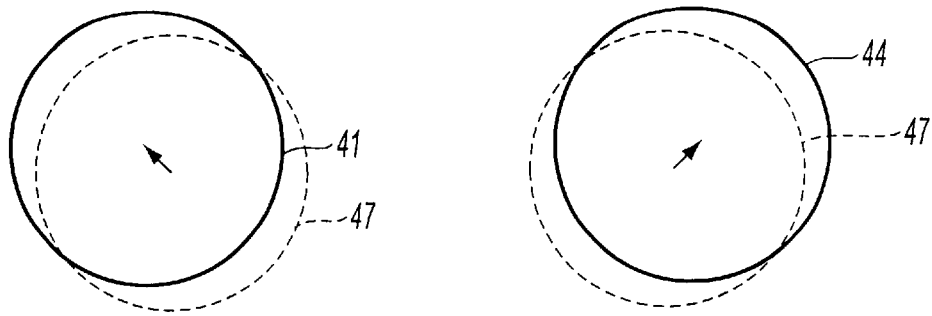
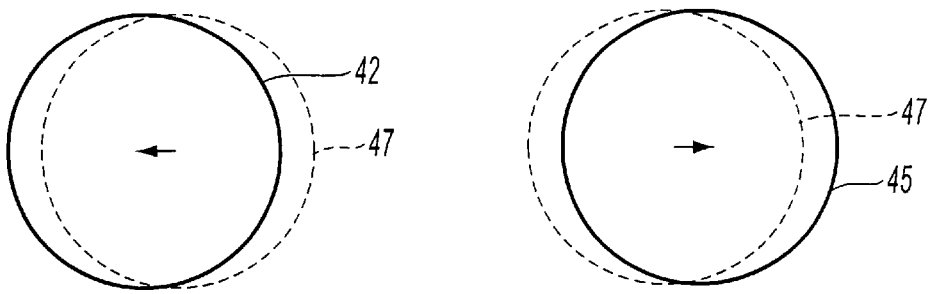
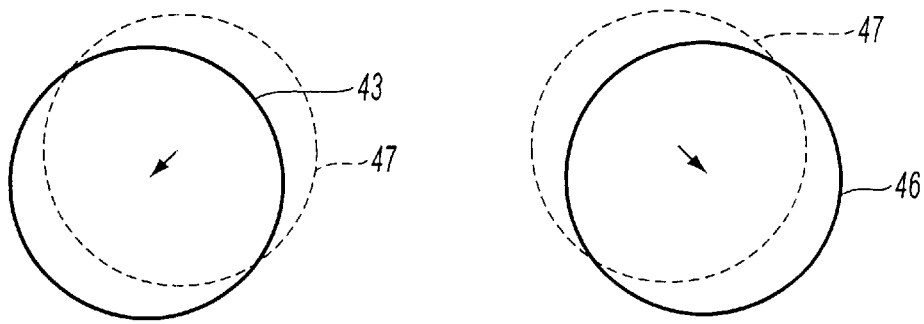
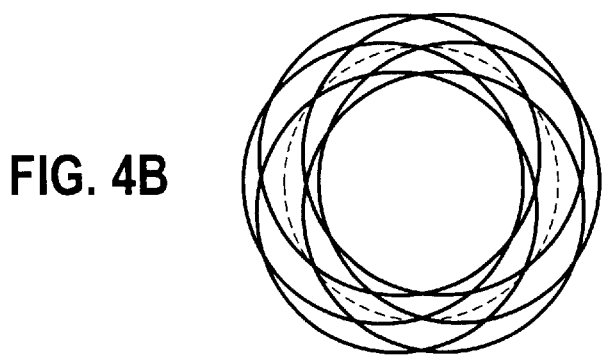
FIG. 4B

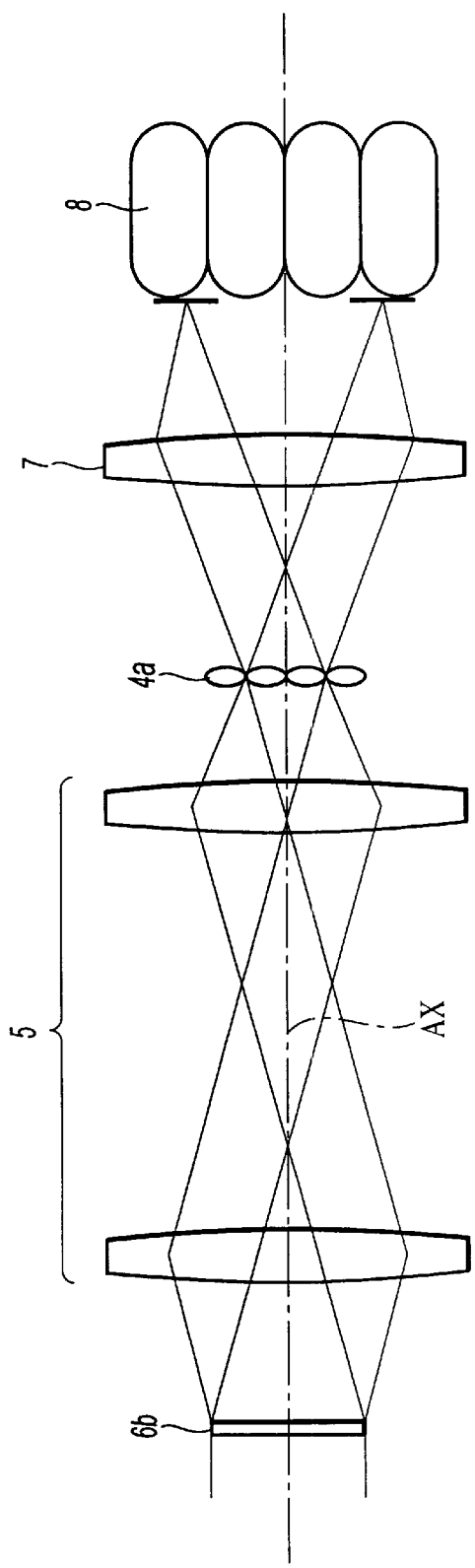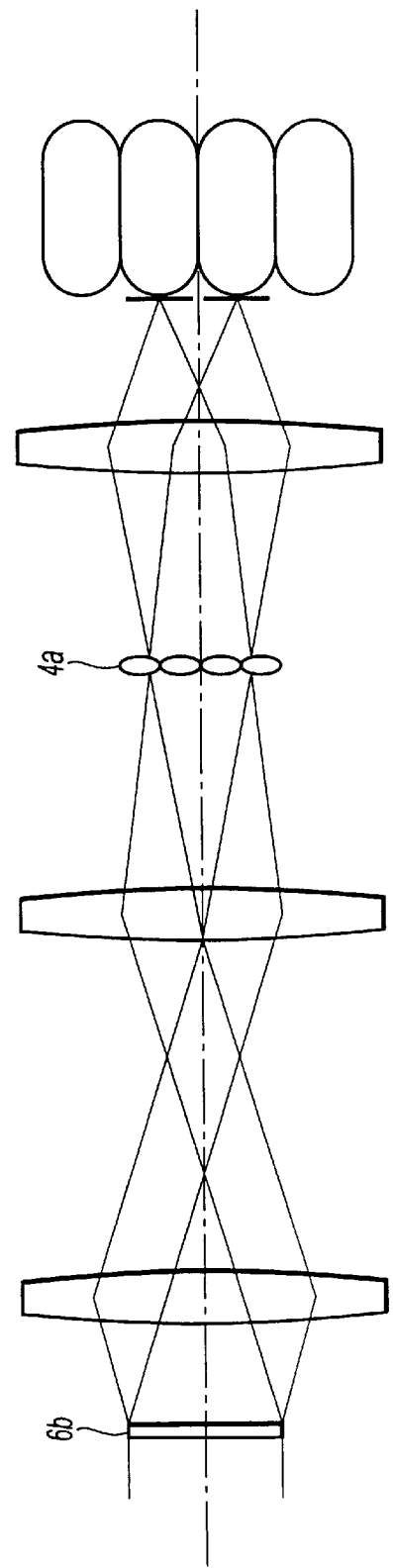
FIG. 20A
FIG. 20B

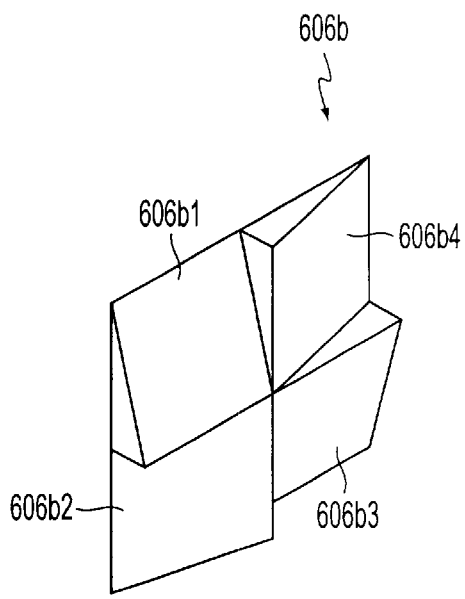
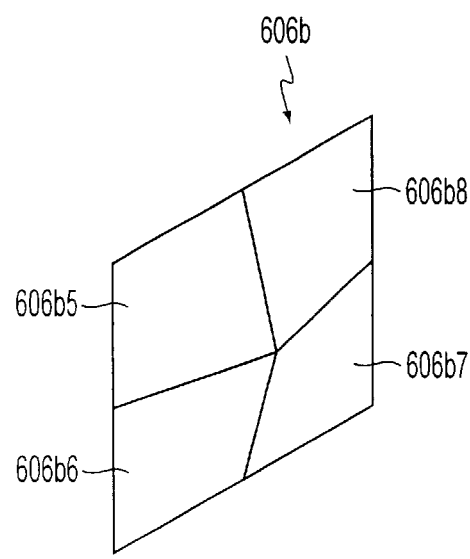
FIG. 26A
FIG. 26B

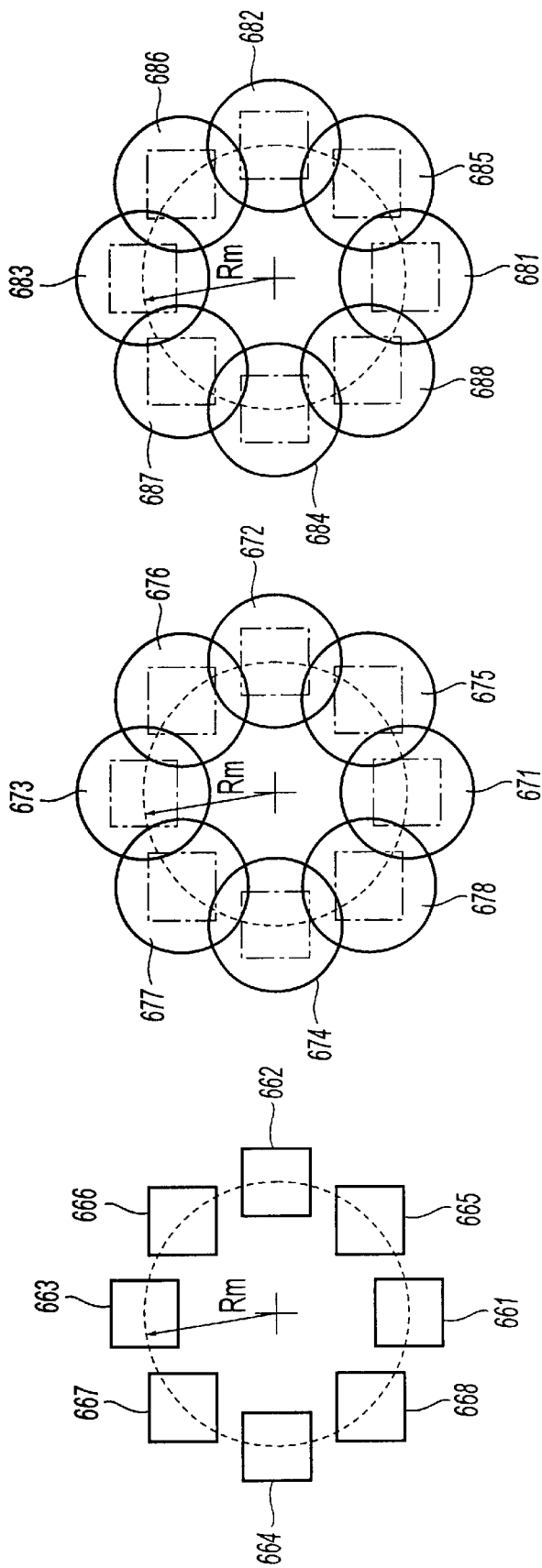

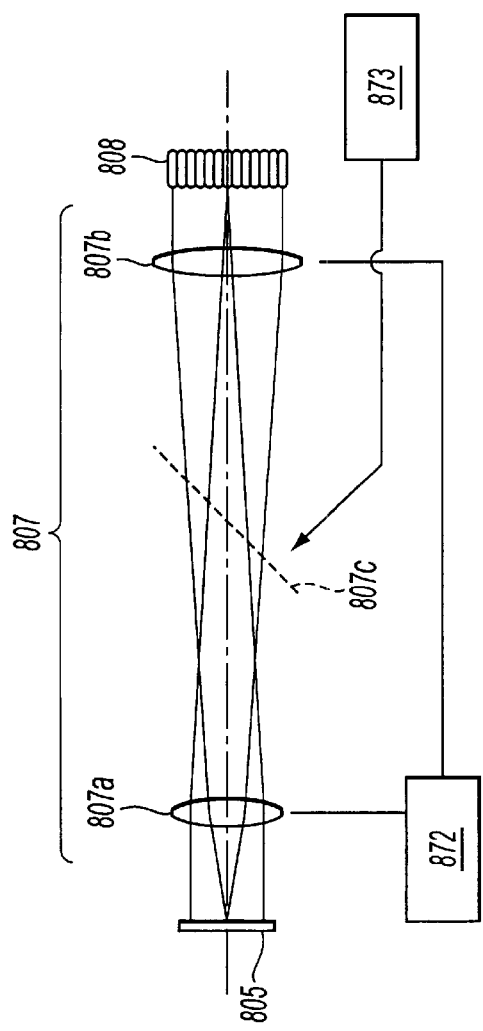
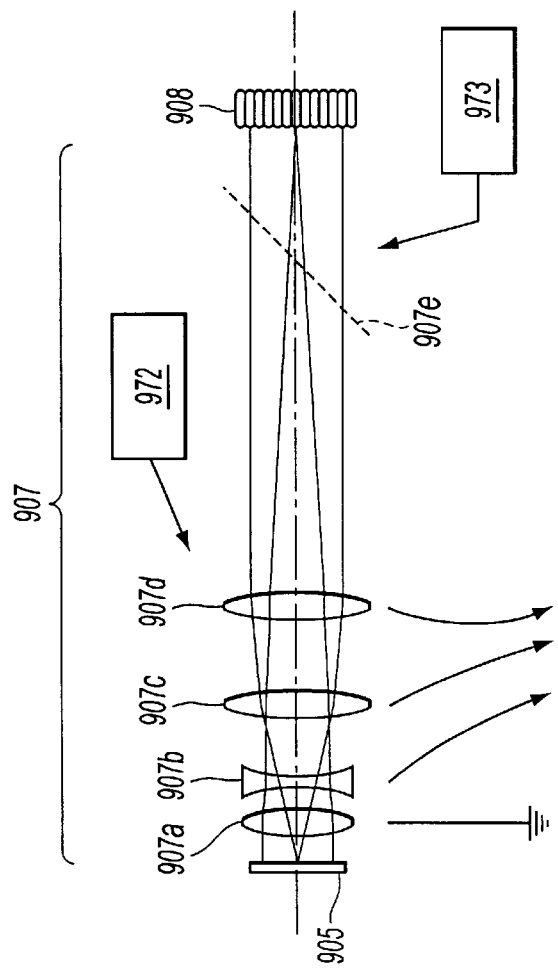
FIG. 41A
FIG. 41B

METHOD AND APPARATUS FOR ILLUMINATING A SURFACE USING A PROJECTION IMAGING APPARATUS

This is a Continuation-in-Part of application Ser. No. 09/465,697 filed Dec. 17, 1999 now abandoned. The entire disclosure of the prior application is hereby incorporated by reference herein in its entirety.

INCORPORATION BY REFERENCE

The disclosures of the following priority applications are herein incorporated by reference: Japanese Patent Application No. 10-358749, filed Dec. 17, 1998, Japanese Patent Application No. 11-90735, filed Mar. 31, 1999 and Japanese Patent Application No. 11-255636, filed Sep. 9, 1999.

BACKGROUND OF THE INVENTION

1. Field of Invention

The invention relates to a method and apparatus for illuminating a surface, such as a mask or reticle surface, using a projection imaging apparatus. The invention relates to a method and apparatus for transferring a pattern, particularly a microdevice (e.g., semiconductor device (IC, LSI, VLSI), liquid crystal display, thin film magnetic head, image pick-up devices (CCD), etc.) pattern, onto a work (e.g., a wafer, substrate, etc.) and relates to a method for manufacturing the microdevice.

2. Description of Related Art

In a typical exposure apparatus, light beams emitted from a light source are incident on a fly-eye lens and form a secondary light source that includes a plurality of light source images at the focal surface on the back side of the fly-eye lens. Light beams from the secondary light source are restricted by an aperture stop positioned adjacent the back side focal surface of the fly-eye lens, and are then incident on a condenser lens. The aperture stop restricts the shape or size of the secondary light source to a desired shape or size in accordance with the desired illumination conditions (exposure conditions).

The light beams condensed by the condenser lens overlappingly illuminate a mask that has a prescribed pattern. Light that passes through the pattern in the mask forms an image on a wafer via a projection optical system. In this manner, the mask pattern is projected and exposed on the wafer. The pattern formed in the mask is highly integrated, and in order to accurately copy this detailed pattern onto the wafer, it is vital that a uniform illumination intensity be obtained on the wafer.

In recent years, improvements in illumination performance have been obtained by enabling variation of the size of the secondary light source formed by the fly-eye lens and changing the coherency σ (σ=aperture stop diameter/illumination optical system pupil diameter, or σ=illumination optical system exit side numerical aperture/illumination optical system incident side numerical aperture) of the illumination by changing the size of the aperture (light transmissive region) of the aperture stop positioned on the exit side of the fly-eye lens. In addition, the shape of the secondary light source formed by the fly-eye lens has been restricted into an annular shape or quadrupole shape, which results in improvements in the focal depth and resolving power of the projection optical system.

In order to accomplish modified illumination (annular modified illumination or quadrupole modified illumination) by restricting the shape of the secondary light source to an annular shape or a quadrupole shape, the light beams from the relatively large secondary light source formed by the fly-eye lens are restricted by an aperture stop having an annular shape or quadrupole shape aperture. In other words, with annular modified illumination or quadrupole modified illumination in conventional technology, the appropriate portions of the light beams from the secondary light source are blocked by the aperture stop, and do not contribute to illumination (exposure). As a result, the illumination brightness on the mask and the wafer declines due to the loss of light in the aperture stop, and the throughput as an exposure apparatus also declines.

In consideration of the foregoing, it is an objective of the present invention to provide an illumination optical apparatus which can accomplish modified illumination such as annular illumination or quadrupole illumination while satisfactorily suppressing light loss in the aperture stop.

SUMMARY OF THE INVENTION

The invention provides an illumination method and apparatus to change the type and parameters of modified illumination and to obtain a focus depth and resolution for the projection optical system suitable for the detailed patterns to be exposed and projected. As a result, it is possible to accomplish satisfactory projection exposure with high throughput under high exposure brightness and satisfactory exposure conditions. In addition, with an exposure method that exposes the pattern on a mask positioned at the target illumination surface onto a photosensitive substrate using the illumination optical apparatus of the present invention, it is possible to accomplish projection exposure under satisfactory exposure conditions, thereby making it possible to produce satisfactory devices.

In one aspect of the invention, an illumination optical system includes a light beam shape changing element that diffuses illumination in a plurality of directions, and an angular light beam forming element that forms a plurality of light source images. Together, the light beam shape changing element and the angular light beam forming element create a modified illumination configuration, such as an annular or quadrupole illumination configuration, on an optical integrator. Thus, the optical integrator forms a secondary light source having a desired modified illumination configuration. Since the secondary light source has a desired configuration, an aperture stop used to restrict the size and/or shape of the secondary light source blocks only a small amount of illumination, or can be eliminated altogether.

The light beam shape changing element can be arranged upstream of the angular light beam forming element, or the angular light beam forming element can be arranged upstream of the light beam shape changing element. The light beam shape changing element can be any type of optical device that diffuses received light in a plurality of directions. For example, the light beam shape changing element can be a diffractive optical element or prism that forms a ring-shaped or multi-pole-shaped illumination pattern in the far field using incident parallel light. The angular light beam forming element can be any optical device that forms a plurality of light sources from incident light, and can be, for example, a fly eye lens or micro fly's eye lens.

In addition, with the present invention it is possible to alter the annular ratio and outer diameter of an annular or quadrupole secondary light source by changing the magnification of a zoom optical system positioned between the light beam shape changing element and the angular light beam forming element. Furthermore, by changing the focal length of a zoom optical system (which is positioned upstream of the optical integrator), it is possible to change the outer diameter of the annular or quadrupole secondary light source without changing the annular ratio thereof. As a result, it is possible to alter only the annular ratio of the annular or quadrupole secondary light source without changing the outer diameter thereof by appropriately changing the focal length of the zoom lens and the magnification of the zoom optical system.

The light beam shape changing element and the angular light beam forming element can be made interchangeable with other light beam shape changing elements and/or the angular light beam forming elements or other optical elements to allow the illumination optical system to create a variety of different types of modified illumination configurations or conventional illumination. For example, in one embodiment, the angular light beam forming element can be replaced with an annular ratio variable optical system that receives light from a light beam shape changing element and varies an annular ratio of an annular illumination configuration formed by the light beam shape changing element.

These and other aspects of the invention will be apparent and/or obvious from the following description.

BRIEF DESCRIPTION OF THE DRAWINGS

The invention is described in conjunction with the following drawings in which like reference numerals refer to like elements, and wherein:

FIGS. 4(a) and (b) show how an annular illumination configuration is formed by superimposing a plurality of ring-shaped images;

FIGS. 20(a) and (b) schematically show the illumination optical apparatus according to the third embodiment, with FIG. 10(b) showing a state in which the magnification of the first zoom lens 5 expanded more than in the state shown in FIG. 10(a);

FIGS. 26A and 26B show first and second quad prism sets included in the mircolens array;

FIGS. 27A–C and 28A–B show exemplary illumination configurations formed on the optical integrator of the fifth embodiment;

FIG. 41 is a schematic diagram of a portion of the illumination optical apparatus according to an eighth embodiment of the invention;

DETAILED DESCRIPTION OF PREFERRED EMBODIMENTS

First Embodiment

Figure 1:
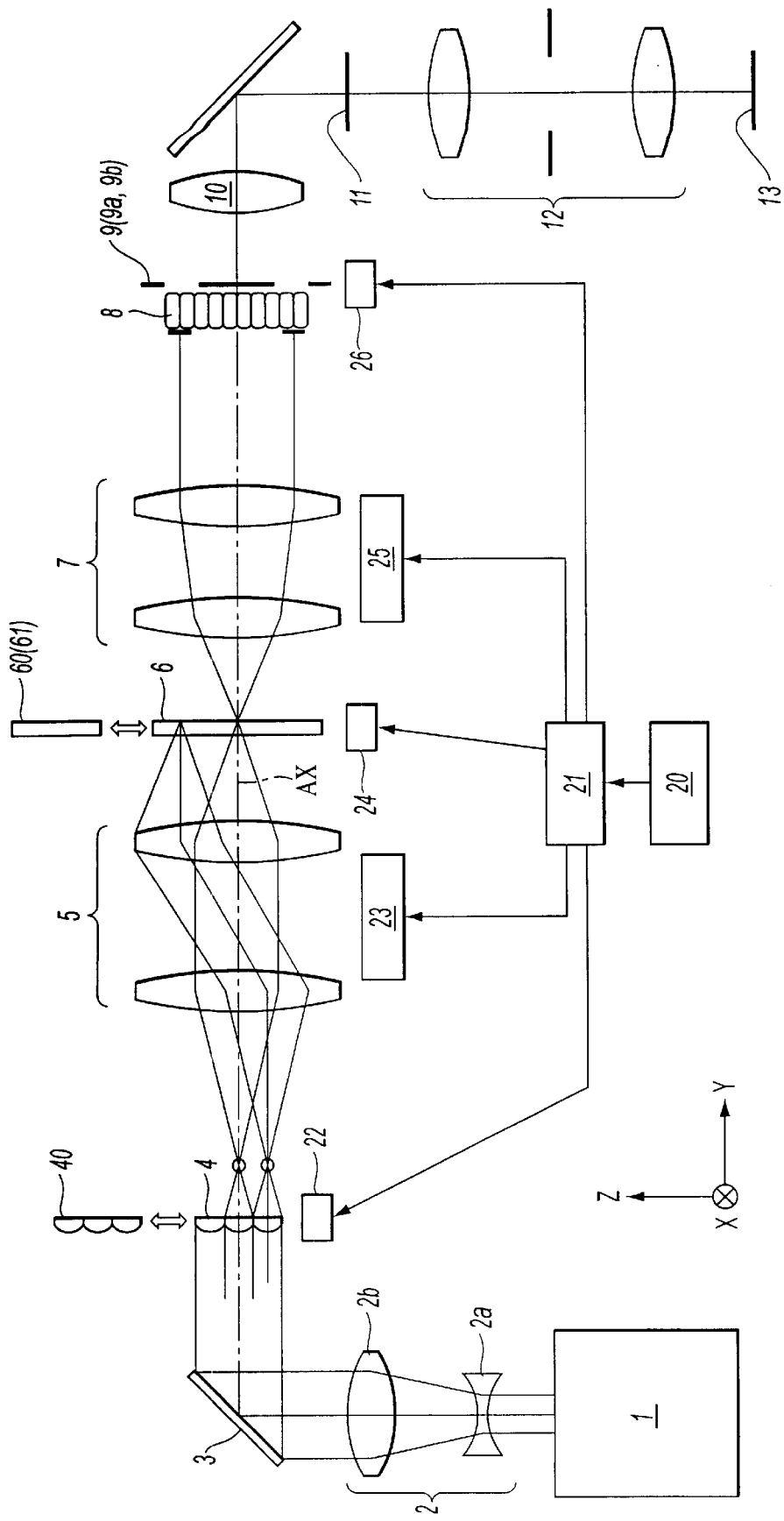
FIG. 1 is a schematic diagram of an illumination optical apparatus according to a first embodiment of the invention.

FIG. 1 is a schematic diagram of an exposure apparatus provided with the illumination optical apparatus according to a first embodiment of the present invention.

The exposure apparatus of FIG. 1 includes an excimer laser light source 1 that outputs light having a wavelength of 248 nm or 193 nm, although other light sources and wavelength outputs are possible. Substantially parallel light beams emitted along the Z direction by the light source 1 have a rectangular cross-section that extends lengthwise along the X direction, and are incident on a beam expander 2 that includes a pair of cylindrical lenses 2a and 2b. The cylindrical lenses 2a and 2b have a negative refractive power and a positive refractive power, respectively, in the plane of the paper in FIG. 1 (the Y-Z plane), and function as plane parallel plates in the plane orthogonal to the plane of the paper and including the optical axis AX (the X-Z plane). Accordingly, light beams incident on the beam expander 2 are expanded in the plane of the paper in FIG. 1, and are shaped into light beams having a predetermined rectangular cross-section.

Figure 2:
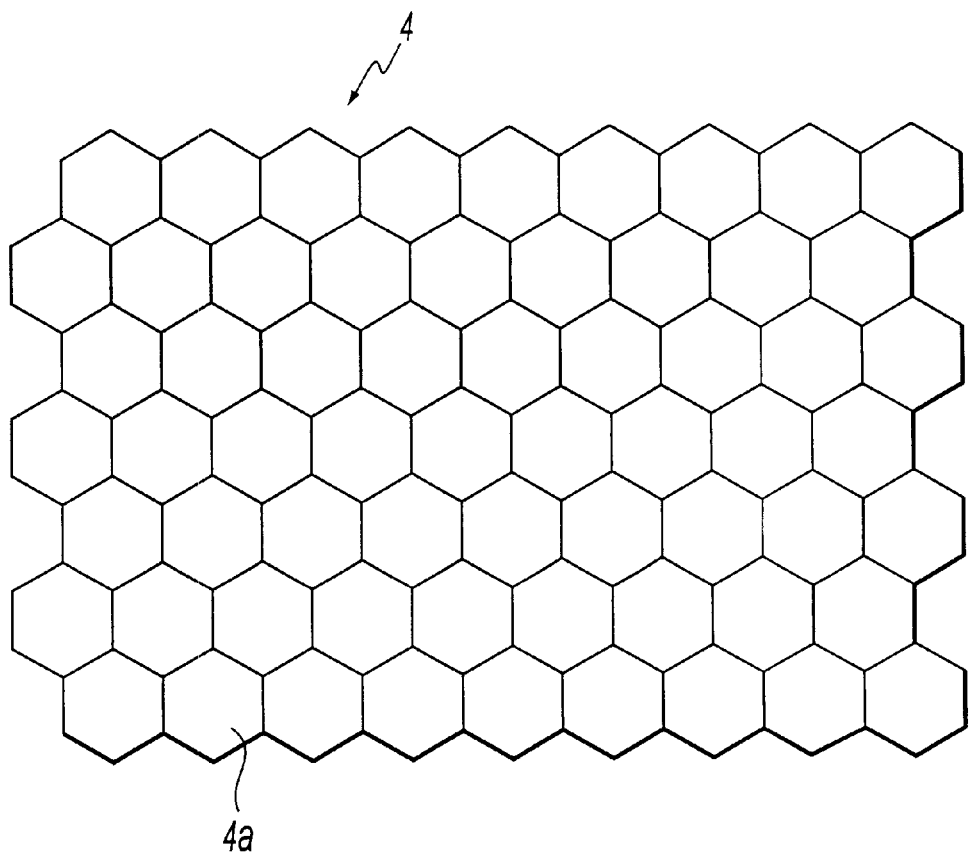
FIG. 2 is a schematic diagram of lens elements in an example micro fly's eye lens.

The substantially parallel light beams transmitted through the beam expander 2 are deflected in the Y direction by a folding mirror 3, and are then incident on a micro fly's eye lens 4. The micro fly's eye lens 4 is an optical element comprising a plurality of microlenses 4a having positive refractive powers and regular hexagonal shapes arranged densely in the vertical and horizontal directions, as shown in FIGS. 1 and 2. In general, the microlens groups of the micro fly's eye lens 4 are preferably formed by an etching process on a plane parallel glass plate, for example.

Each of the microlenses of the micro fly's eye lens 4 is smaller than the lens elements of a conventional fly-eye lens. In addition, the micro fly's eye lens 4, unlike a conventional fly-eye lens that has mutually isolated lens elements, are formed so that the microlenses are not mutually isolated. However, the micro fly's eye lens 4 is the same as a conventional fly-eye lens in that lens elements having a positive refractive power are arranged in the vertical and horizontal directions. In order to promote clarity in FIGS. 1 and 2, only a very few of the microlenses 4a in the micro fly's eye lens 4 are shown compared to the actual number of microlenses 4a in the array 4.

Light beams incident on the micro fly's eye lens 4 are two-dimensionally partitioned by the plurality of microlenses 4a, and a light source image is formed at a back side focal plane of each microlens 4a, i.e., at a plane downstream of the light source 1. The light beams from the plurality of light source images formed at the back side focal plane of each microlens 4a are diffused light beams each having, in this example, a regular hexagonal cross-section, and are incident on an afocal zoom lens 5. Although the zoom lens 5 is preferably an afocal zoom lens, a focal zoom lens can be used, if desired. The afocal zoom lens 5 is composed so that the magnification thereof is continuously changeable within a predetermined range while maintaining an afocal optical system. Thus, the micro fly's eye lens 4 is an angular light beam forming element that converts substantially parallel light beams from the light source 1 into a plurality of light source images that each emit light beams at various angles with respect to the optical axis AX.

The micro fly's eye lens 4 is removable from the illumination optical path, and can be interchanged with another micro fly's eye lens 40, as is discussed in more detail below. The micro fly's eye lens 4 and the micro fly's eye lens 40 are interchanged by a first driving system 22 which operates on the basis of commands from a control system 21. The magnification of the afocal zoom lens 5 is accomplished by a second driving system 23 which also operates on the basis of commands from the control system 21.

Light beams that pass through the afocal zoom lens 5 are incident on a diffractive optical element (DOE) 6. That is, diffused light beams from each light source image formed at the back side focal plane of the micro fly's eye lens 4 are condensed onto the diffraction surface of the diffractive optical element 6 while maintaining the regular hexagonal cross-section. Thus, the afocal zoom lens 5 links the back side focal plane of the micro fly's eye lens 4 and the diffraction surface of the diffractive optical element 6 as optical conjugates. Furthermore, the numerical aperture of the light beams collected to one point on the diffraction surface of the diffractive optical element 6 is dependent on the magnification of the afocal zoom lens 5.

Figure 3A:
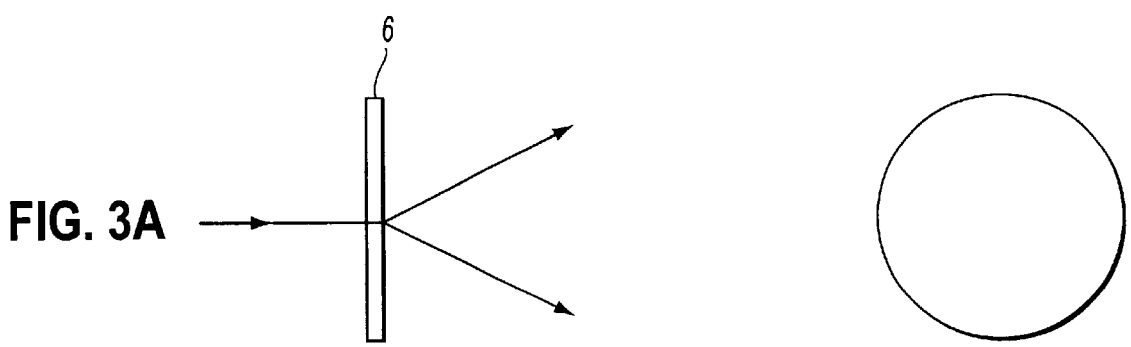
FIGS. 3(a)–3(c) show how a first diffractive optical element operates to diffuse received light.

In this example, the diffractive optical element 6 includes a succession of levels or steps in a glass substrate having a pitch on the order of the wavelength of the exposure light (illumination light), and diffracts an incident beam to a desired angle. Specifically, the diffractive optical element 6 radially diffuses orthogonally incident light beams parallel to the optical axis AX in accordance with a predetermined diffusion angle, as shown in FIG. 3(a). In other words, a narrow light beam orthogonally incident on the diffractive optical element 6 along the optical axis AX is diffracted in all directions at equal angles centered about the optical axis AX. As a result, the narrow light beam orthogonally incident on the diffractive optical element 6 is converted into a diffused light beam having a ring-shaped cross-section. Thus, the diffractive optical element 6 is a light beam changing element that converts narrow incident light beams into ring-shaped light beams diffused radially.

Figure 3B:
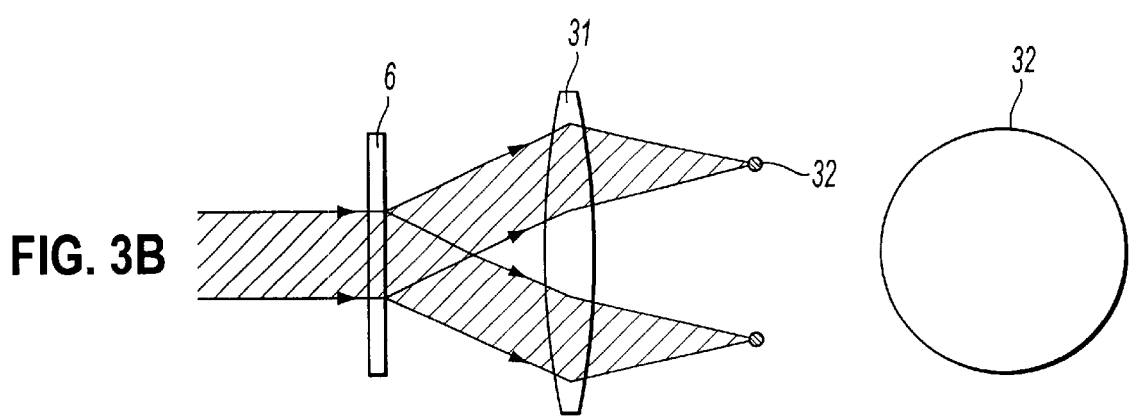

As shown in FIG. 3(b), when a wide parallel light beam is orthogonally incident on the diffractive optical element 6, a ring-shaped image (ring-shaped light source image) 32 is formed at the focal position of a lens 31 positioned behind the diffractive optical element 6. That is to say, the diffractive optical element 6 forms a ring-shaped light intensity distribution at the far field (or the Fraunhofer diffraction zone).

Figure 3C:
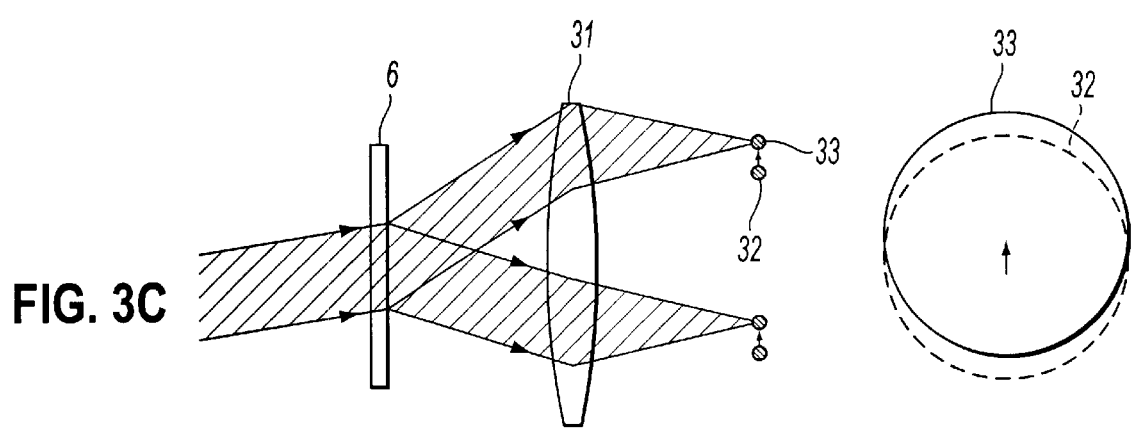

As shown in FIG. 3(c), when a wide parallel light beam incident on the diffractive optical element 6 is inclined with respect to the optical axis AX, the ring-shaped image formed at the focal position of the lens 31 is shifted. That is to say, when a wide parallel light beam incident on the diffractive optical element 6 is inclined along a predetermined plane (the plane of the paper in FIG. 3), the center of the ring-shaped image 33 that is formed at the focal position of the lens 31 is shifted in a direction opposite the direction of inclination of the light beam along a predetermined plane without the size of the ring-shaped image 33 being changed.

As described above, the diffused light beams from each light source image formed at the back side focal plane of the micro fly's eye lens 4 converge on the diffraction surface of the diffractive optical element 6 with the regular hexagonal cross-section maintained. In other words, when light beams having a plurality of angular components are incident on the diffractive optical element 6, the incident angle thereof is determined by the regular hexagonal conical light beam range. Accordingly, as shown in FIG. 4(a), light beams incident at a maximum angle corresponding to each ridge line of the regular hexagonal conical light beam range form ring-shaped images 41–46 (indicated by the solid lines in the diagram), centered about the ring-shaped image 47 (indicated by the dotted lines in the diagram) formed by light beams orthogonally incident on the diffractive optical element 6. In FIG. 4(b), the condition with the ring-shaped images 41–47 thus formed at the focal position of the lens 31 are shown superimposed.

Figure 5:
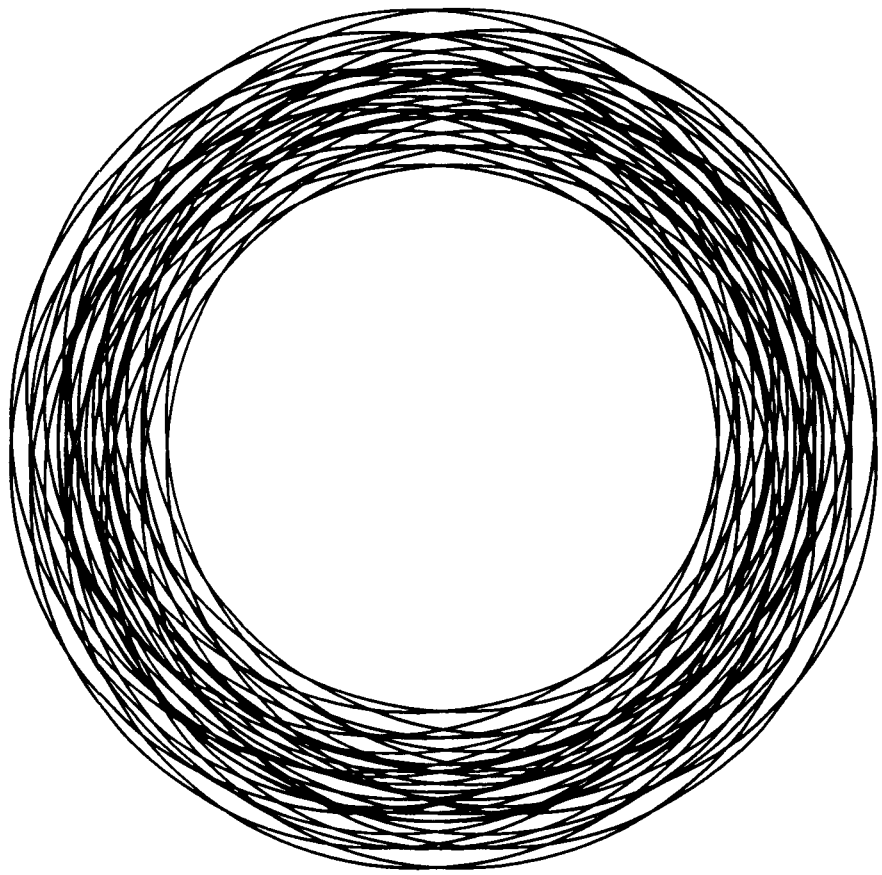
FIG. 5 shows an annular illumination configuration formed from a plurality of ring-shaped images.

In actuality, an infinite number of light beams having a plurality of angular components determined by the regular hexagonal conical light beam range are incident on the diffractive optical element 6, and consequently, an infinite number of ring-shaped images are superimposed at the focal position of the lens 31. Thus, an overall annular image like that shown in FIG. 5 is formed when the micro fly's eye lens 4 and the diffractive optical element 6 are positioned along the optical axis AX as shown in FIG. 1.

The diffractive optical element 6 can also be interchanged with a diffractive optical element 60 and a diffractive optical element 61, which are described in more detail below. The diffractive optical element 6, the diffractive optical element 60 and the diffractive optical element 61 are interchanged by a third driving system 24, which operates on the basis of commands from the control system 21.

With reference again to FIG. 1, light beams that pass through the diffractive optical element 6 are incident on a zoom lens 7. In this example, the zoom lens 7 has the same function as the lens 31 shown in FIG. 3. In addition, the incident surface of a fly-eye lens 8 is positioned adjacent the back side focal plane of the zoom lens 7. Accordingly, light beams passing through the diffractive optical element 6 form an annular illumination field at the back side focal plane of the zoom lens 7 and hence at the incident surface of the fly-eye lens 8. The outer diameter of this annular illumination field depends on the focal length of the zoom lens 7. Thus, the zoom lens 7 makes the diffractive optical element 6 and the incident surface of the fly-eye lens 8 effectively have the relationship of a Fourier transform. Changing the focal length of the zoom lens 7 is accomplished by a fourth driving system 25 which acts on the basis of commands from the control system 21.

The fly-eye lens 8 includes a plurality of lens elements having positive refractive powers that are arranged densely in the vertical and horizontal directions. Each lens element of the fly-eye lens 8 has a rectangular cross-section similar to the shape of the illumination field to be formed on the mask (and hence, similar to the shape of the exposure region to be formed on the wafer). Additionally, the surface on the incident side of each lens element of the fly-eye lens 8 has a spherical shape with the convexity facing the incident side, and the surface on the exit side of each lens element has a spherical shape with the convexity facing the exit side.

Accordingly, light beams incident on the fly-eye lens 8 are two-dimensionally partitioned by the plurality of lens elements, and are formed into light source images at the back side focal plane of each lens element on which the light beams are incident. In this way, a plurality of annular light sources (hereafter referred to as "secondary light sources") are formed at the back side focal plane of the fly-eye lens 8.

Light beams from the annular secondary light sources formed at the back side focal plane of the fly-eye lens 8 are incident on an aperture stop 9. This aperture stop 9 is supported on a turret (not shown in FIG. 1) capable of rotating about a predetermined axis parallel to the optical axis AX.

Figure 6:
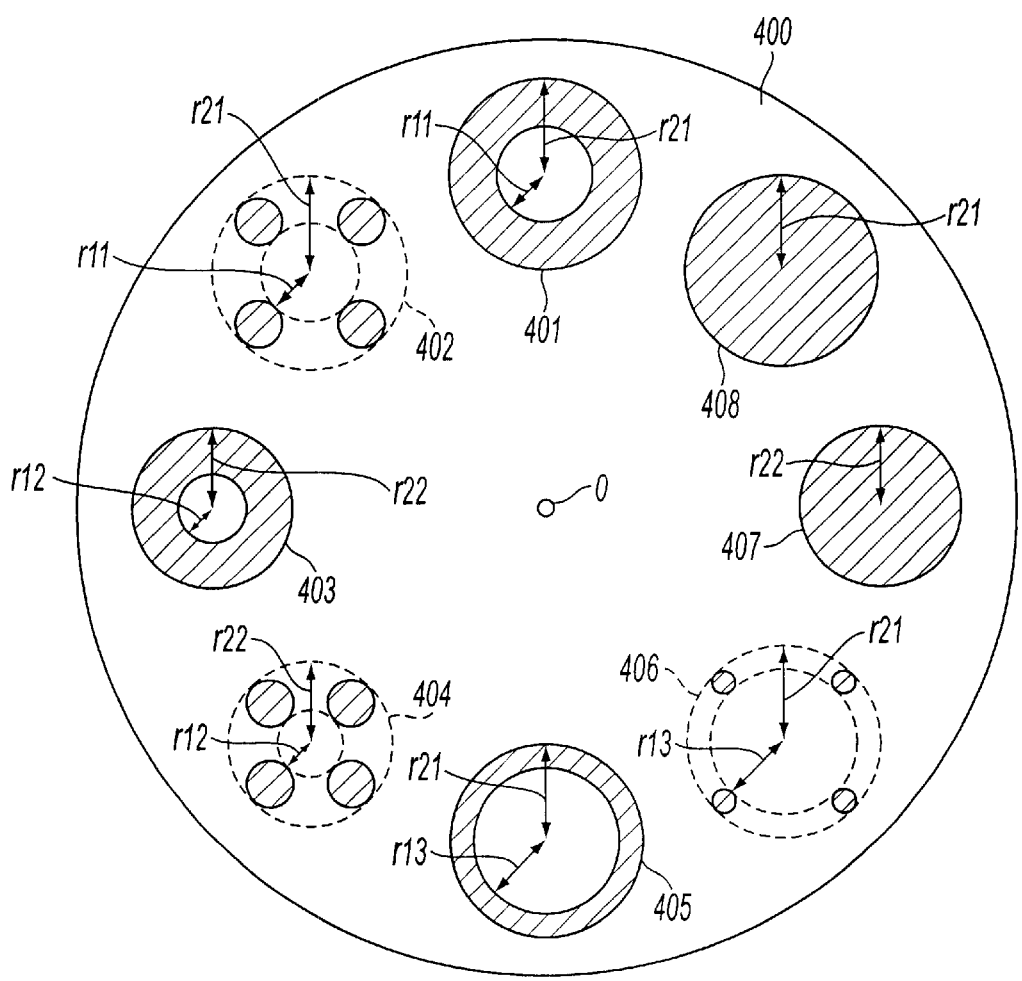
FIG. 6 is a schematic diagram of an aperture stop turret plate having a plurality of aperture stop configurations.

FIG. 6 is a diagram schematically showing the composition of the turret on which a plurality of aperture stops are positioned circumferentially. As shown in FIG. 6, eight aperture stops 401–408 having optically transmissive regions indicated by the slanted lines in the diagram are provided along the circumferential direction on a turret substrate 400. The turret substrate 400 can rotate about an axis parallel to the optical axis AX around a center point O. Accordingly, by rotating the turret substrate 400, it is possible to position one of the aperture stops 401–408 in the illumination optical path. Rotation of the turret substrate 400 is accomplished by a fifth driving system 26 which operates on the basis of commands from the control system 21.

In this example, three annular aperture stops 401, 403 and 405 of differing annular ratios are formed in the turret substrate 400. The annular aperture stop 401 has an annular transmissive region with an annular ratio of r11/r21. The annular aperture stop 403 has an annular transmissive region with an annular ratio of r12/r22. The annular aperture stop 405 has an annular transmissive region with an annular ratio of r13/r21.

Three quadrupole aperture stops 402, 404 and 406 of differing annular ratios are also formed in the turret substrate 400. The quadrupole aperture stop 402 has four eccentric circular transmissive regions within an annular region having an annular ratio of r11/r21. The quadrupole aperture stop 404 has four eccentric circular transmissive regions within an annular region having an annular ratio of r12/r22. The quadrupole aperture stop 406 has four eccentric circular transmissive regions within an annular region having an annular ratio of r13/r21.

Two circular aperture stops 407 and 408 of differing size (aperture) are also formed in the turret substrate 400. The circular aperture stop 407 has a circular transmissive region with a size of 2*r22, while the circular aperture stop 408 has a circular transmissive region with a size of 2*r21.

By selecting and positioning one annular aperture stop out of the three annular aperture stops 401, 403 and 405 in the illumination optical path, it is possible to form annular light beams having three differing annular ratios and to accomplish three types of annular modified illumination of differing annular ratios. In addition, by selecting and positioning one quadrupole aperture stop out of the three quadrupole aperture stops 402, 404 and 406 in the illumination optical path, it is possible to accurately form four eccentric light beams having three differing annular ratios and to accomplish three types of quadrupole modified illumination of differing annular ratios. Furthermore, by selecting and positioning one circular aperture stop out of the two circular aperture stops 407 and 408 in the illumination optical path, it is possible to accomplish two types of regular circular illumination of differing a values. A multiple pole aperture stop (e.g., binalpole or octalpole aperture stop) which has multi-eccentric circular, elliptic, or fan-shaped transmissive regions can also be used as an aperture stop on the turret substrate 400. The transmissive regions of the quadrupole aperture stops 402, 404 and 406 are not only circular-shaped, but can also be elliptic-shaped, or fan-shaped (e.g., the shape of quarter circles). It is possible for the variable aperture stop (e.g., iris diaphragm) to be attached to the turret substrate 400 instead of the circular aperture stops 407 and 408.

In FIG. 1, annular secondary light sources are formed at the back side focal plane of the fly-eye lens 8 when the micro fly's eye lens 4 and the diffractive optical element 6 are positioned along the optical axis AX, and consequently one of the annular aperture stops can be selected from the three annular aperture stops 401, 403 and 405 as the aperture stop 9. However, the composition of the turret shown in FIG. 6 is intended to be illustrative and not limiting with regard to the type or number of aperture stops positioned thereon. In addition, the invention is not limited to a turret-type aperture stop 9, for it is also possible to use an aperture stop that has an optically transmissive region that is changeable in size and shape. Furthermore, in place of the two circular aperture stops 407 and 408, it is possible to provide an iris aperture stop that has a continuously variable circular aperture diameter.

Light from the secondary light sources that has passed through the aperture stop 9 having an annular aperture (light transmission area) is condensed by a condenser optical system 10 that functions as a light-guiding optical system, and uniformly illuminates a mask 11 in an overlapping manner. Light beams that have passed through a pattern on the mask 11 form an image of the mask pattern on a wafer 13 having a photosensitive substrate via a projection optical system 12. In this manner, the pattern on the mask 11 is successively exposed onto each exposure region of the wafer 13 by accomplishing bulk exposure or scan exposure while two-dimensionally drive controlling the wafer 13 in the plane orthogonal to the optical axis AX of the projection optical system 12 (the X-Y plane).

In bulk exposure, the mask 11 pattern is exposed in bulk onto each exposure region of the wafer 13 in accordance with the so-called step and repeat method. In this case, the shape of the illumination region on the wafer 13 is a nearly square rectangle, and the cross-sectional shape of each lens element in the fly-eye lens 8 is also a nearly square rectangle.

On the other hand, in scan exposure, the mask 11 pattern is scan exposed onto each exposure region of the wafer 13 while moving the mask 11 and wafer 13 relative to the projection optical system 12 in accordance with the so-called step and scan method. In this case, the shape of the illumination region on the mask 11 is a rectangle with the ratio of the length of the short sides to the length of the long sides being for example 1:3, so the cross-sectional shape of each lens element of the fly-eye lens 8 has a rectangular shape similar to this.

Figure 7A:
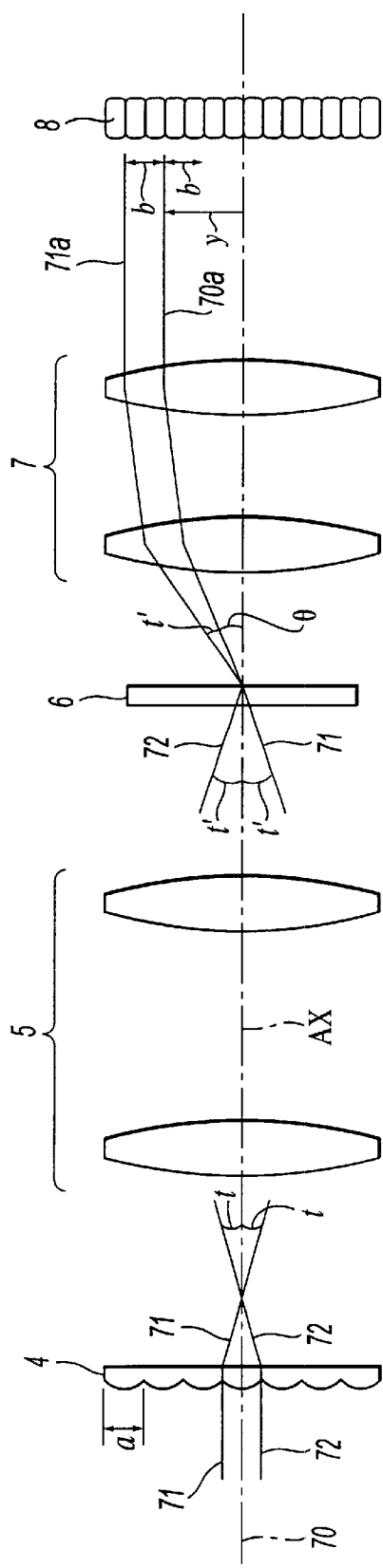
FIGS. 7(a) and (b) shows how an annular ratio and diameter of an annular illumination configuration can be changed.
Figure 7B:
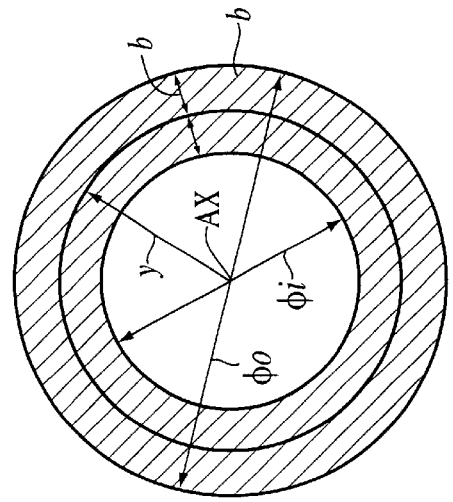

FIG. 7 is a drawing that schematically shows the illumination optical apparatus from the micro fly's eye lens 4 to the incident surface of the fly-eye lens 8, and explains the relationship between the magnification of the afocal zoom lens 5 and the focal length of the zoom lens 7, and the size and shape of the annular illumination field formed on the incident surface of the fly-eye lens 8.

In FIG. 7, a light beam 70 incident along the optical axis AX on the center of the microlens 4*a* positioned on the optical axis AX of the micro fly's eye lens 4 exits along the optical axis AX. The micro fly's eye lens 4 in this example has microlenses of size "a" (a measurement corresponding to the diameter of a circle circumscribed around a regular hexagon) and focal length f1. The light beam 70 passes through the afocal zoom lens 5 and is then incident on the diffractive optical element 6 along the optical axis AX.

The diffractive optical element 6 forms a light beam 70*a* exiting at an angle Θ with respect to the optical axis AX from the light beam 70 orthogonally incident along the optical axis AX. The light beam 70*a* exiting at angle Θ from the diffractive optical element 6 reaches the incident surface of the fly-eye lens 8 via the zoom lens 7 having focal length f2. The position of the light beam 70*a* on the incident surface of the fly-eye lens 8 has a height y from the optical axis AX.

On the other hand, a light beam 71 incident parallel to the optical axis AX on the uppermost edge of the microlens 4*a* positioned on the optical axis AX in the micro fly's eye lens 4 exits at an angle t with respect to the optical axis AX. This light beam 71 passes through the afocal zoom lens 5 having magnification m, and is then incident on the diffractive optical element 6 at an angle t' with respect to the optical axis AX.

The light beam 71 which is incident on the diffractive optical element 6 at an angle t' with respect to the optical axis AX is converted into various light beams including a light beam 71*a* exiting at an angle (Θ+t') with respect to the optical axis AX. The light beam 71*a* exiting from the diffractive optical element 6 at an angle (Θ+t') with respect to the optical axis AX reaches a height (y+b) from the optical axis AX at the incident surface of the fly-eye lens 8.

Furthermore, a light beam 72 incident parallel to the optical axis AX on the lowermost edge of the microlens 4*a* positioned on the optical axis AX in the micro fly's eye lens 4 exits at angle t with respect to the optical axis AX. This light beam 72 passes through the afocal zoom lens 5, and is then incident on the diffractive optical element 6 at an angle t' with respect to the optical axis AX.

The light beam 72 which is incident on the diffractive optical element 6 at angle t' with respect to the optical axis AX is converted into various light beams including a light beam 72*a* exiting at an angle (Θ−t') with respect to the optical axis AX. The light beam 72*a* exiting the diffractive optical element 6 at an angle (Θ−t') with respect to the optical axis AX reaches a height (y−b) from the optical axis AX at the incident surface of the fly-eye lens 8.

Thus, the range reached at the incident surface of the fly-eye lens 8 by the diffused light beams from the various light source images formed near the back side focal plane of the micro fly's eye lens 4 is a range having a width of 2b centered about the height y from the optical axis AX. That is to say, as shown in FIG. 7(*b*), the annular illumination field formed at the incident surface of the fly-eye lens 8, and hence the annular secondary light sources formed at the back-side focal plane of the fly-eye lens 8, have a central height of y from the optical axis AX and a width of 2b.

The exit angle t from the micro fly's eye lens 4 and the incident angle t' on the diffractive optical element 6 are expressed by equations (1) and (2) below.

$$t = a/(2 \times f1) \tag{1}$$

$$t' = t/m = a/(2 \times f1 \times m) \tag{2}$$

In addition, the central height y of the annular secondary light sources, the maximum height (y+b) and the minimum height (y−b) are expressed by equations (3) through (5) below.

$$y = f2 \times \sin \Theta \quad (3)$$

$$y + b = f2(\sin \Theta + \sin t') \quad (4)$$

$$y - b = f2(\sin \Theta - \sin t') \quad (5)$$

Accordingly, the annular ratio A stipulated by the ratio of the inner diameter øi to the outer diameter øo of the annular secondary light sources is expressed by equation (6) below.

$$\begin{aligned} A = \emptyset i / \emptyset o &= 2(y-b)/(2(y+b)) \\ &= (\sin\Theta - \sin t')/(\sin\Theta + \sin t') \\ &= (\sin\Theta - \sin(a/(2 \times f1 \times m)))/(\sin\Theta + \sin(a/(2 \times f1 \times m))) \end{aligned} \quad (6)$$

In addition, the outer diameter øo of the annular secondary light sources is expressed by equation (7) below.

$$\begin{aligned} \emptyset o &= 2(y+b) = 2 \times f2(\sin\Theta + \sin t') \\ &= 2 \times f2(\sin\Theta + \sin(a/(2 \times f1 \times m))) \end{aligned} \quad (7)$$

Thus, it can be seen by referring to equations (2) through (6) that when the magnification m of the afocal zoom lens 5 changes, only the width 2b of the annular secondary light sources changes, without the central height y thereof changing. That is to say, by changing the magnification m of the afocal zoom lens 5, it is possible to change both the size (outer diameter øo) and the shape (annular ratio A) of the annular secondary light sources.

In addition, it can be seen by referring to equations (3) through (7) that when the focal length f2 of the zoom lens 7 is changed, the central height y and width 2b of the annular secondary light source changes without the annular ratio A thereof changing. That is to say, by changing the focal length f2 of the zoom lens 7, it is possible to change the outer diameter øo of the annular secondary light source without changing the annular ratio A thereof.

From the above, it is possible to change only the annular ratio A of the annular secondary light source without changing the outer diameter øo thereof by appropriately changing the magnification m of the afocal zoom lens 5 and the focal length f2 of the zoom lens 7.

Thus, when a diffractive optical element 6 and micro fly's eye lens 4 for annular modified illumination are employed, it is possible to form an annular secondary light source without substantial light loss on the basis of light beams from the light source 1, and as a result it is possible to accomplish annular modified illumination while satisfactorily suppressing light loss at the aperture stop 9.

As discussed above, the micro fly's eye lens 4 is interchangeable with the micro fly's eye lens 40, and the diffractive optical element 6 is interchangeable with the diffractive optical element 60. Together, the micro fly's eye lens 40 and the diffractive optical element 60 operate to form a quadrupole modified illumination.

Figure 8:
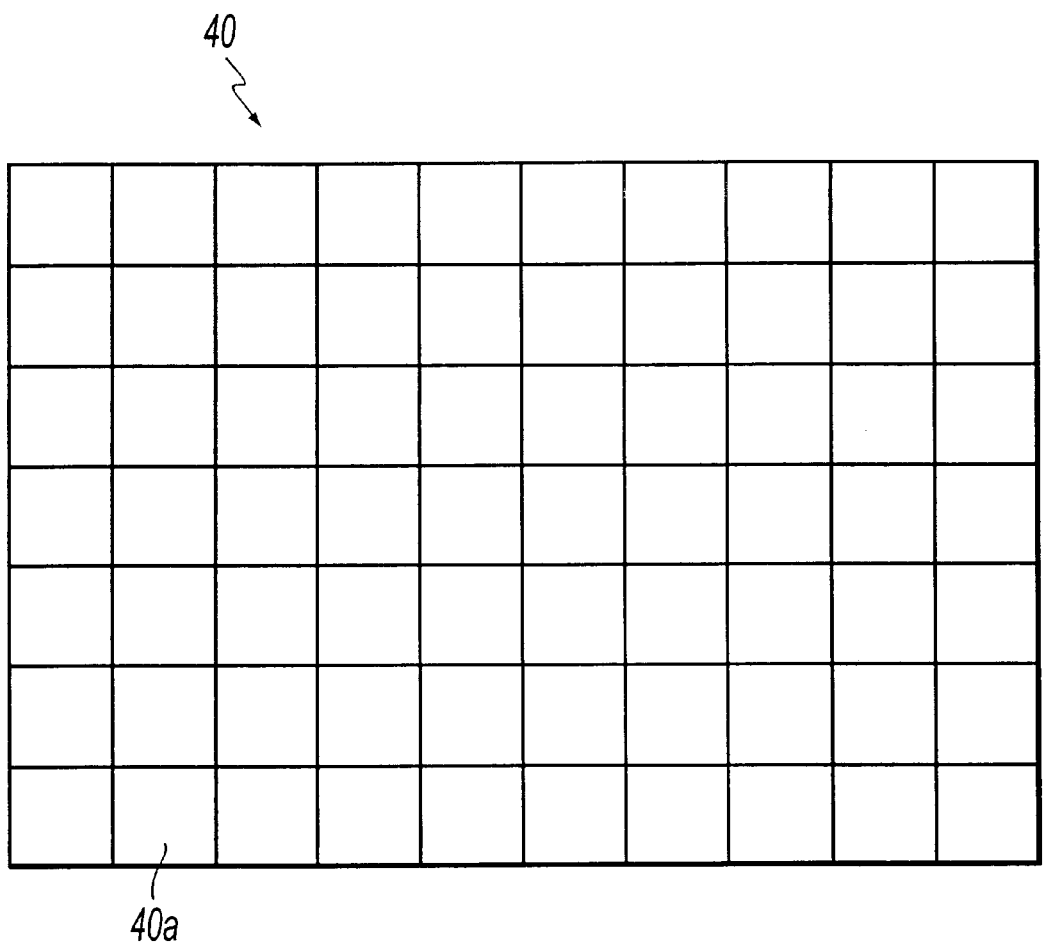
FIG. 8 shows an example arrangement of lens elements in a micro fly's eye lens.

The micro fly's eye lens 40 includes a plurality of microlenses 40a that are square in shape, have a positive refractive power and are arranged densely in the vertical and horizontal directions, as shown in FIGS. 1 and 8. Accordingly, a plurality of light source images are formed on the back side focal plane of the micro fly's eye lens 40, and light beams from each light source image are diffused light beams each having a square cross-section that are incident on the afocal zoom lens 5. Light beams that pass through the afocal zoom lens 5 are incident on the diffractive optical element 60. The diffused light beams from each light source image formed at the back-side focal plane of the micro fly's eye lens 40 converge on the diffraction surface of the diffractive optical element 60 while maintaining the square cross-section.

Figure 9A:
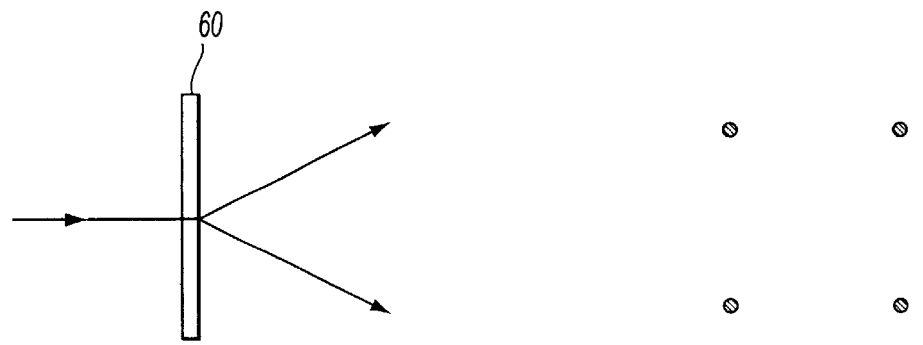
FIGS. 9(a)–9(c) show how a second diffractive optical element operates to diffuse received light.

The diffractive optical element 60 converts narrow light beams orthogonally incident parallel to the optical axis AX into four light beams diffused radially in accordance with a single predetermined exit angle, as shown in FIG. 9(a). In other words, narrow light beams orthogonally incident along the optical axis AX are diffracted along four specific directions at equal angles centered about the optical axis AX, and become four narrow light beams. To be more detailed, narrow light beams orthogonally incident on the diffractive optical element 60 are converted into four light beams, the quadrilateral joining the points of the four light beams passing through a plane on the back side parallel to the diffractive optical element 60 forms a square, and the center of that square is positioned at the incident axis of the narrow light beam to the diffractive optical element 60.

Figure 9B:
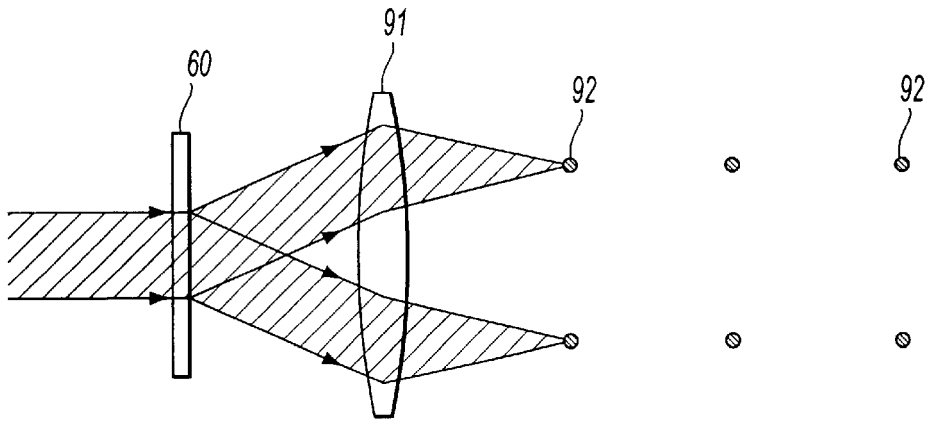
Figure 9C:
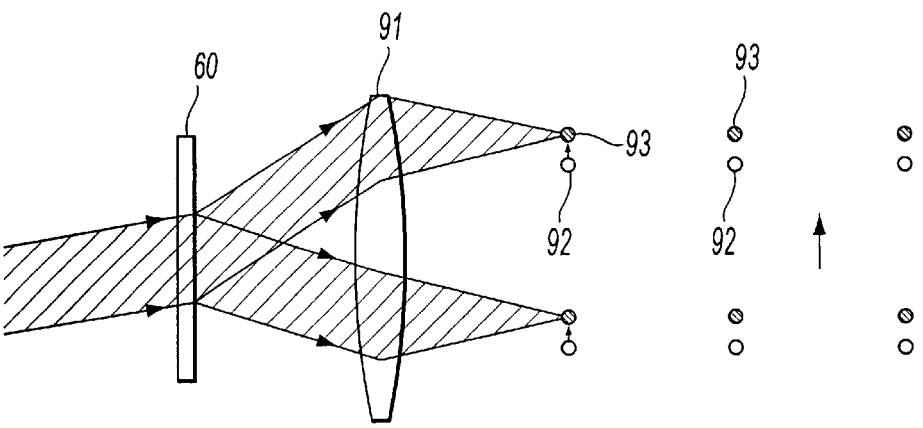

Accordingly, as shown in FIG. 9(b), when a wide parallel light beam is orthogonally incident on the diffractive optical element 60, four point images (point-shaped light source images) 92 are formed at the focal position of a lens 91 positioned on the back side of the diffractive optical element 60. When the wide parallel light beam incident on the diffractive optical element 60 is inclined with respect to the optical axis AX, the four images formed at the focal position of the lens 91 move, as shown in FIG. 9(c). That is to say, when the wide parallel light beam incident on the diffractive optical element 60 is inclined along a specific plane, the four point images 93 formed at the focal position of the lens 91 move in a direction opposite the direction of inclination of the light beams along the specific plane.

Figure 10:
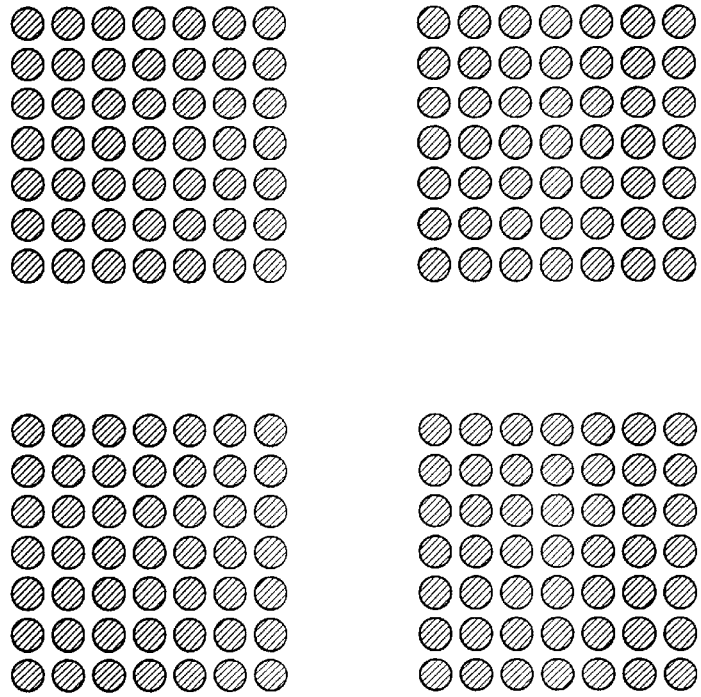
FIG. 10 shows a quadrupolar illumination configuration formed by superimposing a plurality of spot images.

As discussed above, the diffused light beams from the light source images formed at the back side focal plane of the micro fly's eye lens 40 converge on the diffraction plane of the diffractive optical element 60 while maintaining a square cross-section. In other words, light beams having a plurality of angular components are incident on the diffractive optical element 60, but the angle of incidence thereof is restricted by the square conical light beam range. That is to say, because an infinite number of light beams having a plurality of angular components determined by the square conical light beam range are incident on the diffractive optical element 60, an infinite number of point images are superimposed at the focal position of the lens 91, so that a quadrupole image such as the one shown in FIG. 10, is formed overall. Accordingly, the light beams that have passed through the diffractive optical element 60 form a quadrupole illumination field at the back side focal plane of the zoom lens 7, and hence at the incident surface of the fly-eye lens 8. As a result, a quadrupole secondary light source the same as the illumination field formed at the incident surface is also formed at the back side focal plane of the fly-eye lens 8.

In response to switching from the micro fly's eye lens 4 to the micro fly's eye lens 40 and from the diffractive optical element 6 to the diffractive optical element 60, a switch is also preferably made from the annular aperture stop 9 to an aperture stop 9a. For example, the aperture stop 9a is one of the quadrupole aperture stops selected from among of the three quadrupole aperture stops 402, 404 and 406.

Thus, when the micro fly's eye lens 40 and diffractive optical element 60 for quadrupole modified illumination are employed, it is possible to form a quadrupole secondary light source without substantial loss of light from the light source 1, and as a result is it possible to accomplish quadrupole modified illumination while satisfactorily suppressing light loss in the aperture stop 9a.

Figure 11:
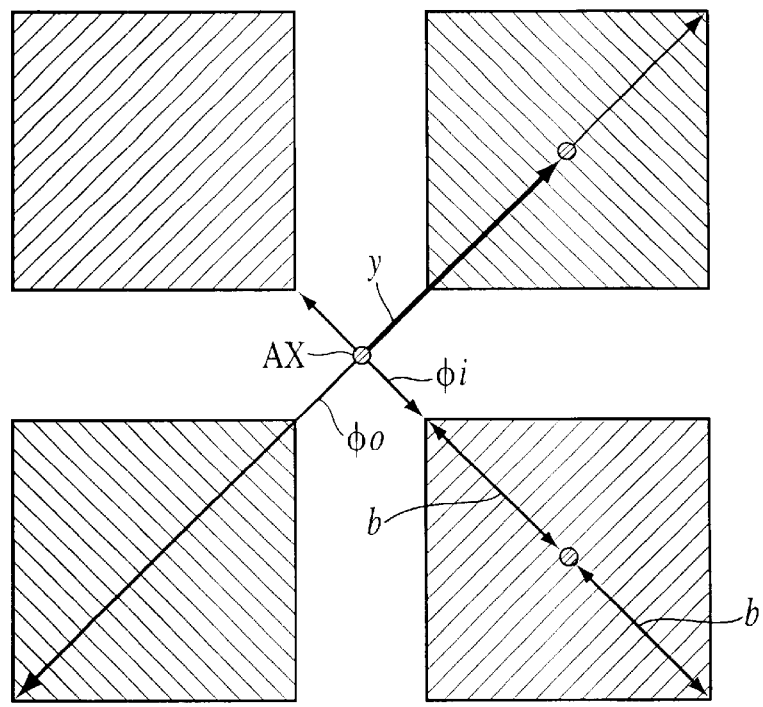
FIG. 11 shows how a quadrupolar illumination configuration can be adjusted in size and shape.

As shown in FIG. 11, it is possible to define the shape and size of the quadrupole secondary light source similar to the annular secondary light source. In this case, the size of each microlens 40a in the micro fly's eye lens 40 corresponds to the diameter of a circle circumscribed around the square that is the cross-sectional shape of the microlens 40a. Thus, similar to the case of annular modified illumination, by changing the magnification m of the afocal zoom lens 5, it is possible to alter both the annular ratio A and the outer diameter øo of the quadrupole secondary light source. In addition, by changing the focal length f2 of the zoom lens 7, it is possible to alter the outer diameter øo of the quadrupole secondary light source without altering the annular ratio thereof. As a result, by appropriately changing the magnification m of the afocal zoom lens 5 and the focal length f2 of the zoom lens 7, it is possible to alter only the annular ratio A of the quadrupole secondary light source without changing the outer diameter øo thereof.

Next, an explanation will be provided for the case of normal circular illumination which is obtained by withdrawing both the micro fly's eye lenses 4 and 40 from the illumination optical path, and setting the diffractive optical element 61 for circular illumination in the illumination optical path in place of the diffractive optical elements 6 and 60.

In this case, light beams having a rectangular cross-section are incident on the afocal zoom lens 5 along the optical axis AX. Light beams incident on the afocal zoom lens 5 are enlarged or reduced in accordance with the magnification of the lens, exit from the afocal zoom lens 5 along the optical axis AX as light beams still having a square cross-section, and are incident on the diffractive optical element 61.

The diffractive optical element 61 for circular illumination has the function of converting the incident square light beams into circular light beams. Accordingly, the circular light beams formed by the diffractive optical element 61 form a circular illumination field centered about the optical axis AX at the incident surface of the fly-eye lens 8. As a result, a circular secondary light source centered about the optical axis AX is also formed at the back side focal plane of the fly-eye lens 8. In this case, it is possible to appropriately alter the outer diameter of the circular secondary light source by changing the focal length f2 of the zoom lens 7.

Corresponding to the withdrawal of the micro fly's eye lenses 4 and 40 from the illumination optical path and the setting of the diffractive optical element 61 for circular illumination in the illumination optical path, a change from the annular aperture stop 9 or the quadrupole aperture stop 9a to the circular aperture stop 9b is also preferably made. The circular aperture stop 9b can be one circular aperture stop selected from among the two circular aperture stops 407 and 408, and has an aperture the size of which corresponds to the circular secondary light source.

Hereafter, the operation of interchanging illumination in the present embodiment will be described in more detail.

First, information relating to the various types of masks to be successively exposed in accordance with the step and repeat method or the step and scan method is input into the control system 21 via an input means 20 such as a keyboard. The control system 21 stores in an internal memory unit information such as the optimum line width (resolution) and focus depth relating to each type of mask, and supplies appropriate control signals to the first driving system 22 through the fifth driving system 26 in response to input from the input means 20.

That is to say, when annular modified illumination is required to form an optimum resolution and focus depth, the first driving system 22 positions the micro fly's eye lens 4 for annular modified illumination in the illumination optical path on the basis of commands from the control system 21. In addition, the third driving system 24 positions the diffractive optical element 6 for annular modified illumination in the illumination optical path on the basis of commands from the control system 21. Furthermore, in order to obtain an annular secondary light source having the desired size (outer diameter) and annular ratio at the back side focal plane of the fly-eye lens 8, the second driving system 23 sets the magnification of the afocal zoom lens 5 on the basis of commands from the control system 21, and the fourth driving system 25 sets the focal length of the zoom lens 7 on the basis of commands from the control system 21. Additionally, in order to restrict the annular secondary light source while satisfactorily suppressing light loss, the fifth driving system 26 rotates the turret on the basis of commands from the control system 21 and positions the desired annular aperture stop in the illumination optical path.

In this manner, it is possible to form an annular secondary light source without substantial loss of light beams from the light source 1, and as a result it is possible to accomplish annular modified illumination without substantial light loss in the aperture stop 9.

Furthermore, it is possible to appropriately adjust, as necessary, the size and annular ratio of the annular secondary light source formed at the back side focal plane of the fly-eye lens 8 by changing the magnification of the afocal zoom lens 5 using the second driving system 23 and changing the focal length of the zoom lens 7 using the fourth driving system 25. In this case, the turret is rotated in accordance with changes in the size and annular ratio of the annular secondary light source, and the annular aperture stop 401, 403, 405 having the desired size and annular ratio is selected and positioned in the illumination optical path.

In this manner, it is possible to accomplish various types of annular modified illumination by appropriately changing the size and annular ratio of the annular secondary light source without substantial light loss in the formation or restriction of the annular secondary light source.

In addition, when quadrupole modified illumination is required for an optimum resolution and focus depth, the first driving system 22 positions the micro fly's eye lens 40 for quadrupole modified illumination in the illumination optical path and the third driving system 24 positions the diffractive optical element 60 for quadrupole modified illumination in the illumination optical path. Furthermore, in order to obtain a quadrupole secondary light source having the desired size (outer diameter) and shape (annular ratio) at the back side focal plane of the fly-eye lens 8, the second driving system 23 sets the magnification of the afocal zoom lens 5 on the basis of commands from the control system 21, and the fourth driving system 25 sets the focal length of the zoom lens 7 on the basis of commands from the control system 21. Additionally, in order to restrict the quadrupole secondary light source while satisfactorily suppressing light loss, the fifth driving system 26 rotates the turret on the basis of commands from the control system 21 and positions the desired quadrupole aperture stop 402, 404, 406 in the illumination optical path.

In this manner, it is possible to form a quadrupole secondary light source without substantial light loss on the basis of light beams from the light source 1, and as a result it is possible to accomplish quadrupole modified illumination without substantial light loss in the aperture stop which restricts the light beams from the secondary light source.

Furthermore, it is possible to appropriately adjust, as necessary, the size and shape of the quadrupole secondary light source formed at the back side focal plane of the fly-eye lens 8 by changing the magnification of the afocal zoom lens 5 using the second driving system 23 and changing the focal length of the zoom lens 7 using the fourth driving system 25. In this case, the turret is rotated in accordance with changes in the size and shape of the quadrupole secondary light source, and the quadrupole aperture stop 402, 404, 406 having the desired size and shape is selected and positioned in the illumination optical path.

In this manner, it is possible to accomplish various types of quadrupole modified illumination by appropriately changing the size and shape of the quadrupole secondary light source without substantial light loss in the formation or restriction of the quadrupole secondary light source.

Furthermore, when regular circular illumination is required for an optimum resolution and focus depth, similar adjustments to the illumination optical system can be made under the control of the control system 21. In this manner, it is possible to form a circular secondary light source without substantial loss of light from the light source 1, and as a result it is possible to accomplish regular circular illumination without substantial light loss in the aperture stop which restricts the light beams from the secondary light source.

With the above-described embodiment, it is possible to accomplish regular circular illumination and modified illumination such as annular modified illumination or quadrupole modified illumination while satisfactorily suppressing light loss in the aperture stop used for restricting the secondary light source. Additionally, it is possible to change the parameters of modified illumination or regular circular illumination while satisfactorily suppressing light loss in the aperture stop, through the simple operation of changing the magnification of the afocal zoom lens and changing the focal length of the zoom lens. Accordingly, it is possible to appropriately change the type of modified illumination and the parameters thereof, and to obtain the resolution and focal depth of the projection optical system suitable for the detailed pattern to be exposed and projected. As a result, it is possible to accomplish satisfactory projection exposure with high throughput under satisfactory exposure conditions and high exposure brightness.

Thus, in an exemplary embodiment of the present invention, an angular light beam forming element and a light beam shape changing element are positioned on the optical path between the light source and the optical integrator. Specifically, the angular light beam forming element includes a diffused light beam forming element such as a micro fly's eye lens that converts the substantially parallel light beams from the light source means into a plurality of light source images from which light beams diffused at various angles with respect to the standard optical axis emerge. An optical system such as an afocal zoom lens condenses the diffused light beams formed by the micro fly's eye lens and guides the beams to the diffraction surface of a diffractive optical element functioning as the light beam shape changing element. Accordingly, substantially parallel light beams from the light source that pass through the micro fly's eye lens and the afocal zoom lens become light beams having a plurality of angular components with respect to the standard optical axis and then are incident on the diffractive optical element.

The light beam shape changing element includes a light beam changing element such as a diffractive optical element that converts narrow incident light beams into a radially diffused ring-shaped light beam or plurality of light beams. An optical system such as a zoom lens forms an annular illumination field or plurality of illumination fields eccentric with respect to the standard optical axis on the incident surface of the optical integrator such as a fly-eye lens from the ring-shaped light beam or plurality of light beams formed by the diffractive optical element. In general, the plurality of illumination fields or secondary light sources eccentric with respect to the standard optical axis means are, for example, bipolar or multipole (tripole, quadrupole, . . . , octopole or the like) illumination fields or secondary light sources, but quadrupole illumination fields or secondary light sources will be formed for illustrative purposes.

By thus employing an angular light beam forming element composed of a micro fly's eye lens, and a light beam shape changing element including a diffractive optical element, an annular illumination field or quadrupole illumination field can be formed on the incident surface of the fly-eye lens. As a result, an annular or quadrupole secondary light source is similarly formed on the back side focal plane of the fly-eye lens. The light beams from the annular or quadrupole secondary light source formed by the fly-eye lens in this manner are restricted by the aperture stop having an aperture corresponding to the size and shape of the secondary light source and then overlappingly illuminate the mask that is the target illumination surface.

The above explanation describes an example wherein semiconductor devices are manufactured using a photolithography process and a wafer process employing a projection exposure apparatus, but liquid crystal display devices, thin-film magnetic heads and image detectors (e.g., CCDs and the like) can also be manufactured as semiconductor devices by a photolithography process that uses this exposure apparatus.

In the above-described embodiment, it is possible to compose the diffractive optical elements that function as light beam changing elements and the micro fly's eye lenses that function as angular light beam forming elements so as to be positioned in the illumination optical path using a turret method, for example. In addition, it is also possible to use a commonly-known slider mechanism to accomplish mounting and removal or interchanging of the above-described micro fly's eye lenses and diffractive optical elements.

In addition, with the above-described embodiment, the shape of the microlenses 4*a* comprising the micro fly's eye lens 4 for annular modified illumination is set to a regular hexagon. A regular hexagon was selected as a polygon close to a circle because dense arrangement is impossible with circular microlenses, so light loss is generated. This notwithstanding, the shape of each microlens 4*a* in the micro fly's eye lens 4 for annular modified illumination is not limited to this, and other appropriate shapes can be used. Similarly, the shape of the microlenses 40*a* in the micro fly's eye lens 40 for quadrupole modified illumination is set to a square, but it is possible to use other appropriate shapes including a rectangle.

In addition, with the above-described embodiment, the refractive power of each microlens comprising the micro fly's eye lens was assumed to be a positive refractive power, but the refractive power of these microlenses may also be negative.

Furthermore, an afocal zoom lens was employed, but it is also possible to employ a focal zoom lens in place of the afocal zoom lens 5 or 7 and to position a diffractive optical element for converting square light beams into circular light beams in front of the micro fly's eye lens.

In addition, with the above-described embodiment, a single fly-eye lens 8 was employed, but it is also possible to apply the present invention to a double fly-eye method employing two fly-eye lenses.

Furthermore, the diffractive optical element 61 was positioned in the illumination optical path when accomplishing regular circular illumination, but it is also possible to omit use of this diffractive optical element 61.

In addition, it is also possible to use, as necessary, a fly-eye lens or diffractive optical element in place of the micro fly's eye lens as a diffused light beam forming element.

Furthermore, with the above-described embodiment, a diffractive optical element is. employed as a light beam changing element, but this is intended to be illustrative and not limiting. It is also possible to employ a refractive optical element such as a micro fly's eye lens or a microlens prism, as shown in the fifth embodiment described below.

Furthermore, with the above-described embodiment, an aperture stop for restricting the light beams of the secondary light source is positioned adjacent the back side focal plane of the fly-eye lens 8. However, it is also possible to have an arrangement where the aperture stop is omitted and the light beams from the secondary light source are completely unrestricted, e.g., by making the cross-sectional area of each lens element comprising the fly-eye lens sufficiently small.

In addition, with the above-described embodiment, the present invention was described using as an example a projection optical apparatus provided with an illumination optical apparatus, but it is clear that it is possible to apply the present invention to a general illumination optical apparatus for uniformly illuminating a target illumination surface other than a mask.

In the above-described embodiment, light from the secondary light source formed at the position of the aperture stop 9 is condensed by the condenser lens 10 functioning as a light-guiding optical system and overlappingly illuminates the mask 11, but an illumination field aperture stop (mask blind) and a relay optical system for forming an image of this illumination field aperture stop on the mask 11 can be positioned between the condenser lens 10 and the mask 11. In this case, the light-guiding optical system would include the condenser lens 10 and the relay optical system, the condenser lens 10 would condense light from the secondary light source formed at the position of the aperture stop 9 and overlappingly illuminate the illumination field aperture stop, and the relay optical system would form an image of the aperture of the illumination field aperture stop on the mask 11.

In addition, in the above-described embodiment, a fly-eye lens 8 which is a wave front dividing (splitting) integrator is employed as an optical integrator, but if an internal reflection type (Rod-type) integrator (e.g., light pipe, light tunnel, glass rod, etc.) is used as the optical integrator, the system should be arranged as described below. That is, a condenser optical system should be added on the downstream side of the zoom lens 7 to form a conjugate surface to the diffractive optical element 6. Furthermore, the rod-type integrator should be positioned such that the incident edge is positioned adjacent this conjugate plane. Additionally, a relay optical system is preferably positioned for forming an image of the illumination field aperture stop positioned at the exit side surface or adjacent the exit side surface of this rod-type integrator on the mask 11. In the case of this arrangement, the second prescribed plane is the pupil plane of the composite system of the zoom lens 7 and the above-described condenser optical system, and the secondary light source is formed on the pupil plane of the relay optical system (a virtual image of the secondary light source is formed adjacent the incident side of the rod-type integrator). In this case, the relay optical system used for guiding light beams from the rod-type integrator to the mask 11 becomes the light-guiding optical system.

Second Embodiment

Figure 12:
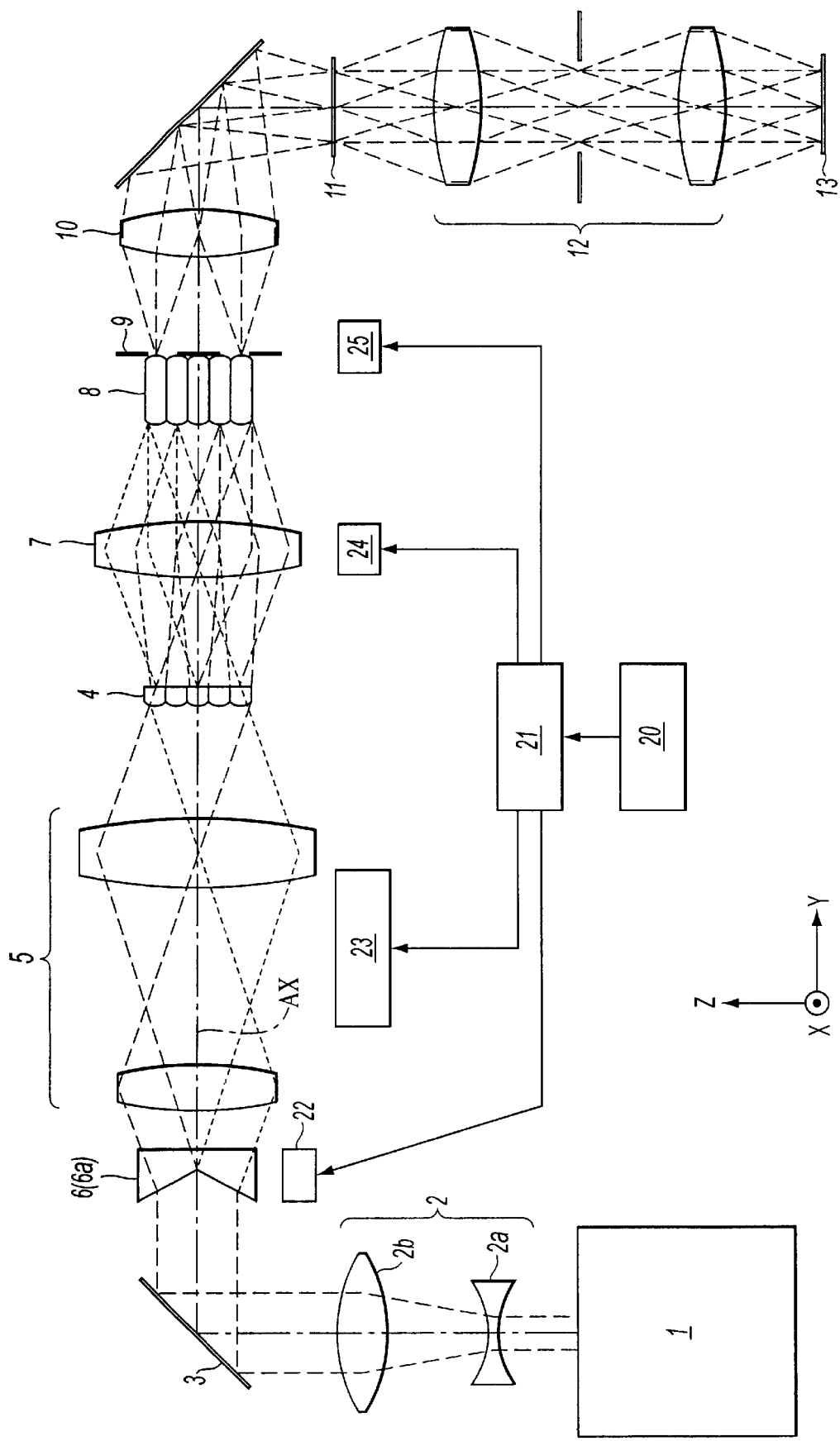
FIG. 12 is a schematic diagram of an illumination optical apparatus according to a second embodiment of the invention.

FIG. 12 is a schematic diagram of an illumination optical system in which a light beam shape changing element is positioned upstream of an angular light beam forming element. That is, the embodiment shown in FIG. 12 has the relative positions of the light beam shape changing element and the angular light beam forming element reversed compared to the embodiment shown in FIG. 1.

The system shown in FIG. 12 is similar in many respects to that in FIG. 1, so description of common elements, functions or other features is not provided.

Light beams transmitted by the beam expander 2 are deflected in the Y direction by a folding mirror 3 and are incident on a conical prism 6. The surface of the conical prism 6 on the mask 11 side (the surface to the right in the drawing) is formed in a planar shape orthogonal to the optical axis AX. The surface of the conical prism 6 on the light source 1 side (the surface to the left in the drawing) has a conical concave surface. More specifically, the refractive surface of the conical prism 6 on the light source 1 side corresponds to a surface of a cone symmetric with respect to the optical axis AX. Accordingly, light beams incident on the conical prism 6 are deflected along all directions at the same angle centered about the optical axis AX and are then incident on the afocal zoom lens 5. In this way, the conical prism 6 comprises a light beam shape changing member for diffusing light beams from the light source 1 into substantially annular light beams.

In FIG. 12, the conical concave surface of the conical prism 6 faces the light source 1 side, but the conical prism 6 can be positioned such that the conical concave side faces the mask 11 side. In addition, the conical prism 6 is interchangeable with a pyramidal prism 6a as another light beam shape changing member. The composition and action of this pyramidal prism 6a will be described below.

Similar to the embodiment shown in FIG. 1, the afocal zoom lens 5 can be adjusted to continuously change the magnification within a predetermined range while maintaining an afocal system.

Interchanging of the conical prism 6 and pyramidal prism 6a is performed by a driving system 22 which operates on the basis of commands from a control system 21. In addition, changing the magnification of the afocal zoom lens 5 is accomplished by a zoom driving system 23 on the basis of commands from the control system 21.

Light beams from the prism 6 that are incident on the afocal zoom lens 5 form a ring-shaped light source image at the pupil plane of the lens 5. Light from the ring-shaped light source image forms substantially parallel light beams and exits from the afocal zoom lens 5, to be incident on a first fly-eye lens 4 (an angular light beam forming element) that functions as a first optical integrator. Light beams from oblique directions substantially symmetrical with respect to the optical axis AX are incident on the incident surface of the first fly-eye lens 4. In other words, light beams are obliquely incident along all directions at the same angle centered about the optical axis AX.

The first fly-eye lens 4 includes, for example, of a plurality of lens elements each having a square cross-section and a positive refractive power, said lens elements arranged in the vertical and horizontal directions along the optical axis AX. The surface on the incident side of each lens element is formed into a spherical shape with the convex surface facing the incident side, and the exit side surfaces are formed into a planar shape.

Accordingly, light beams incident on the first fly-eye lens 4 are partitioned two-dimensionally by the plurality of lens elements, and one ring-shaped light source image is formed at the back side focal plane of each lens element. Light beams from the plurality of ring-shaped light source images formed at the back side focal plane of the first fly-eye lens 4 pass through a zoom lens 7 and then overlappingly illuminate a second fly-eye lens 8 which functions as a second optical integrator. The zoom lens 7 is a relay optical system that can continuously change its focal length within a predetermined range, and links the back side focal plane of the first fly-eye lens 4 and the back-side focal plane of the second fly-eye lens 8 as substantially optical conjugates. In addition, the zoom lens 7 comprises a telecentric optical system on the back side. In order to satisfy the above-described conjugate relationship and telecentricity, the zoom lens 7 is preferably a multi-group zoom lens with at least three zoom lens groups capable of independent movement. Changing the focal length of the zoom lens 7 is accomplished through a zoom driving system 24 which operates on the basis of commands from the control system 21.

Accordingly, at the incident surface of the second fly-eye lens 8, an illumination field with a shape in which infinitely many illumination fields each having a square shape similar to the cross-sectional shape of each lens element of the first fly-eye lens 4 are arranged at positions equidistant from the optical axis AX, that is to say an annular illumination field centered about the optical axis AX, is formed.

The second fly-eye lens 8 includes a plurality of lens elements, each having a positive refractive power, arranged in the vertical and horizontal directions along the optical axis AX, the same as the first fly-eye lens 4. However, each lens element comprising the second fly-eye lens 8 has a rectangular cross-section similar to the shape of the illumination field to be formed on the mask (and hence, the shape of the exposure region to be formed on the wafer). In addition, the surface on the incident side of each lens element in the second fly-eye lens 8 is formed in a spherical shape or an aspherical shape with the convex surface facing the incident side, and the surface on the exit side is formed in a spherical shape or an aspherical shape with the convex surface facing the exit side.

Accordingly, light beams incident on the second fly-eye lens 8 are partitioned two-dimensionally by the plurality of lens elements, and a plurality of light source images are respectively formed at the back side focal plane of each lens element on which the light beams are incident. In this way, a plural light source (hereafter referred to as the "secondary light source") of the same annular shape as the illumination field formed by the light beams incident on the second fly-eye lens 8 is formed at the back side focal plane of the second fly-eye lens 8.

Light beams from the annular secondary light source formed at the back side focal plane of the second fly-eye lens 8 are incident on an aperture stop 9. This aperture stop 9 is supported on a turret capable of rotating about a predetermined axis parallel to the optical axis AX. The turret can be constructed the same as or similar to the turret described above and shown in FIG. 6.

In FIG. 12, annular secondary light sources are formed at the back side focal plane of the second fly-eye lens 8, and consequently one of the annular aperture stops is preferably selected from the three annular aperture stops 401, 403 and 405 as the aperture stop 9. However, the composition of the turret shown in FIG. 6 is intended to illustrative and not limiting with regard to the type or number of aperture stops positioned thereon or even the use of a rotating turret for the aperture stop 9.

Light from the secondary light sources that passes through the aperture stop 9 having an annular aperture (light transmission area) is condensed by a condenser optical system 10, and then uniformly illuminates a mask 11 in an overlapping manner. Light beams that pass through the pattern on the mask 11 form an image of the mask 11 pattern on a wafer 13 via the projection optical system 12.

FIG. 13 schematically shows the illumination optical system from the conical prism 6 to the incident surface of the first fly-eye lens 4.

Figure 13A:
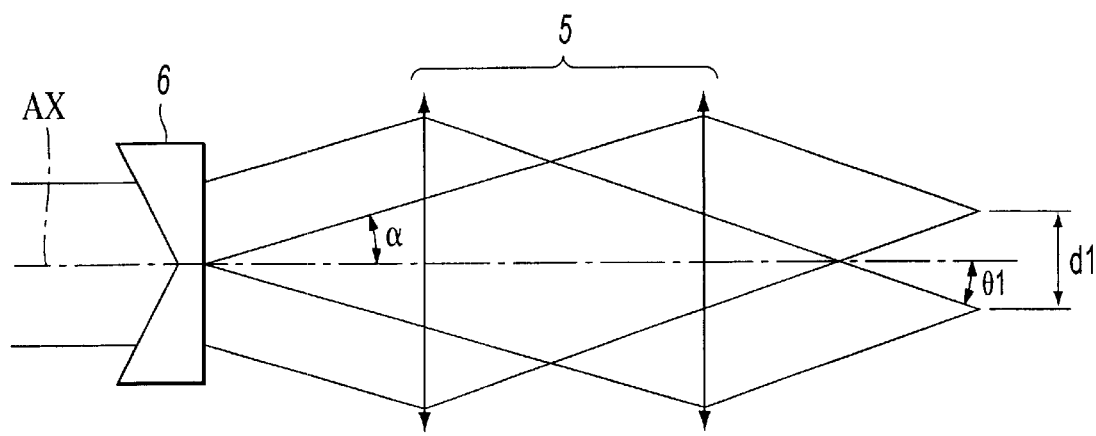
FIGS. 13(a)–(b) schematically shows the illumination optical apparatus from a conical prism to the incident surface of the first fly-eye lens.

As shown in FIG. 13(a), light beams deflected by the conical prism 6 along all directions at the same angle a centered about the optical axis AX pass through the afocal zoom lens 5 having a magnification m1 and are then obliquely incident on the incident surface of the first fly-eye lens 4 along all directions at the same angle Θ1 centered about the optical axis AX. The size of the illumination field formed at the incident surface of the first fly-eye lens 4 is d1.

Figure 13B:
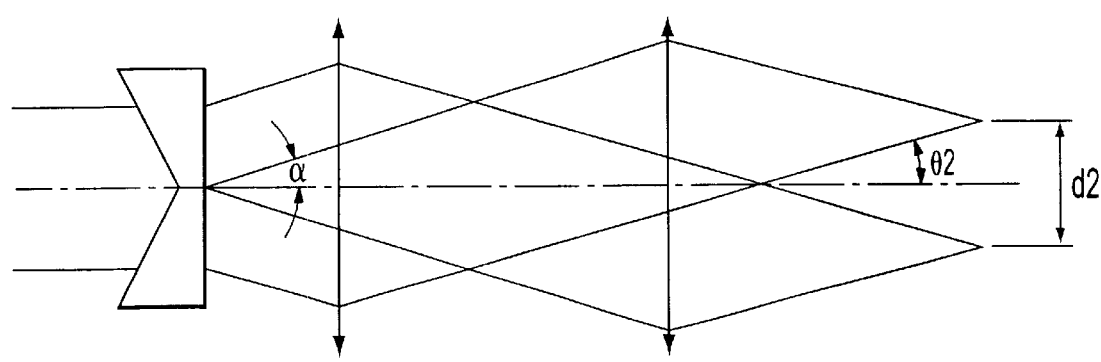

As shown in FIG. 13(b), when the magnification of the afocal zoom lens 5 is changed from m1 to m2, light beams deflected by the conical prism 6 along all directions at the same angle a centered about the optical axis AX pass through the afocal zoom lens 5 having a magnification m2 and are then obliquely incident on the incident surface of the first fly-eye lens 4 along all directions at the same angle Θ2 centered about the optical axis AX. At this time, the size of the illumination field formed at the incident surface of the first fly-eye lens 4 is d2.

The relationships shown by equations (8) and (9) below hold for the angles of incidence Θ1 and Θ2 of the light beams on the incident surface of the first fly-eye lens 4, the sizes d1 and d2 of the illumination fields formed at the incident surface of the first fly-eye lens 4, and the magnifications m1 and m2 of the afocal zoom lens 5.

$$\Theta 2 = (m1/m2) \times \Theta 1 \qquad (8)$$

$$d2 = (m2/m1) \times d1 \qquad (9)$$

With reference to equation (8), it can be seen that it is possible to continuously change the incident angle Θ of the light beams on the incident surface of the first fly-eye lens 4 by continuously changing the magnification m of the afocal zoom lens 5.

FIG. 14 schematically shows the illumination optical system from the first fly-eye lens 4 to the aperture stop 9.

Figure 14A:
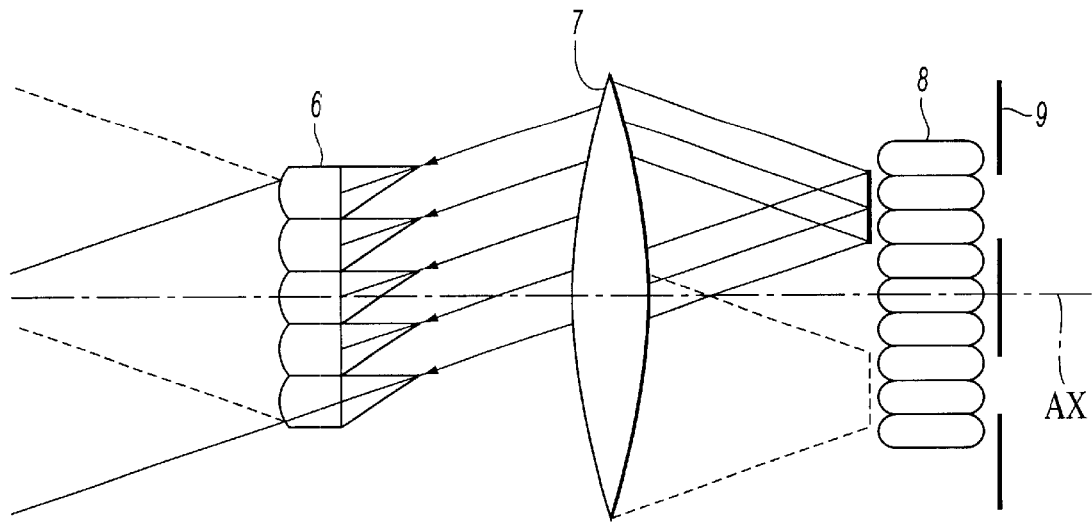
FIGS. 14(a)–(c) schematically show the illumination optical apparatus from the first fly-eye lens to the aperture stop, and show a state in which light beams obliquely incident on the incident surface of the first fly-eye lens form an annular illumination field at the incident surface of the second fly-eye lens.

In FIG. 14(a), light beams incident at a predetermined angle from a predetermined direction onto the incident surface of the first fly-eye lens 4 pass through each lens element and are then obliquely incident on the zoom lens 7 while maintaining the same angle. Thus, an illumination field having a predetermined width at a position eccentric to the optical axis AX by a predetermined distance is formed on the incident surface of the second fly-eye lens 8, as indicated by the solid lines in the drawing.

Figure 14B:
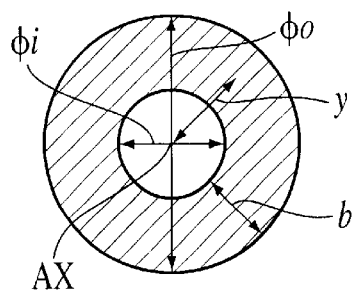
Figure 14C:
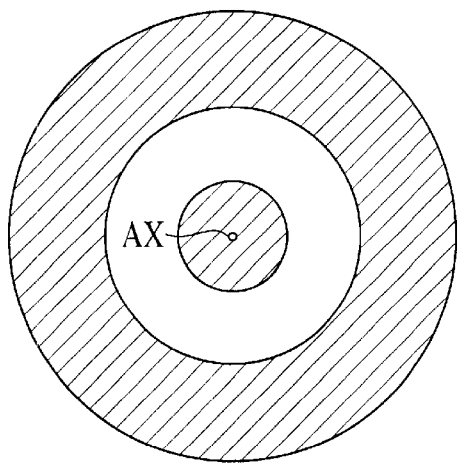

In actuality, light beams are incident on the incident surface of the first fly-eye lens 4 from oblique directions substantially symmetrical about the optical axis AX, as shown by the dashed lines in the drawing. In other words, light beams are incident along all directions at the same angle centered about the optical axis AX. Accordingly, at the incident surface of the second fly-eye lens 8, an annular illumination field centered about the optical axis AX is formed, as shown in FIG. 14(b). In addition, an annular secondary light source the same as the illumination field formed at the incident surface is also formed at the back side focal plane of the second fly-eye lens 8. On the other hand, as discussed above, an annular aperture (the portion in white in FIG. 14(c)) corresponding to the annular secondary light source is formed in the annular aperture stop 9 positioned adjacent the back side focal plane of the second fly-eye lens 8.

In this manner, when the conical prism 6 is employed as the light beam shape changing element, it is possible to form an annular secondary light source with substantially no light loss, and as a result it is possible to accomplish annular modified illumination without substantial light loss at the aperture stop 9.

Figure 15:
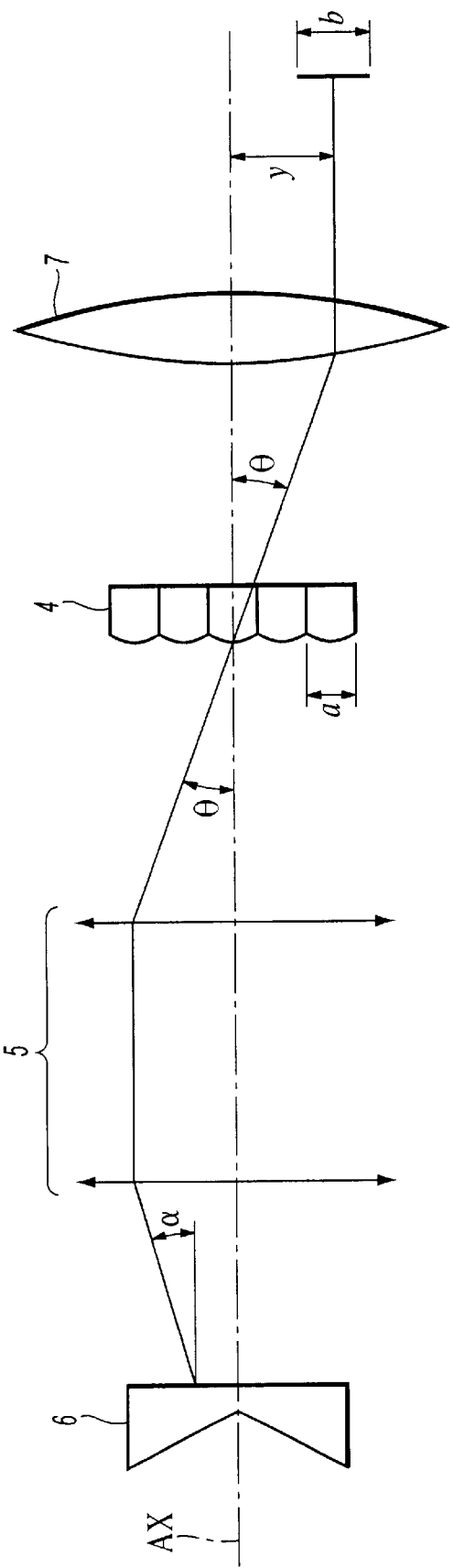
FIG. 15 schematically shows the illumination optical apparatus from a conical prism to a second fly-eye lens, and the relationship between the magnification of a first zoom lens and the focal length of a second zoom lens, and the size and shape of the annular illumination field formed at the incident surface of the second fly-eye lens.

FIG. 15 schematically shows the illumination optical system from the conical prism 6 to the incident surface of the second fly-eye lens 8, and is used to explain the relationship between the magnification of the afocal zoom lens 5 and the focal length of the zoom lens 7, and the size and shape of the annular illumination field formed at the incident surface of the second fly-eye lens 8.

In FIG. 15, the central light ray of the light beam exiting from the conical prism 6 at an angle α centered about the optical axis AX passes through the afocal zoom lens 5 having a magnification of m, and is then incident on the first fly-eye lens 4 at an angle Θ from the optical axis. The first fly-eye lens 4 includes lens elements each of size "a" and focal length f1. The central light ray exiting at an angle Θ from a lens element of the first fly-eye lens 4 arrives at the second fly-eye lens 8 via the zoom lens 7 which has a focal length fr. At this time, the incident range of the light beam at the incident surface of the second fly-eye lens 8 is a range having a width b centered about a height y from the optical axis AX. That is to say, the illumination field formed at the incident surface of the second fly-eye lens 8, and hence the secondary light source formed at the back side focal plane of the second fly-eye lens 8, has a width b and a height y from the optical axis, as shown in FIG. 14(b).

The exit angle a from the conical prism 6 and the incident angle Θ on the first fly-eye lens 4 have the relationship shown in the following equation (10).

$$\Theta = (1/m) \times \alpha \quad (10)$$

In addition, the height y and width b of the annular secondary light source are respectively expressed by equations (11) and (12) below.

$$y = fr \times \sin \Theta \quad (11)$$

$$b = (fr/f1) \times a \quad (12)$$

Accordingly, the annular ratio A stipulated by the ratio of the inner diameter øi to the outer diameter øo of the annular secondary light source is expressed by equation (13) below.

$$A = \varnothing i / \varnothing o = (2y - b)/(2y + b) \quad (13)$$

$$= \{2f1 \times \sin(\alpha/m) - a\}/\{2f1 \times \sin(\alpha/m) + a\}$$

In addition, the outer diameter øo of the annular secondary light source is expressed by equation (14) below.

$$\varnothing o = 2y + b = fr\{2 \sin(\alpha/m) + a/f1\} \quad (14)$$

Changing the form of equation (14), the relationship shown in equation (15) can be obtained.

$$fr = \varnothing o / \{2 \sin(\alpha/m) + a/f1\} \quad (15)$$

Thus, with reference to equations (10) and (11), it can be seen that when only the magnification of the afocal zoom lens 5 changes with no change in the focal length fr of the zoom lens 7, the height y of the annular secondary light source changes with no change in the width b thereof. That is to say, by changing only the magnification m of the afocal zoom lens 5, it is possible to change both the size (outer diameter øo) and the shape (annular ratio A) of the annular secondary light source without changing the width b thereof.

In addition, with reference to equations (11) and (12), it can be seen that when only the focal length fr of the zoom lens 7 is changed with no change in the magnification m of the afocal zoom lens 5, both the width b and height y of the annular secondary light source change in proportion to the focal length fr. That is to say, by changing only the focal length fr of the zoom lens 7, it is possible to change the size (outer diameter øo) of the annular secondary light source without changing the shape (annular ratio A) thereof.

Furthermore, with reference to equations (13) and (15), it can be seen that by changing the magnification m of the afocal zoom lens 5 and the focal length fr of the zoom lens 7 so as to satisfy the relationship in equation (15) for an outer diameter øo of a certain size, it is possible change only the shape (annular ratio A) of the annular secondary light source without changing the size (outer diameter øo) thereof.

An explanation is now provided below for changes in the magnification m of the afocal zoom lens 5 and the focal length fr of the zoom lens 7 for a case wherein the shape (annular ratio A) of the annular secondary light source is changed without changing the size (outer diameter øo) thereof in accordance with a specific numerical example.

In this first numerical example, the deflection angle α by the conical prism 6 is taken to be 7 degrees, the size "a" of each lens element of the first fly-eye lens 4 is taken to be 2.5 mm and the focal length f1 of each lens element is taken to be 50 mm. Furthermore, with the outer diameter øo of the annular secondary light source set to 96 mm and kept constant, the magnification m of the afocal zoom lens 5 and the focal length fr of the zoom lens 7 needed in order to change the annular ratio A of the annular secondary light source from around 0.24 to around 0.95 are respectively found. Table (1) below shows the corresponding relationships between the magnification m of the afocal zoom lens 5, the annular ratio A of the annular secondary light source, and the focal length fr of the zoom lens 7 in the first numerical example.

TABLE 1

| m | A | fr |
|---|---|---|
| 0.1 | 0.94817 | 49.75678 |
| 0.2 | 0.916468 | 80.19026 |
| 0.3 | 0.881258 | 113.9927 |
| 0.4 | 0.846487 | 147.3723 |
| 0.5 | 0.812679 | 179.8279 |
| 0.6 | 0.779947 | 211.2513 |
| 0.7 | 0.748299 | 241.6332 |
| 0.8 | 0.717711 | 270.9975 |
| 0.9 | 0.688146 | 299.3801 |
| 1.0 | 0.659561 | 326.8211 |
| 1.1 | 0.631915 | 353.3616 |
| 1.2 | 0.605165 | 379.0419 |
| 1.3 | 0.57927 | 403.901 |
| 1.4 | 0.554191 | 427.9763 |
| 1.5 | 0.529893 | 451.3031 |
| 1.6 | 0.506338 | 473.9151 |
| 1.7 | 0.483496 | 495.8439 |
| 1.8 | 0.461334 | 517.1198 |
| 1.9 | 0.439822 | 537.7711 |
| 2.0 | 0.418933 | 557.8247 |
| 2.1 | 0.39864 | 577.3059 |
| 2.2 | 0.378918 | 596.2387 |

TABLE 1-continued

| m | A | fr |
|---|---|---|
| 2.3 | 0.359744 | 614.6459 |
| 2.4 | 0.341095 | 632.549 |
| 2.5 | 0.32295 | 649.9682 |
| 2.6 | 0.305289 | 666.9228 |
| 2.7 | 0.288092 | 683.4313 |
| 2.8 | 0.271343 | 699.5108 |
| 2.9 | 0.255023 | 715.1778 |
| 3.0 | 0.239117 | 730.448 |

With reference to Table 1, it can be seen that in order to change the annular ratio A from around 0.5 to around 0.69, it is only necessary to change the magnification m of the afocal zoom lens 5 from around 1.6 to around 0.9 and change the focal length fr of the zoom lens 7 from around 474 mm to around 300 mm.

As discussed above, the conical prism 6 is interchangeable with the pyramidal prism 6a. An explanation is now provided for the case where the pyramidal prism 6a is set in the illumination optical path instead of the conical prism 6.

With the pyramidal prism 6a, the mask-side surface has a planar shape orthogonal to the optical axis AX. In addition, the light-source-side surface has four refractive surfaces and is formed with an overall pyramidal concavity facing the light source 1. The four refractive surfaces correspond to the pyramidal surfaces (the side surfaces without the bottom surface) of a square pyramid having four ridge lines along the X axis and the Z axis with one point on the optical axis AX as the vertex. That is to say, the four refractive surfaces correspond to the pyramidal surfaces of a square pyramid symmetric about the optical axis AX. Similar to the case of the conical prism 6, the pyramidal prism 6a may also be positioned so that the pyramidal concavity faces the mask 11.

When the pyramidal prism 6a is positioned in the illumination optical path, light beams incident on the pyramidal prism 6a are deflected along four predetermined directions at equal angles centered about the optical axis AX and are incident on the afocal zoom lens 5. In this way, the pyramidal prism 6a comprises a light beam shape changing element that changes the light beams from the light source 1 into four light beams eccentric to the optical axis AX. The light beams incident on the afocal zoom lens 5 form four point-shaped light source images on the pupil plane of the lens 5. In this case, the quadrilateral joining the four point-shaped light source images forms a square with sides parallel to the X axis and the Z axis and centered about the optical axis AX. Light from these four point-shaped light source images exits the afocal zoom lens 5 as substantially parallel light beams and is the incident on the first fly-eye lens 4. Here, light beams from oblique directions substantially symmetrical with respect to the optical axis AX are incident on the incident surface of the first fly-eye lens 4. To be more specific, the light beams are oblique along four specific directions at equal angles, centered about the optical axis AX.

Figure 16A:
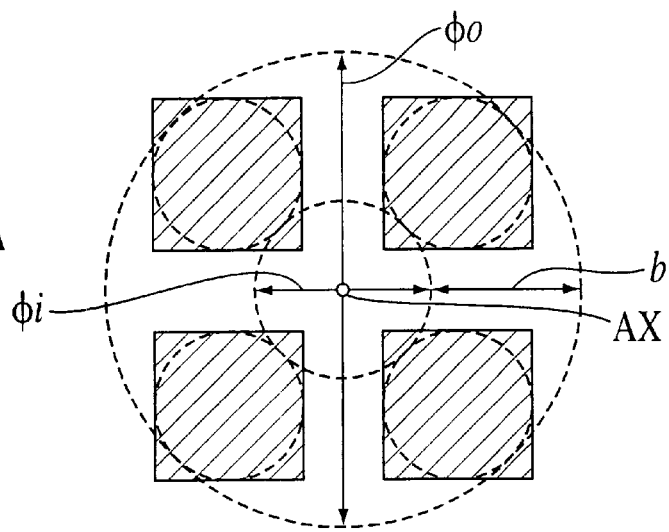
FIGS. 16(a)–(c) show a quadrupole secondary light source formed at the back side focal plane of the second fly-eye lens and a quadrupole aperture stop positioned adjacent thereto.

Accordingly, four point-shaped light source images are respectively formed at the back-side focal plane of each lens element of the first fly-eye lens 4. Light beams from the plurality of point-shaped light source images formed at the back side focal plane of the first fly-eye lens 4 pass through a zoom lens 7 and then overlappingly illuminate the second fly-eye lens 8. Accordingly, at the incident surface of the second fly-eye lens 8, four square illumination fields similar to the cross-sectional shape of each lens element of the first fly-eye lens 4 made eccentric (parallel shifted) equidistantly outwardly along four symmetric radial directions about the optical axis AX are formed. As a result, as shown in FIG. 16(a) a quadrupole secondary light source (the portion indicated by the shaded area in FIG. 16(a)) is also formed at the back side focal plane of the second fly-eye lens 8.

Figure 16B:
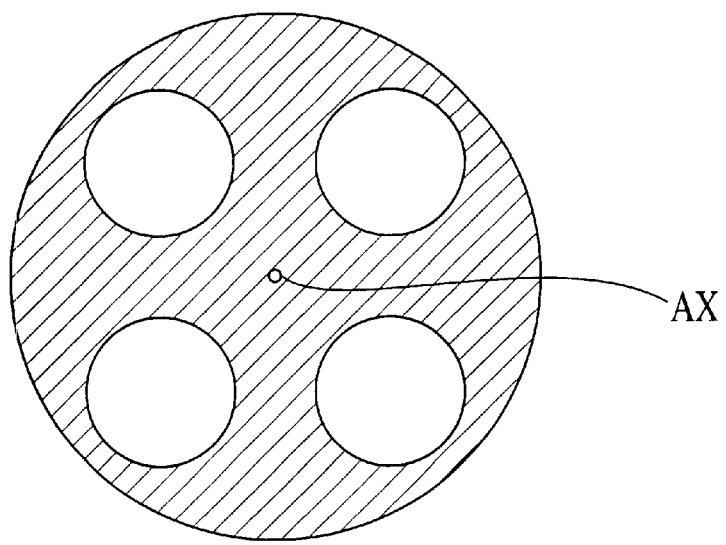
Figure 16C:
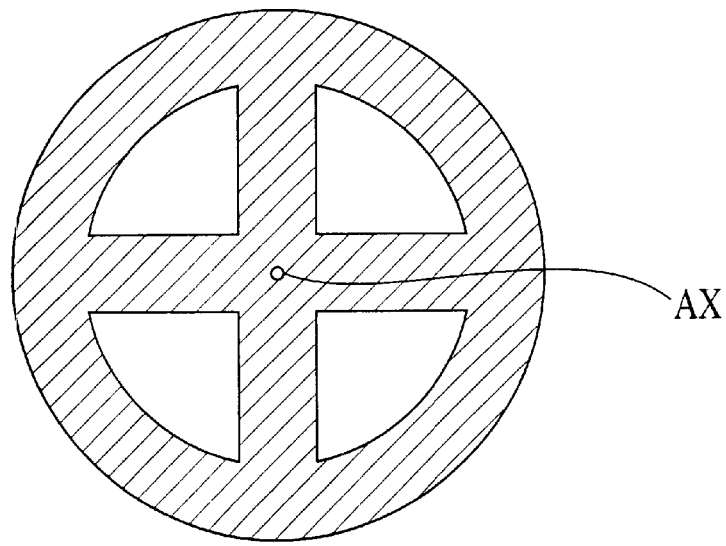

In conjunction with the switch from the conical prism 6 to the pyramidal prism 6a, a switch is also preferably made from the annular aperture stop 9 to aperture stop 9a. The aperture stop 9a is one quadrupole aperture stop selected from three quadrupole aperture stops 402, 404 and 406. As shown in FIG. 16(b), four circular apertures (the parts indicated by the regions in FIG. 16(b)) having the size of a circle that can be drawn substantially inside the four square light sources are formed in the quadrupole aperture stop 9a. Additionally, as shown in FIG. 16(c) it is also possible to use a quadrupole aperture stop 9a having four apertures in the shape of quarter circles (the parts indicated by the white regions in FIG. 16(c)).

In this manner, even when the pyramidal prism 6a is used as the light beam shape changing element, it is possible to form a quadrupole secondary light source without substantial light loss, and as a result it is possible to accomplish quadrupole modified illumination while satisfactorily suppressing light loss in the aperture stop 9a.

Furthermore, by changing only the magnification m of the afocal zoom lens 5, it is possible to change the position of the light center of the four square light sources in the quadrupole secondary light source. In other words, it is possible to change the size and shape of the quadrupole secondary light source without changing the width thereof. As shown by the dashed lines in FIG. 16(a), it is possible to define the size and shape of the quadrupole secondary light source similarly to that of an annular secondary light source. The annular ratio of the quadrupole secondary light source can be defined on the basis of the ratio øi/øo. In this case, the width b of the quadrupole secondary light source is defined as ½ the difference between the diameter øi of the small circle and the diameter øo of the large circle.

In addition, by changing only the focal length fr of the zoom lens 7, it is possible to change only the size of the quadrupole secondary light source without changing the shape (annular ratio) thereof. Furthermore, by changing the magnification m of the afocal zoom lens 5 and the focal length fr of the zoom lens 7 so as to satisfy a prescribed relationship, it is possible to change only the shape of the quadrupole secondary light source without changing the size thereof.

On the other hand, when the conical prism 6 is withdrawn from the illumination optical path, light beams having a square cross-section are incident along the optical axis AX on the afocal zoom lens 5. The light beams incident on the afocal zoom lens 5 are reduced or enlarged in accordance with the magnification of the lens, exit from the afocal zoom lens 5 along the optical axis AX while maintaining a square cross-section, and are then incident on the first fly-eye lens 4. Accordingly, one point-shaped light source image is formed at the back side focal plane of each lens element of the first fly-eye lens 4. In addition, at the incident surface of the second fly-eye lens 8, a square illumination field similar to the cross-sectional shape of each lens element of the first fly-eye lens 4 is formed, centered about the optical axis AX. As a result, a square secondary light source centered about the optical axis AX can also be formed at the back side focal plane of the second fly-eye lens 8.

In conjunction with withdrawing the conical prism 6 from the illumination optical path, the annular aperture stop 9 is preferably interchanged with the circular aperture stop 9b. The circular aperture stop 9b is selected from the two circular aperture stops 407 and 408, and has an aperture size that can be substantially inscribed in the square secondary light source.

In this way, it is possible to form a square secondary light source without substantial light loss, and to accomplish regular circular illumination while satisfactorily suppressing light loss in the aperture stop.

In this case, by changing the magnification m of the afocal zoom lens 5 or the focal length fr of the zoom lens 7, it is possible to appropriately change the size of the square secondary light source.

With the above embodiment, light beam shape changing element is positioned in the optical path between the light source and an angular light beam forming element. The light beam shape changing element converts light beams from the light source into light beams incident on the angular light beam forming element from oblique directions substantially symmetrical with respect to the standard optical axis. Specifically, the light beam shape changing element can include a conical prism or a pyramidal prism, although it is also possible to employ a diffractive optical element, as discussed above.

Light beams the shape of which has been altered by the light beam shape changing element are condensed by a condenser optical system and are overlappingly incident on the angular light beam forming element from oblique directions substantially symmetrical with respect to the standard optical axis. In this manner, a first plural light source is formed by the angular light beam forming element. Light beams from the first plural light source are condensed by a relay optical system and are guided to an optical integrator. As a result, it is possible to form an annular light source or a plurality of light sources eccentric to the standard optical axis as a second plural light source, that is to say a secondary light source, using the optical integrator.

Here, when a conical prism is employed as the light beam shape changing element, an annular light source is formed, and when a pyramidal prism is employed, a plurality of light sources eccentric to the optical axis are formed. In particular, when a four-sided pyramidal prism (hereafter referred to simply as "pyramidal prism") is employed as the pyramidal prism, a secondary light source composed of four light sources symmetrically eccentric to the standard optical axis, that is to say a quadrupole secondary light source, is formed. In this way, light beams from the annular or quadrupole secondary light source formed by the optical integrator illuminate the target illumination surface after being restricted by an aperture stop preferably having an aperture corresponding to the size and shape of the secondary light source. Moreover, it is possible to use a multi-sided (e.g., an eight-sided) pyramidal prism as the pyramidal prism.

In addition, with the present embodiment the condenser optical system can include a zoom optical system of variable magnification, and by changing the magnification of the zoom optical system, it is possible to alter the annular ratio of the annular light source formed as the second plural light source or to alter the position of each light center of the plurality of light sources formed as the second plural light source. Furthermore, if the relay optical system positioned in the optical path between the angular light beam forming element and the optical integrator includes a zoom optical system of variable magnification, it is possible to alter the size of the second plural light source by changing the zoom ratio of this zoom optical system.

Third Embodiment

Figure 17:
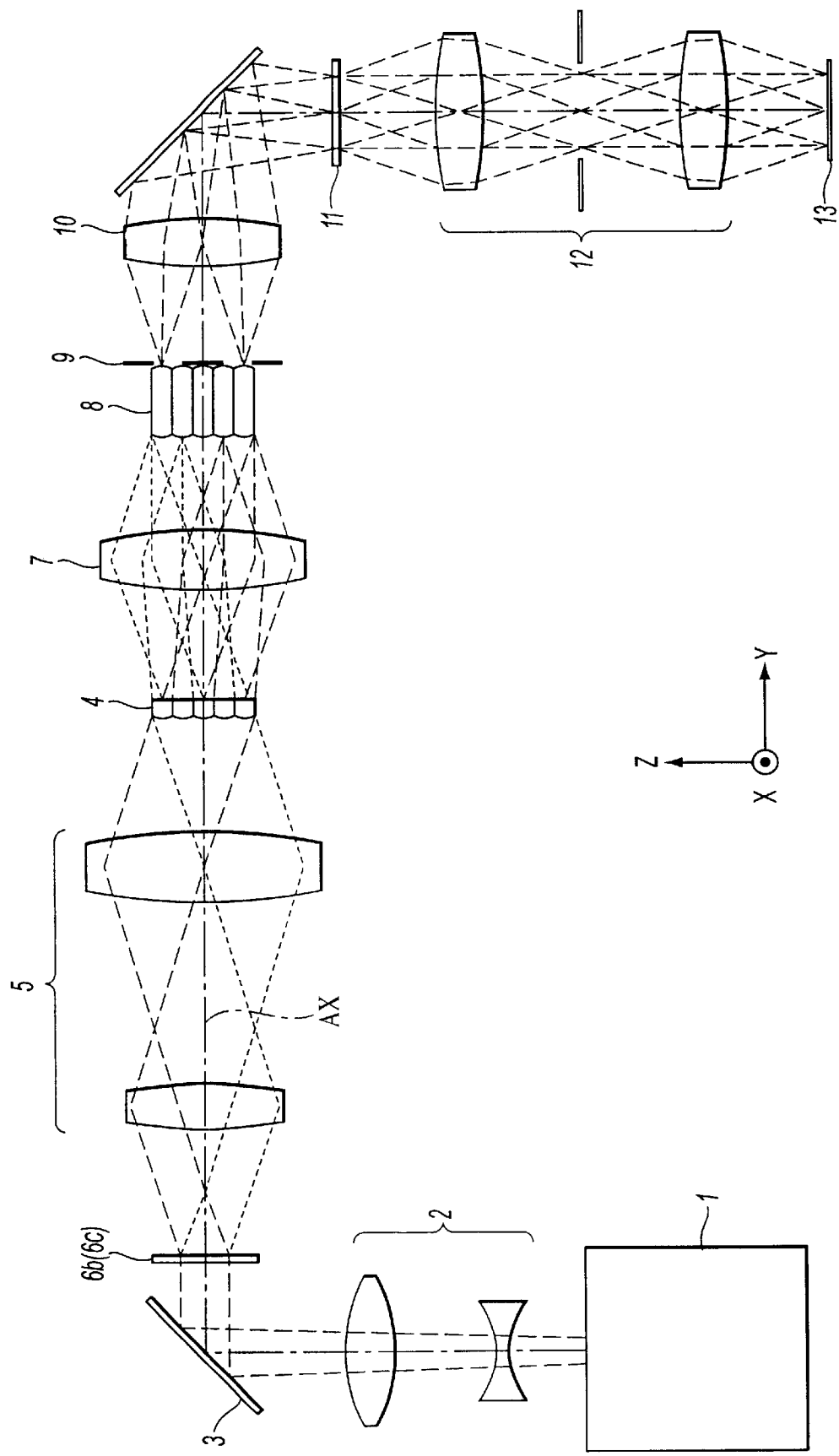
FIG. 17 is a schematic diagram of an illumination optical apparatus according to a third embodiment of the invention.

FIG. 17 schematically shows an illumination optical system according to a third embodiment of the present invention. In addition, FIGS. 18 and 19 are used to explain the action of the diffractive optical element in this embodiment. In the drawings relating to the embodiment and variations below (FIG. 17, FIG. 21 and FIG. 22), the input means 20, the control system 21, the light beam shape changing member driving system 22, the zoom driving systems 23 and 24 and the turret driving member 25 (which does not exist in FIG. 12) are omitted.

The third embodiment has a composition similar to that of the second embodiment. However, the only fundamental difference is that in this embodiment diffractive optical elements are employed as light beam shape changing elements. Accordingly, in FIG. 17, elements having the same function as elements in the first and second embodiments are assigned the same reference numbers as in FIG. 1.

Figures 18A, 18B:
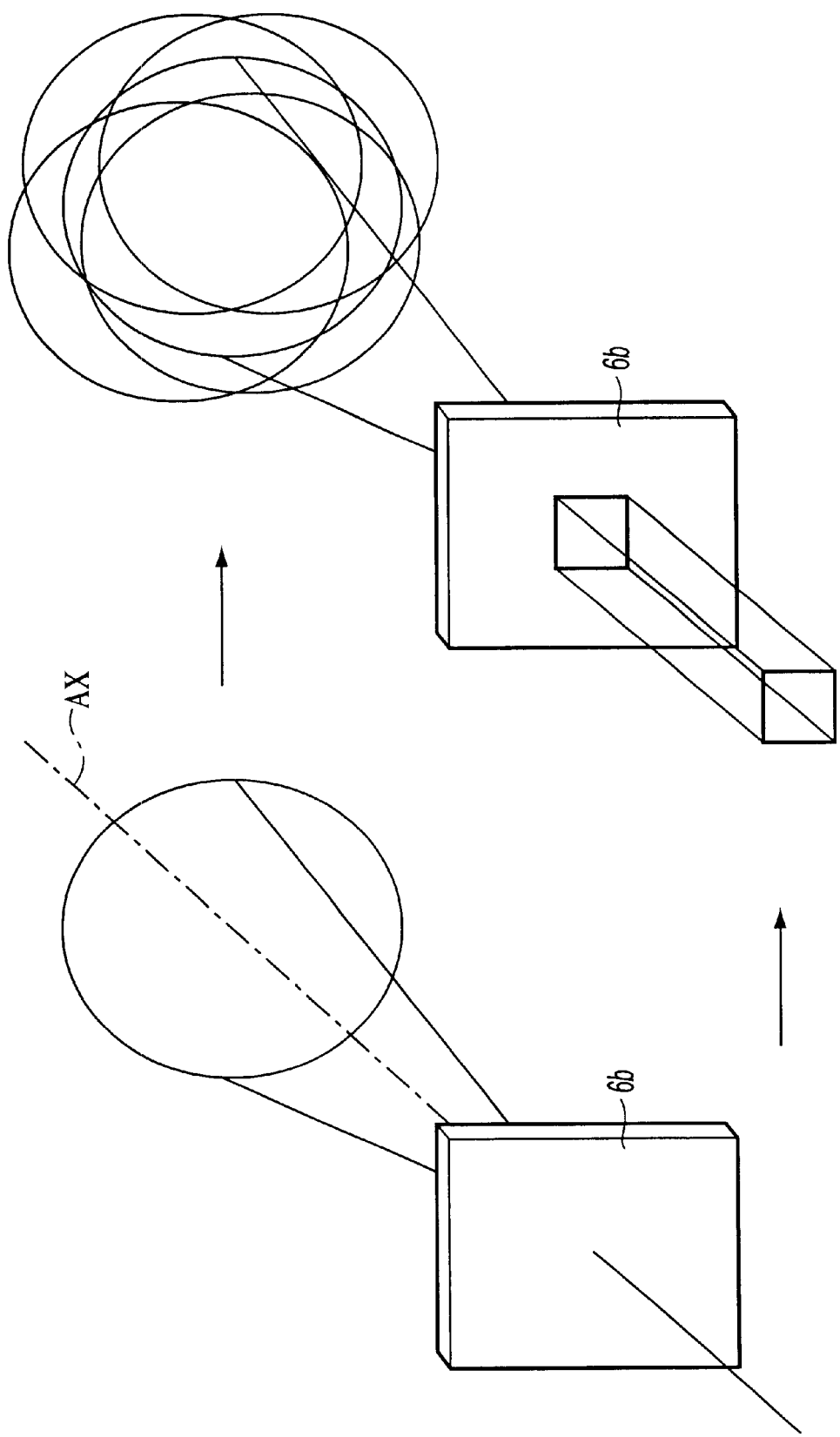
FIGS. 18(a) and (b) show how a first exemplary diffractive optical element diffuses received light.

Light beams that pass through a beam expander 2 are deflected by the folding mirror 3 and are then incident on a diffractive optical element 6b. The diffractive optical element 6b in this example includes binary or multiple levels (or steps) having a pitch on the order of the wavelength of the exposure light (illumination light) formed on a glass substrate, and diffracts the incident beam to a desired angle. Specifically, as shown in FIG. 18(a), a narrow light beam orthogonally incident on the diffractive optical element 6b along the optical axis AX is diffracted in all directions at equal angles centered about the optical axis AX, and forms a ring-shaped beam. Accordingly, when a parallel beam of square cross-section is incident on this diffractive optical element 6b along the optical axis AX, an annular beam results, as shown in FIG. 18(b). Thus, the diffractive optical element 6b constitutes a light beam shape changing element that diffuses light beams from the light source 1 into annular light beams.

That is to say, the diffractive optical element 6b has the same action as the conical prism 6 in deflecting beams orthogonally incident thereon along the optical axis AX into beams in all directions at equal angles centered about the optical axis AX. However, whereas the conical prism 6 deflects the entirety of the incident light beams in all directions at equal angles centered about the optical axis AX, the diffractive optical element 6b deflects each beam comprising the incident light beam in all directions at equal angles centered about the incident axis thereof (parallel to the optical axis AX). Accordingly, the afocal zoom lens 5 is configured so as to link the diffractive optical element 6b and the incident surface of the first fly-eye lens 4 as substantially optically conjugate.

In this way, as in the second embodiment, a ring-shaped light source image is formed at the pupil plane of the afocal zoom lens 5. Furthermore, substantially parallel light beams exiting from the afocal zoom lens 5 are obliquely incident on the incident surface of the first fly-eye lens 4 in all directions at equal angles centered about the optical axis AX. As a result, an annular secondary light source is formed at the back side focal plane of the second fly-eye lens 8 without substantial light loss. In addition, light loss for the most part does not occur at the aperture stop 9 positioned adjacent the back side focal plane of the second fly-eye lens 8. Furthermore, by appropriately changing the magnification m of the afocal zoom lens 5 and the focal length fr of the zoom lens 7, it is possible to change the size and shape (annular ratio) of the annular secondary light source, the same as in the first embodiment.

In the third embodiment, the diffractive optical element 6b is interchangeable with another diffractive optical element 6c. When the diffractive optical element 6b is withdrawn from the illumination optical path, it is possible to accomplish regular circular illumination the same as when the conical prism 6 and pyramidal prism 6a are withdrawn in the second embodiment. The case wherein the diffractive optical element 6c instead of the diffractive optical element 6b is set in the illumination optical path is explained below.

Figure 19B:
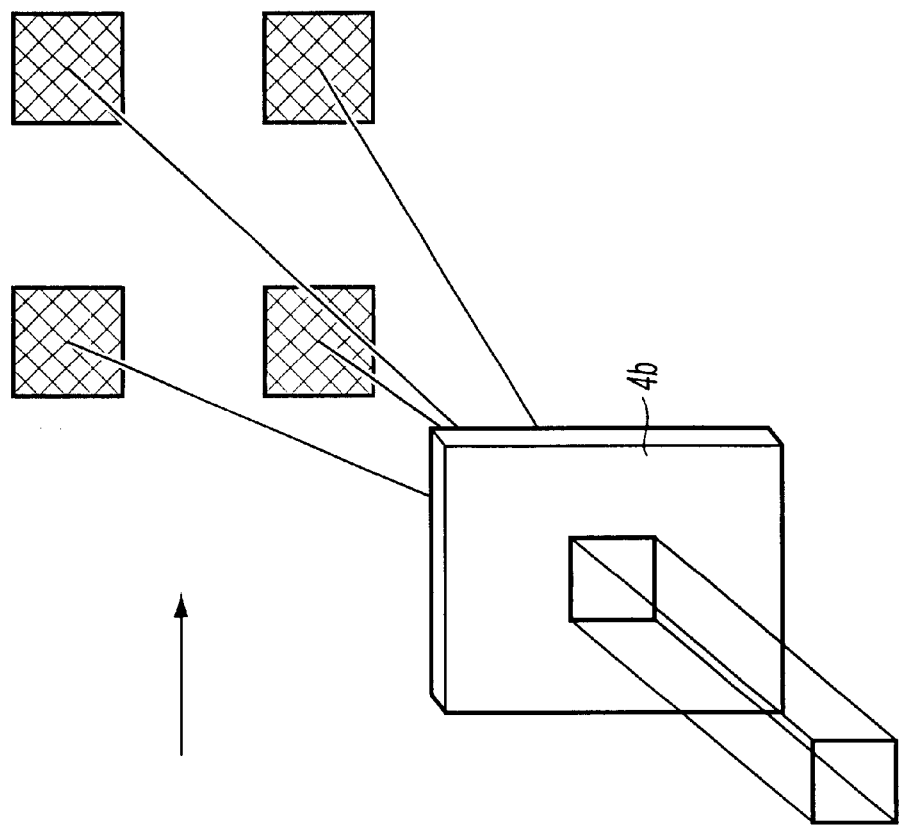
FIGS. 19(a) and (b) show how a second exemplary diffractive optical element diffuses received light.
Figure 19A:
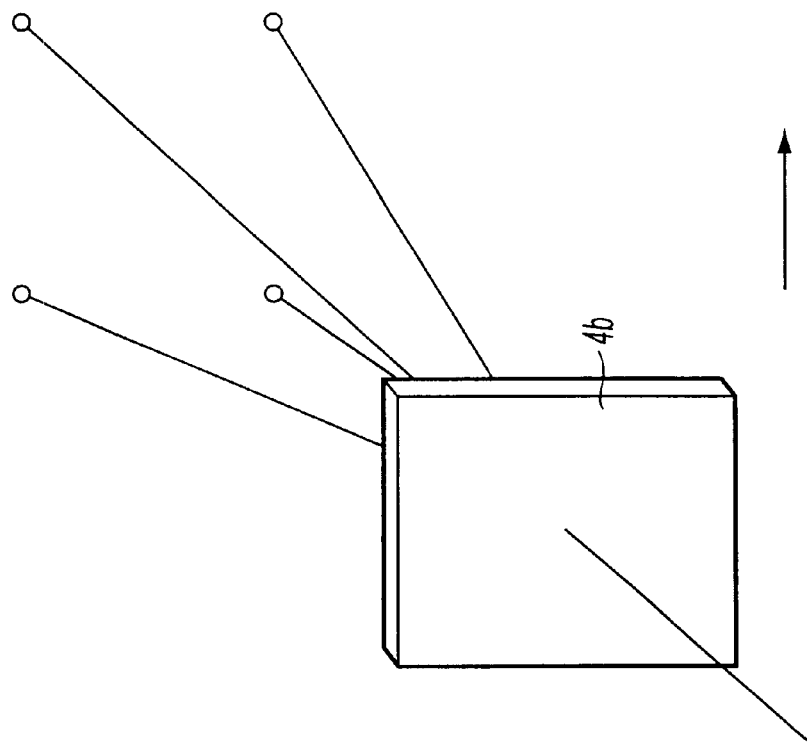

When the diffractive optical element 6c is used as the light beam shape changing element, narrow beams orthogonally incident along the optical axis AX are diffracted along four specific directions at equal angles centered about the optical axis AX, and form four narrow beams, as shown in FIG. 19(a). Accordingly, when parallel beams with a square cross-section are incident on this diffractive optical element 6c along the optical axis AX, quadrupole beams result, as shown in FIG. 19(b). Thus, the diffractive optical element 6c constitutes a light beam shape changing element that changes light beams from the light source 1 into four light beams eccentric to the optical axis AX. Accordingly, four point-shaped light source images are formed at the pupil plane of the afocal zoom lens 5, the same as when the pyramidal prism 6a is employed in the second embodiment.

Furthermore, substantially parallel light beams exiting from the afocal zoom lens 5 are then obliquely incident on the incident surface of the first fly-eye lens 4 along four specific directions at equal angles centered about the optical axis AX. As a result, a quadrupole secondary light source is formed at the back side focal plane of the second fly-eye lens 8 without substantial light loss. In addition, this quadrupole secondary light source is restricted while satisfactorily suppressing light loss by an aperture stop 9a positioned adjacent the back side focal plane of the second fly-eye lens 8. Furthermore, by appropriately changing the magnification m of the afocal zoom lens 5 and the focal length fr of the zoom lens 7, it is possible to change the size and shape of the quadrupole secondary light source.

FIG. 20 schematically shows a configuration of an illumination optical device according to a first variation of the third embodiment. FIG. 20(b) shows a state in which the magnification of the afocal zoom lens 5 is expanded more than the state shown in FIG. 20(a).

This first variation differs from the third embodiment only in that a micro fly's eye lens 4a is employed as the first optical integrator (angular light beam forming element).

In the first variation shown in FIG. 20, a micro fly's eye lens 4 is employed instead of the first fly-eye lens 4. The micro fly's eye lens 4 is an optical element that includes a plurality of microlenses arranged in the horizontal and vertical directions, and for example is formed by etching a plane parallel glass plate. Accordingly, each microlens is smaller than each lens element in a typical fly-eye lens, but the element is the same as the fly-eye lens in that lens elements having a positive refractive power are arranged in the horizontal and vertical directions. Accordingly, the micro fly's eye lens 4 accomplishes the same action as the first fly-eye lens 4.

Changes in the magnification m of the afocal zoom lens 5 and the focal length fr of the zoom lens 7 when changing only the shape (annular ratio A) of the annular secondary light source without changing the size (outer diameter ⌀o) thereof in the first variation employing the diffractive optical element 6b and the micro fly's eye lens 6a are now explained below with reference to a specific numerical example.

In this second numerical example, the diffraction angle (deflection angle) α by the diffractive optical element 6b is taken to be 7 degrees, the size "a" of each microlens in the micro fly's eye lens 6a is taken to be 0.5 mm and the focal length fl of each microlens is taken to be 10 mm. Furthermore, with the outer diameter ⌀o of the annular secondary light source set to 96 mm and kept constant, the magnification m of the afocal zoom lens 5 and the focal length fr of the zoom lens 7 needed in order to change the annular ratio A of the annular secondary light source from around 0.24 to around 0.95 are respectively found. Table 2 below shows the corresponding relationships among the magnification m of the afocal zoom lens 5, the annular ratio A of the annular secondary light source, and the focal length fr of the zoom lens 7 in the second numerical example.

TABLE 2

| m | A | fr |
| --- | --- | --- |
| 0.1 | 0.94817 | 49.75678 |
| 0.2 | 0.916468 | 80.19026 |
| 0.3 | 0.881258 | 113.9927 |
| 0.4 | 0.846487 | 147.3723 |
| 0.5 | 0.812679 | 179.8279 |
| 0.6 | 0.779947 | 211.2513 |
| 0.7 | 0.748299 | 241.6332 |
| 0.8 | 0.717711 | 270.9975 |
| 0.9 | 0.688146 | 299.3801 |
| 1.0 | 0.659561 | 326.8211 |
| 1.1 | 0.631915 | 353.3616 |
| 1.2 | 0.605165 | 379.0419 |
| 1.3 | 0.57927 | 403.901 |
| 1.4 | 0.554191 | 427.9763 |
| 1.5 | 0.529893 | 451.3031 |
| 1.6 | 0.506338 | 473.9151 |
| 1.7 | 0.483496 | 495.8439 |
| 1.8 | 0.461334 | 517.1198 |
| 1.9 | 0.439822 | 537.7711 |
| 2.0 | 0.418933 | 557.8247 |
| 2.1 | 0.39864 | 577.3059 |
| 2.2 | 0.378918 | 596.2387 |
| 2.3 | 0.359744 | 614.6459 |
| 2.4 | 0.341095 | 632.549 |
| 2.5 | 0.32295 | 649.9682 |
| 2.6 | 0.305289 | 666.9228 |
| 2.7 | 0.288092 | 683.4313 |
| 2.8 | 0.271343 | 699.5108 |
| 2.9 | 0.255023 | 715.1778 |
| 3.0 | 0.239117 | 730.448 |

Comparing Table 1 and Table 2, it can be seen that the corresponding relationships among the magnification m of the afocal zoom lens 5, the annular ratio A and the focal length fr of the zoom lens 7 match in the first numerical example and the second numerical example. This illustrates that when the micro fly's eye lens 6a is employed instead of the first fly-eye lens 4, it is possible to achieve the same action numerically as with the first fly-eye lens 4 by appropriately setting the size a and focal length fl of each microlens.

Figure 21:
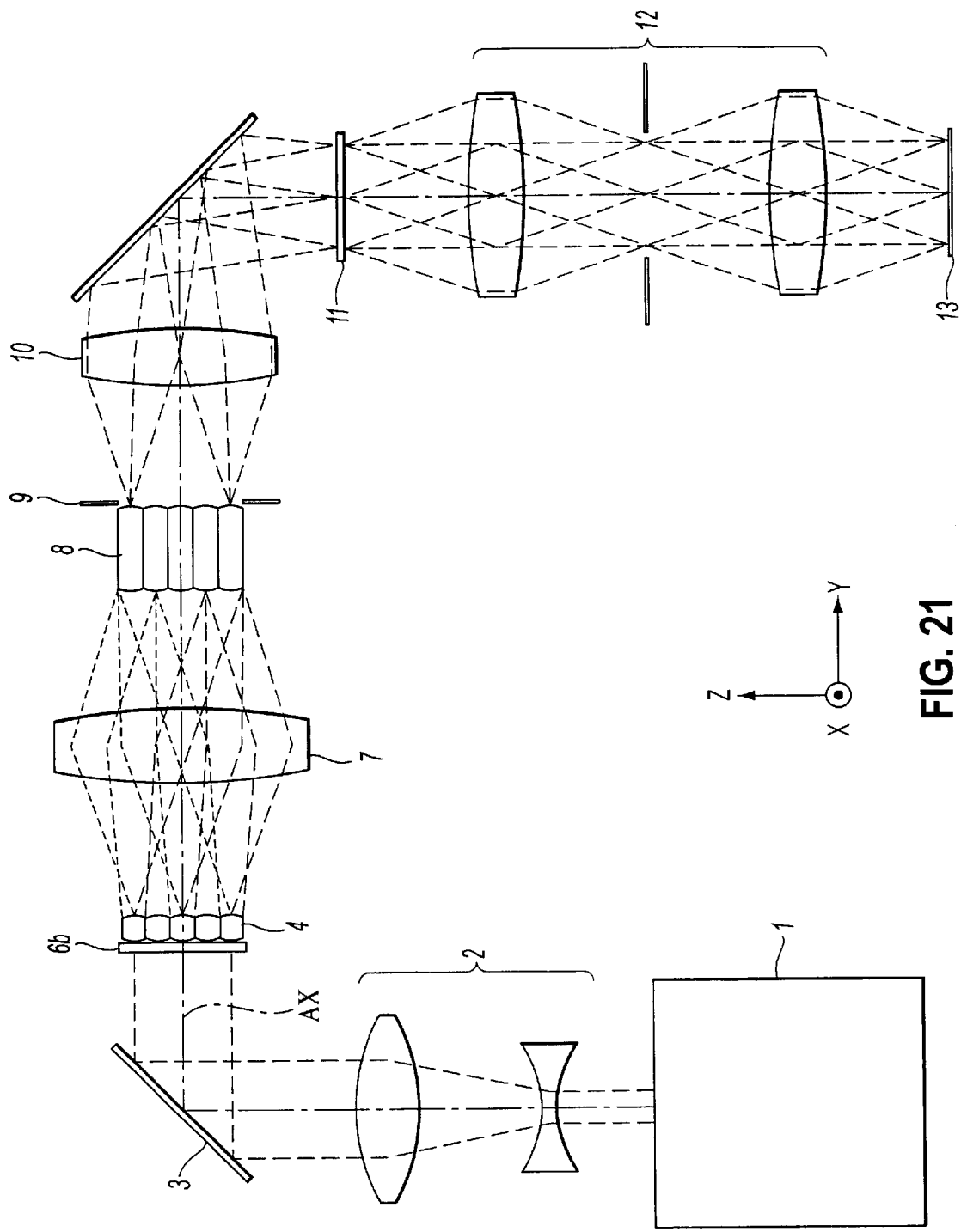
FIG. 21 is a schematic diagram of an illumination optical apparatus according to a variation of the third embodiment of the invention.

FIG. 21 schematically shows the composition of an illumination optical apparatus according to a second variation of the third embodiment.

This second variation differs from the third embodiment only in that the afocal zoom lens 5 is removed and the diffractive optical element 6b and the first fly-eye lens 4 are positioned adjacent each other, and the rest of the composition is the same as that of the third embodiment. Accordingly, in FIG. 21, elements having the same function as elements in the second embodiment are assigned the same reference numbers as in FIG. 17.

As discussed above, the afocal zoom lens 5 links the diffractive optical element 6b and first fly-eye lens 4 as optical conjugates, and has the function of changing the angle of the incident light beams on the incident surface of the first fly-eye lens 4. Accordingly, even if the afocal zoom lens 5 is removed from the illumination optical path and the diffractive optical element 6b and the incident surface of the first fly-eye lens 4 are positioned adjacent each other, the angle of the incident light beams on the incident surface of the first fly-eye lens 4 is determined by the diffraction angle of the diffractive optical element 6b. Accordingly, in the second variation, it is possible to change the size of the annular secondary light source formed at the back side focal plane of the second fly-eye lens 8 by changing the focal length of the zoom lens 7, but it is not possible to change the annular ratio thereof.

Fourth Embodiment

Figure 22:
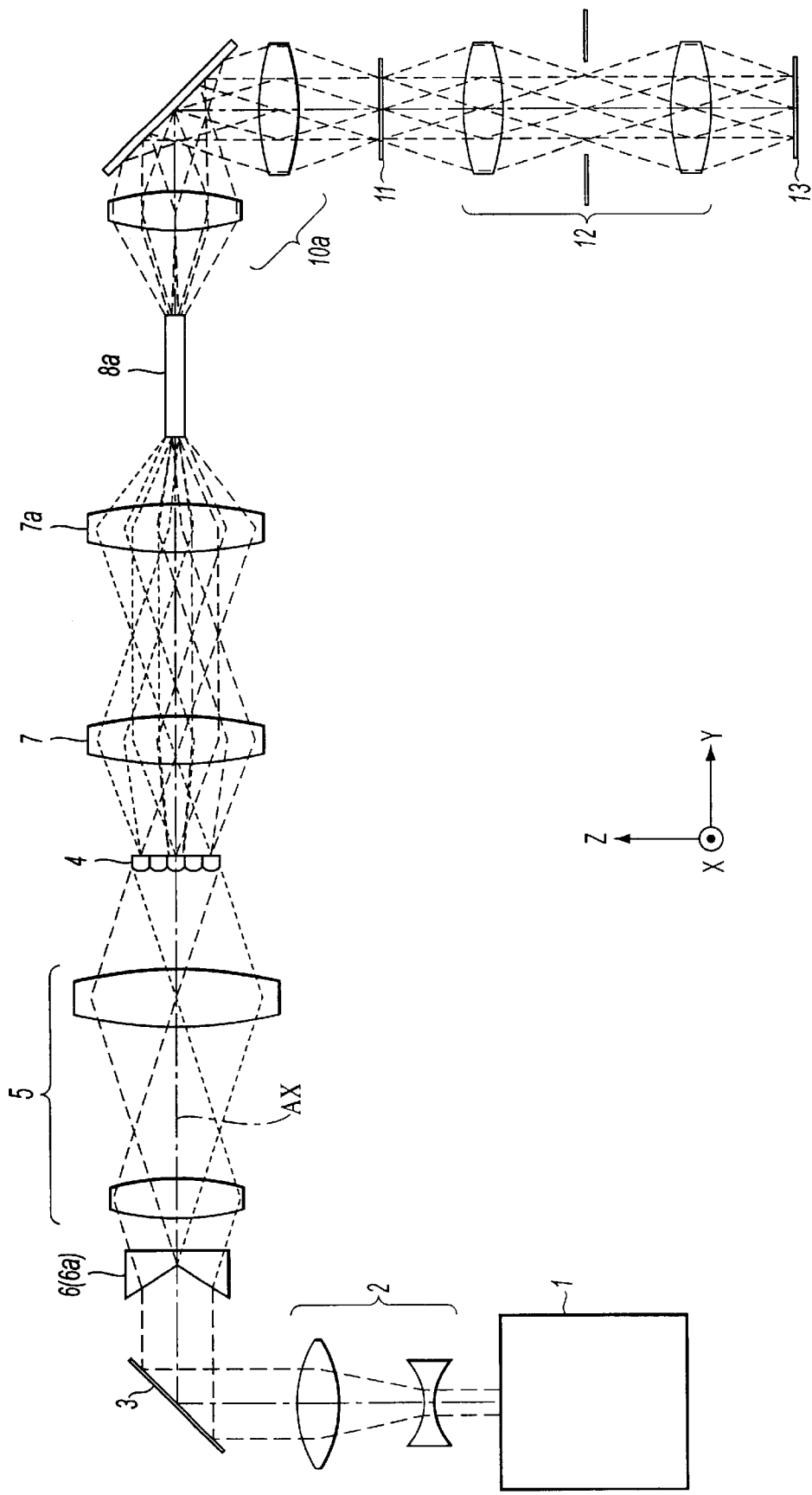
FIG. 22 is a schematic diagram of an illumination optical apparatus according to a fourth embodiment of the invention.

FIG. 22 schematically shows the composition of an illumination optical apparatus according to a fourth embodiment of the present invention.

The fourth embodiment has a composition similar to that of the second embodiment. However, the only fundamental difference is that in the second embodiment a fly-eye lens is employed as an optical integrator, but in this fourth embodiment an internal reflection type (Rod-type) integrator (e.g., light pipe, light tunnel, glass rod, etc., hereafter referred to simply as a "rod-type integrator") is employed as the optical integrator. Accordingly, in FIG. 22, elements having the same function as elements in the second embodiment are assigned the same reference numbers as in FIG. 12.

In this embodiment, a rod-type integrator 8a and a condenser lens 7a are mounted in the optical path between the zoom lens 7 and an imaging optical system 10a, and the aperture stop for restricting the secondary light source is removed. Here, the composite optical system composed of the zoom lens 7 and the condenser lens 7a links the back side focal plane of the first fly-eye lens 4 and the incident surface of the rod-type integrator 8a as substantially optically conjugate. In addition, the imaging optical system 10a links the exit surface of the rod-type integrator 8a and the mask 11 as substantially optically conjugate.

The rod-type optical integrator 8a is an internal reflection-type glass rod formed of a glass material such as silica glass or fluorite, and uses total reflection at the boundary surface between the inside and the outside, that is to say at the inner surface, to form light source images, the number of which corresponds to the number of internal reflections, along a surface that is parallel to the rod incident surface and that passes through the convergence point. Nearly all of the light source images formed are virtual images, with only the center (i.e., the convergence point) light source image being a real image. That is to say, light beams incident on the rod-type integrator 8a are partitioned in the angular direction by internal reflection, and a secondary light source which is composed of a plurality of light source images is formed along a surface that is parallel to the incident surface of the rod and that passes through the convergence point. In the case of this fourth embodiment, an annular secondary light source is formed when the conical prism 6 is employed as the light beam shape changing element, and a quadrupole secondary light source is formed when the pyramidal prism 6a is used.

Light beams from the secondary light source formed by the rod-type integrator 8a at the incident side thereof are superimposed at the exit surface thereof, and then pass through the imaging optical system 10a and uniformly illuminate the mask 11. As discussed above, the imaging optical system 10a links the exit surface of the rod-type integrator 8a and the mask 11 (and hence, the wafer 13) as substantially optically conjugate. Accordingly, a rectangular illumination field similar to the cross-sectional shape of the rod-type integrator 8a is formed on the mask 11.

In this manner, it is possible, while satisfactorily suppressing light loss as in the above embodiments, to accomplish annular modified illumination by using the conical prism 6 as the light beam shape changing element, to accomplish quadrupole modified illumination by using the pyramidal prism 6a as the light beam shape changing element, and to accomplish regular circular illumination by withdrawing the light beam shape changing element from the illumination optical path. In addition, by appropriately changing the magnification m of the afocal zoom lens 5 and the focal length fr of the zoom lens 7, it is possible to change the size and shape of the secondary light source.

In accomplishing circular aperture illumination in the above-described embodiments and variations, the light beam shape changing element is preferably withdrawn from the illumination optical path. By withdrawing the light beam shape changing element (6, 6a, 6b), it is possible to have the composition of a so-called double fly-eye system, as is disclosed in U.S. Pat. No. 4,497,015 (which corresponds to Japanese Unexamined Patent Publication No. Sho 58-147708).

When doing this, in the apparatus having the composition illustrated in FIGS. 12, 17 and 22, the afocal zoom lens 5 may be withdrawn at the same time. In addition, in the apparatus having the composition illustrated in FIG. 21, the first fly-eye lens 4 may be withdrawn at the same time and in its place a different fly-eye lens suitable for the illumination conditions may be disposed in the illumination optical path as the first fly-eye lens. In addition in the third embodiment, it is possible to used a diffractive optical element which forms a circular illumination field at a far field to accomplish circular illumination.

In addition in the fourth embodiment, the conical or pyramidal prism was employed as the light beam shape changing element, but it is also possible to employ a diffractive optical element such as in the third embodiment.

In addition, in the above-described embodiments and variations, a prism having a conical concave surface was employed as the conical prism, but it is also possible to employ a prism having a convex conical surface. Similarly, for the pyramidal prism, it is possible to employ a prism having convex pyramidal surfaces.

In addition, in the above-described embodiments and variations, the present invention was explained using as an example a projection exposure apparatus provided with an illumination optical apparatus, but it is clear that it is also possible to apply the present invention to a general illumination optical apparatus for uniformly illuminating a target illumination surface other than a mask.

Furthermore, in the above-described embodiments and variations, the light source is a KrF excimer laser that supplies light with a wavelength of 248 nm, or an ArF excimer laser that supplies light with a wavelength of 193 nm, but naturally the present invention can be applied to an apparatus provided with a light source other than this. For example, it is possible to use as the light source of the present invention a laser light source such as an $F_2$ laser that supplies light with a wavelength of 157 nm, or a light source unit or the like composed of the combination of a laser light source that supplies light at a prescribed wavelength and a non-linear optical element that changes the light from the laser light source into light with a wavelength of 200 nm or less.

In the second through fourth embodiments, the operation of interchanging illumination is similar to the first embodiment. In addition, in the third and fourth embodiments, driving systems and control systems are not shown in FIGS. 17 and 21. The illumination optical system of the third embodiment has a driving system which controls interchanging the diffractive optical elements 6b and 6c, a zoom driving system which controls the magnification of the afocal zoom lens 5, a zoom driving system which controls the focal length of the zoom lens 7, and a driving system which controls the aperture stops (the turret substrate 400).

Fifth Embodiment

Figure 23:
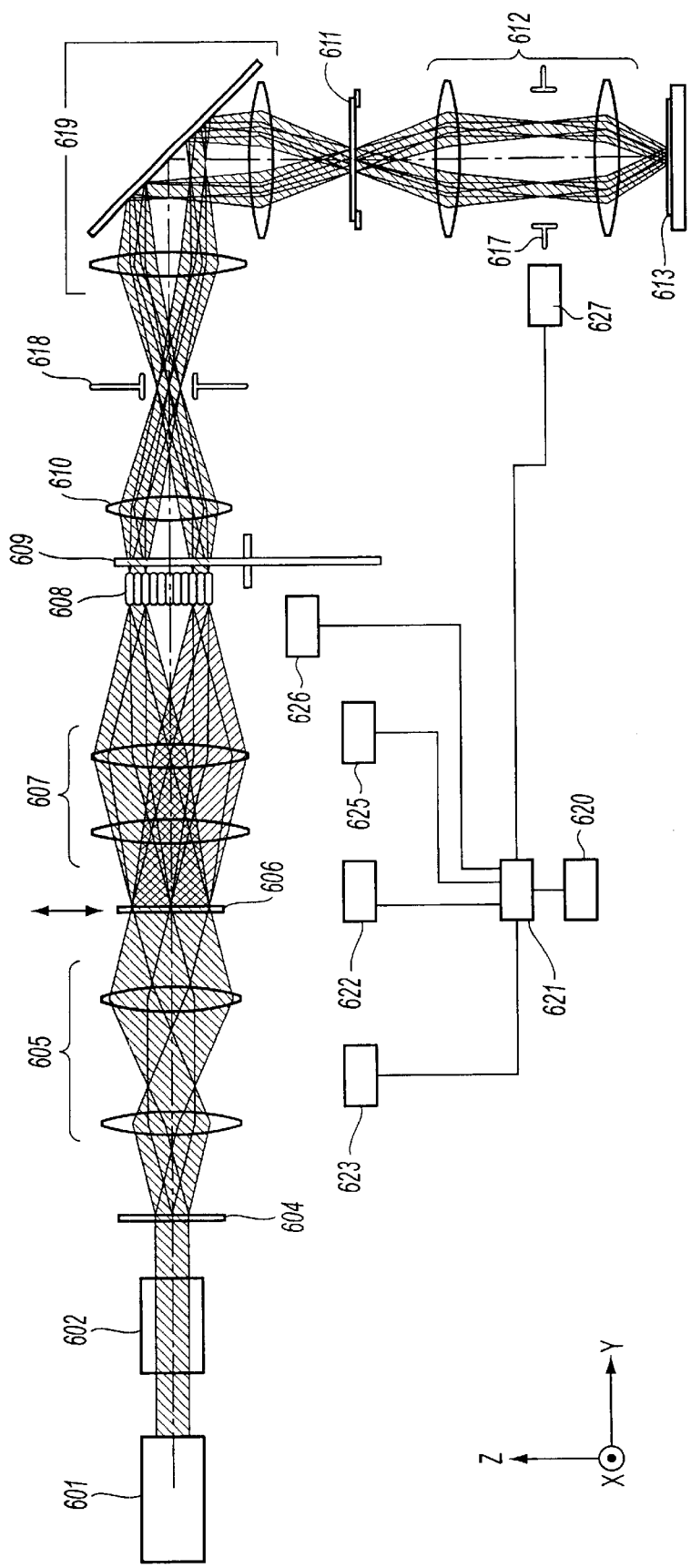
FIG. 23 is a schematic diagram of an illumination optical apparatus according to a fifth embodiment of the invention.

FIG. 23 is a schematic diagram of an illumination optical apparatus according to a fifth embodiment of the present invention.

The exposure apparatus of FIG. 23 preferably has either a KrF or ArF excimer laser as a light source 601. Nearly parallel light beams emitted from the light source 601 in the direction of the Y-axis enter the diffractive optical device 604 through the unit magnification relay optical system 602. In the unit magnification relay optical system 602, the output side mirror of a pair of (not shown) resonator mirrors in the light source 601 and the diffractive optical device 604 are made to be substantially optically conjugate.

The diffractive optical device 604 transforms and emits the entering light with a rectangular cross-section as a nearly circular cross-section in the far field (Fraunhofer diffraction region). The light emitted from the diffractive optical device 604 enters is transmitted by an afocal zoom lens 605 to a special fly-eye lens 606, which is removable relative to the illumination path.

Figure 24A:
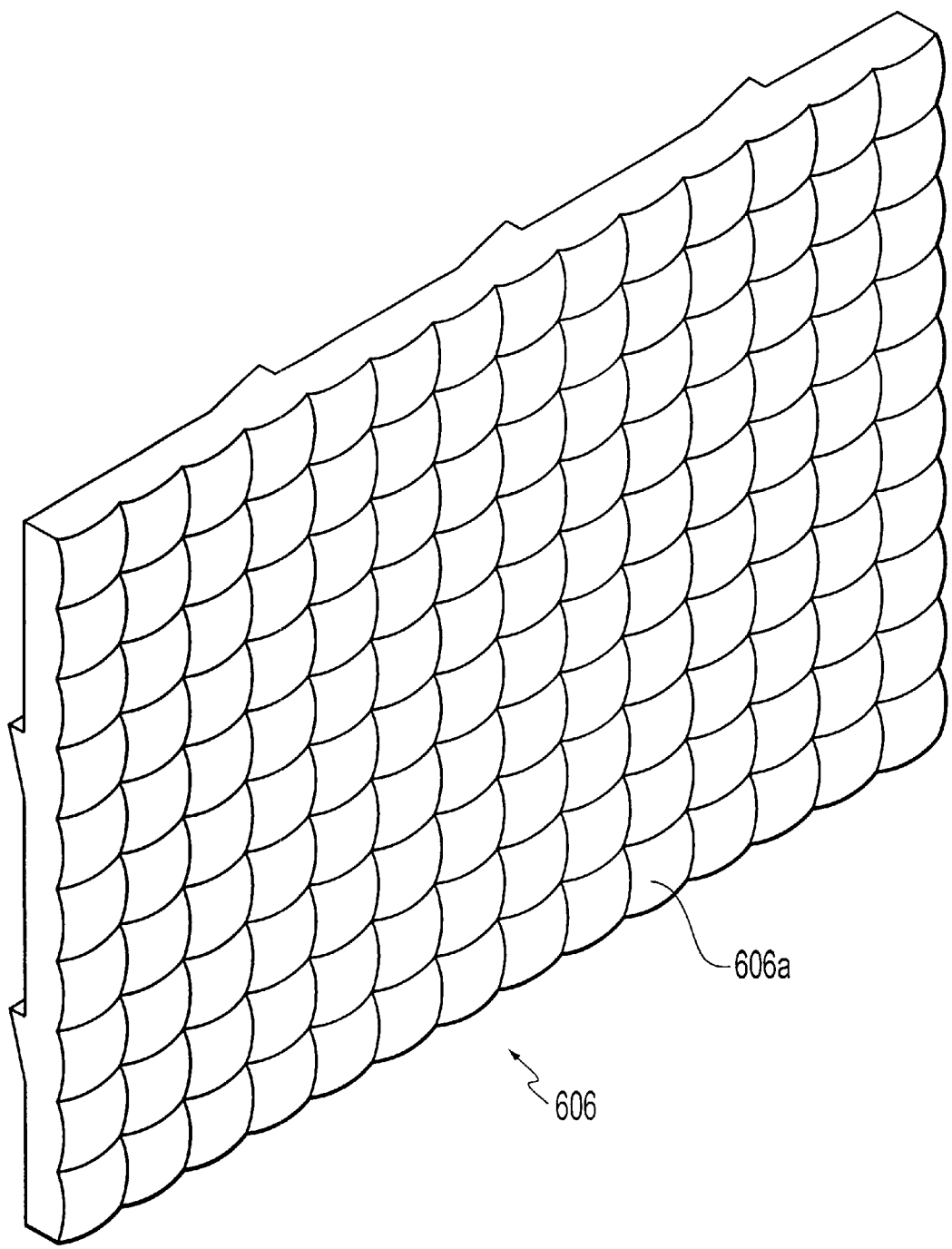
FIGS. 24A and 24B respectively show input and output sides of an exemplary micro fly's eye lens used in the fifth embodiment.
Figure 24B:
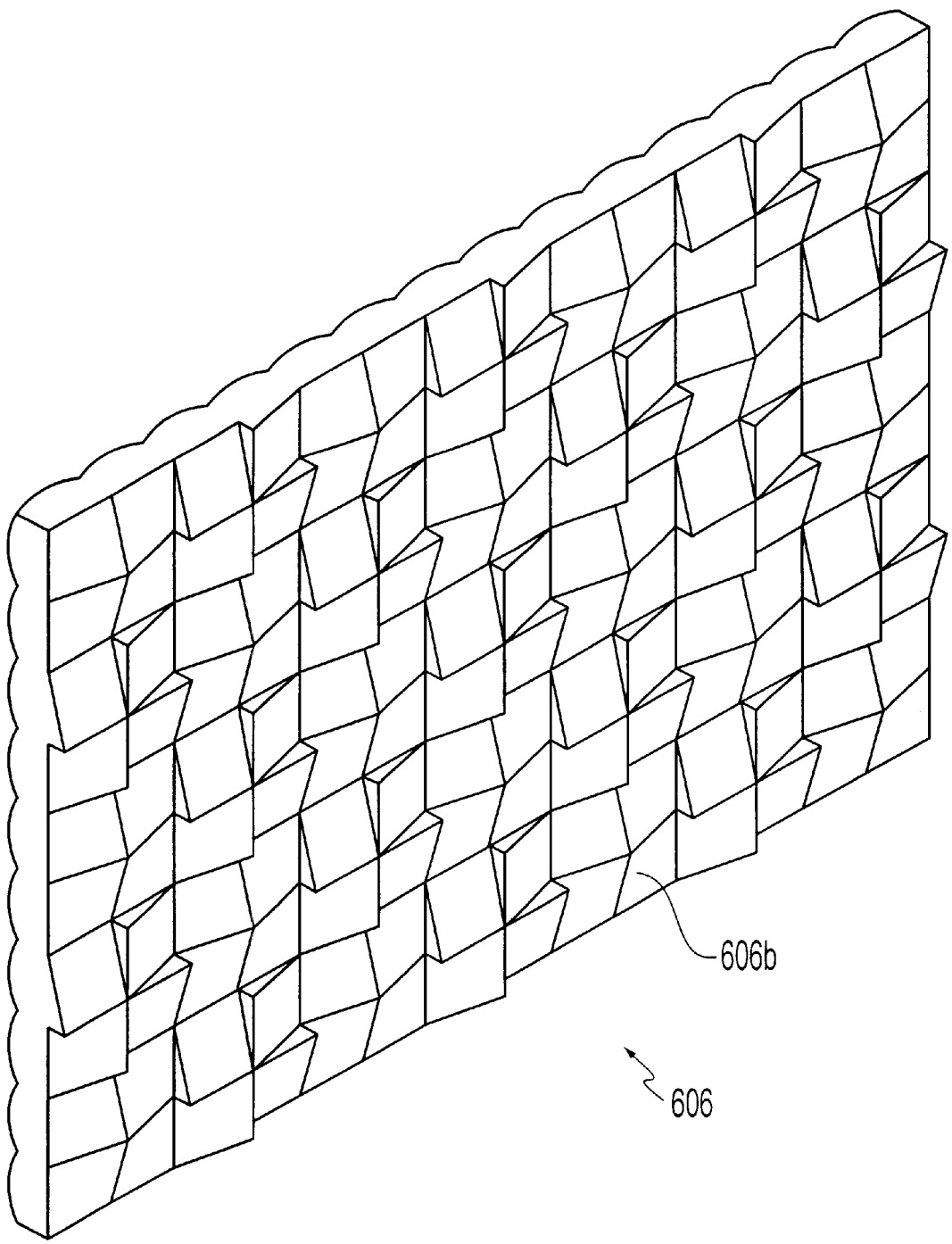

FIG. 24A is an oblique view of the special fly-eye lens 606 from the incident direction of the light, and FIG. 24B is an oblique view of the special fly-eye lens 606 from the exit direction of the light. In FIG. 24A and FIG. 24B, the same coordinate system as FIG. 23 is provided.

The special fly-eye lens 606 has multiple lens surfaces 606a densely arranged in a matrix shape as shown in FIG. 24A. The special fly-eye lens 606 also has multiple prism surfaces 606b densely arranged in a matrix shape as shown in FIG. 24B. The multiple prism surfaces 606b each correspond to the multiple lens surfaces 606a. Here, the multiple lens surfaces 606a and the multiple prism surfaces 606b are formed by performing an etching process, for example, on parallel flat glass plates.

Figure 25A:
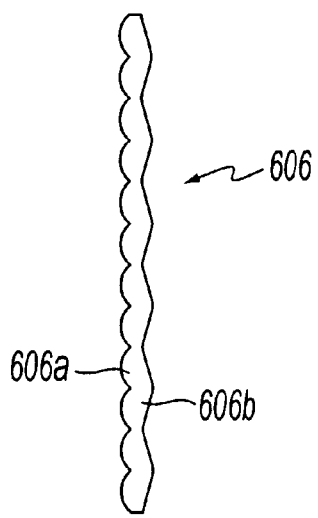
FIGS. 25A and 25B respectively show exemplary arrangements for the micro fly's eye lens used in the fifth embodiment.
Figure 25B:
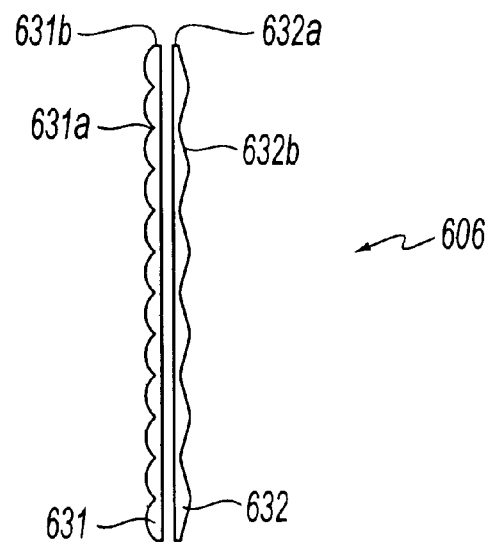

FIG. 25 is a cross section of the special fly-eye lens described in FIG. 24A and FIG. 24B. Preferably, the fly-eye lens 606 has the multiple lens surface 606a and the multiple prism surface 606b on the front and the back surfaces of one substrate, as described in FIG. 25A, but it may be structured, as described in FIG. 25B, in such a manner that the multiple lens surface 631a is provided on the front surface of a substrate 631 while the multiple prism surface 632b is provided on the back surface of another substrate 632. In this case, the surface 631b and the surface 632a, which face each other, are preferably flat surfaces.

Moreover, in FIGS. 25A and 25B, an example is shown in which the multiple lens surfaces 606a (631a) of the fly-eye lens 606 each has positive refraction power, but these lens surfaces may have negative refraction power as well.

The prism array formed on the side of prism surface 606b of the special fly-eye lens 606 includes, for example, a cluster body of a first quad small prism set and a cluster body of a second quad small prism set. The first quad small prism set is shown in FIG. 26A and the second quad small prism set is shown in FIG. 26B.

In FIG. 26A, the first small prism set comprises a prism surface 606b1 with a normal line inclined towards the positive Z direction relative to the XZ plane, a prism surface 606b2 with a normal line inclined towards the positive X direction relative to the XZ plane, a prism surface 606b3 with a normal line inclined in the negative Z direction relative to the XZ plane, and a prism surface 606b4 with a normal line inclined in the negative X direction relative to the XZ plane.

In FIG. 26B, the second small prism set comprises a prism surface 606b5 obtained by rotating the prism surface 606b1 by −45 around the Y-axis, a prism surface 606b6 obtained by rotating the prism surface 606b1 −135 around the Y-axis, a prism surface 606b7 obtained by rotating the prism surface 606b1 −255 around the Y-axis, a prism surface 606b8 obtained by rotating the prism surface 606b1 −315 around the Y-axis. In this example, clockwise rotation is defined to be the positive direction.

Next, a case in which parallel light beams enter the special fly-eye lens 606 is examined. In this case, multiple point light sources are formed on the exit side of the special fly-eye lens 606 due to the function of the multiple lens surface 606a of the special fly-eye lens 606. Moreover, because the front side (incidence side) of the focal position of the zoom lens 607 is near the position of the multiple point light sources (rear side (exit side) focal position of the lens surface 606a), the multiple images of the lens surfaces 606a are formed overlapping each other on the rear side (exit side) focal plane of the zoom lens 607 which is positioned near the incident surface of the fly-eye lens 608. At this time, due to the function of the prism surfaces 606b1–606b8 which are positioned corresponding to the lens surface 606a, the positions where the multiple images of the lens surface 606a are formed vary within the XZ plane.

FIG. 27A shows an illumination region that is formed on the incident surface of the fly-eye lens 608 by the light emitted from the special fly-eye lens 606 and transmitted through the zoom lens 607 when parallel light beams enter the special fly-eye lens 606. In FIG. 27A, the illumination region 661 is formed by the light passing through the prism surface 606b1, the illumination region 662 is formed by the light passing through the prism surface 606b2, the illumination region 663 is formed by the light passing through the prism surface 606b3, the illumination region 664 is formed by the light passing through the prism surface 606b4, the illumination region 665 is formed by the light passing through the prism surface 606b5, the illumination region 666 is formed by the light passing through the prism surface 606b6, the illumination region 667 is formed by the light passing through the prism surface 606b7, and the illumination region 668 is formed by the light passing through the prism surface 606b8.

Returning to FIG. 23, the diffractive optical device 604 diffuses the parallel light beams from the light source 601 into light beams with a predetermined numerical aperture (divergence angle), and because the afocal zoom lens 605 makes the diffractive optical device 604 and the special fly-eye lens 606 to be nearly optically conjugate, the special fly-eye lens 606 is illuminated by light beams with a numerical aperture (divergence angle) corresponding to the angle of magnification of the afocal zoom lens 605.

The diffractive optical device 606 generates light beams with circular cross-section in the far field, and a cone-shaped body of light beams enter the special fly-eye lens 606. Here, cone-shaped light beams entering the special fly-eye 606 may be considered to be a set of an infinite number of light beams with multiple angular components. Hence, multiple illumination regions with slightly different positions in the XZ plane are formed on the incident surface of the fly-eye lens 608. FIGS. 27B and 27C show the circular illumination regions 671–678 and 681–688 that are formed on the incidental surface of the fly-eye lens 608.

One difference between FIG. 27B and FIG. 27C is that the vertical angles (divergence angle) of the cone-shaped light beams entering the special fly-eye lens 606 are different. FIG. 27B shows the state in which the light beams have a larger divergence angle than the light beams in FIG. 28C. By changing the divergence angle of light beams entering the special fly-eye lens 606, the width of pseudo ring-shaped illumination regions (which includes clusters of circular illumination regions 671–678 or 681–688) may be changed. In this case, the distance Rm between the center of the width of pseudo ring-shaped illumination regions and the optical axis is constant. The divergence angle of the light beams entering the special fly-eye lens 606 can be changed by changing the angular magnification of the afocal zoom lens 605. In fact, the afocal zoom lens 605 is capable of changing the width of the rings.

Figure 28B:
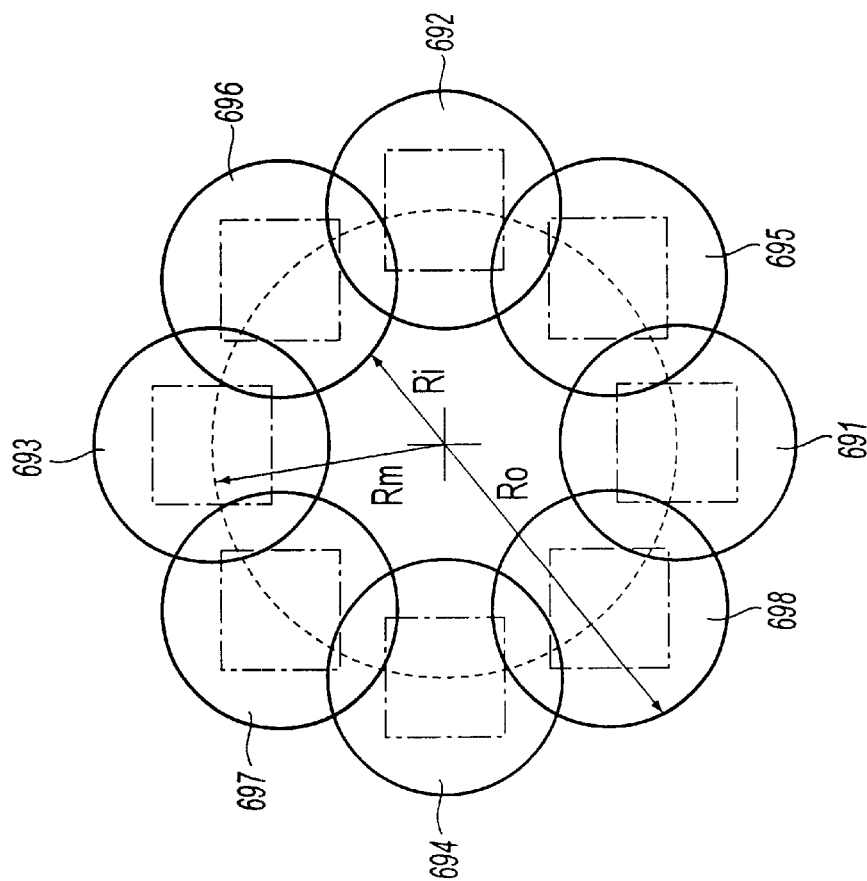
Figure 28A:
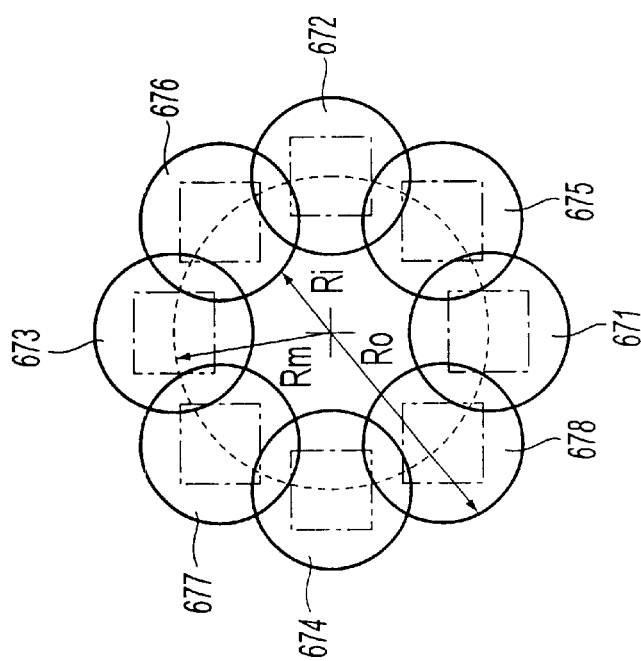

Next, the function of the zoom lens 607 is described in reference to FIG. 28A and FIG. 28B. FIGS. 28A and 28B respectively show illumination regions on the incident surface of the fly-eye lens 608. By changing focal length of the zoom lens 607, the illumination range enlarges or shrinks proportionally on the incident surface of the fly-eye lens 608. Here, FIG. 28A shows a condition in which the focal length of the zoom lens 607 is larger than the focal length in FIG. 28B. The angular magnification of the afocal zoom lens 605 is constant in both states shown in FIGS. 28A and 28B.

By changing focal length of the zoom lens 607 in the above manner, the value of the outer radius Ro of the pseudo annular-shape illumination region may be changed freely while keeping the ratio (annular ratio) of the inner radius Ri and the outer radius Ro of the pseudo annular-shape illumination regions formed in the illumination regions 671–678 or 681–688 constant.

Moreover, by combining the changing of the angular magnification of the afocal zoom lens 605 and the changing of the focal length of the zoom lens 607, the outer radius and the annular ratio of the pseudo annular-shape illumination region formed on the fly-eye lens 608 may be set to any desired values.

Because the fly-eye lens 608 forms a secondary light source with a shape corresponding to the shape of the illumination region on its incident surface, the outer radius and the annular ratio of the annular-shaped secondary light source may be set to any desired values by changing the angular magnification of the afocal zoom lens 605 and the focal length of the zoom lens 607.

Returning to FIG. 23, a variable aperture stop 609, a condenser lens 610, an illumination field stop 618, and an illumination field stop imaging optical system 619 are arranged. Light beams from the fly-eye lens 608 form an annular-shaped secondary light source whose shape is restricted by a variable aperture stop 609. Light beams from the annular-shaped light source are overlapped in the condenser lens 610 and illuminate the illumination field stop 618. Moreover, the aperture section of the illumination field stop 618 and a reticle 611 are in a nearly conjugate relationship through the illumination field stop imaging optical system 619. Hence, an illumination region, which is an image of the aperture section of the illumination field stop 618, is formed on the reticle 611.

Here, the system from the reticle 611 to the wafer 613 similar to the above embodiments, thus the description of the system is omitted.

The apparatus of FIG. 23 also includes a first driving system 622 for mounting and removing the special fly-eye lens 606 relative to the illumination path, a second driving system 623 for moving at least one of the plurality of lens groups composing afocal zoom lens 605 in the direction of optical axis in order to change the magnification of the afocal zoom lens 605, a fourth driving system 625 for moving at least one of a plurality of lens groups in the zoom lens 607 in the direction of optical axis in order to change the focal length of the zoom lens 607, a fifth driving system for driving the variable aperture stop 609 in order to specify the size and the shape of the surface light source (secondary light source), and a sixth driving system for driving the variable aperture stop 617 in the projection optical system 612 in order to specify a numerical aperture of the projection optical system 612. The apparatus in FIG. 23 also includes an input unit 620 for entering information related to the type of reticle (mask), and a control system 621 for controlling the aforementioned first–sixth driving systems 622–627 based on the information from the input unit 620.

Sixth Embodiment

Figure 29:
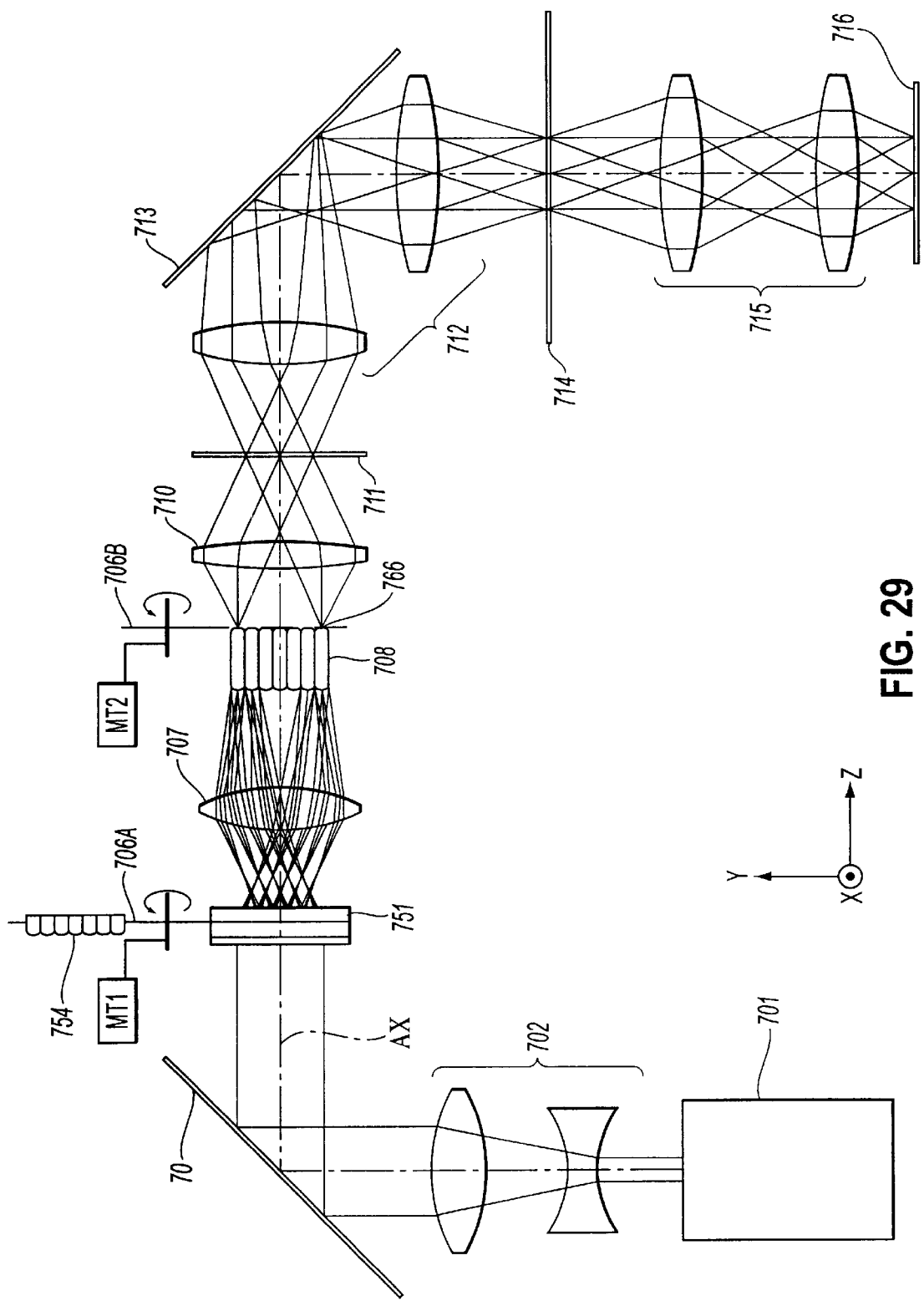
FIG. 29 is a schematic diagram of an illumination optical apparatus according to a sixth embodiment of the invention.

FIG. 29 is a schematic diagram of an illumination optical system according to a sixth embodiment of the present invention. Light beams from a light source 701, such as an excimer laser, are shaped into a predetermined shape by a beam expander 702 and are reflected by a mirror 703 to a first diffractive optical device 751 attached to a revolver 706A. Diffracted light beams from the first diffractive optical device 751 are gathered by a relay lens 707 and uniformly and overlappingly illuminate the incident surface of a fly-eye lens 708, which is a wavefront dividing (splitting) type integrator. As a result, a substantially surface light source is formed at the exit surface of the fly-eye lens 708. The relay lens 707 is an imaging optical system, and is designed in such a manner that the entire effective region near the exit side surface of the diffractive optical device 751 forms an image over substantially the entire exit side surface of the fly-eye lens 708.

Light beams emitted from the surface light source at the exit side of the fly-eye lens 708 are gathered once overlappingly by the condenser optical system 710 after the shape of the transmitted light beams have been restricted by the aperture stop 766 attached to a revolver 706B. Once the light beams are thus overlapped and pass through the relay optical system 712, they uniformly and overlappingly illuminate the patterned reticle (or mask, original projection plate) 714. An illumination field stop (reticle blind) 711 for determining the illumination region is arranged in the optical path between the condenser optical system 710 and the relay optical system 712. Moreover, the projection optical system 715 projection exposes, using uniform illumination light, the pattern which is formed on the reticle 714 onto the wafer 716.

Figure 30A:
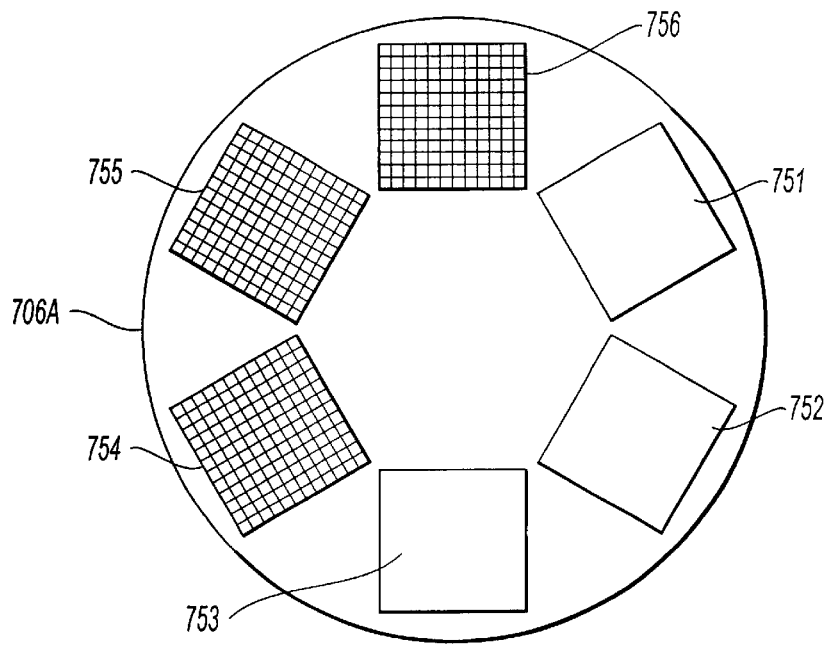
FIG. 30A shows a revolver with an exemplary set of interchangeable optical elements used with the sixth embodiment.
Figure 30B:
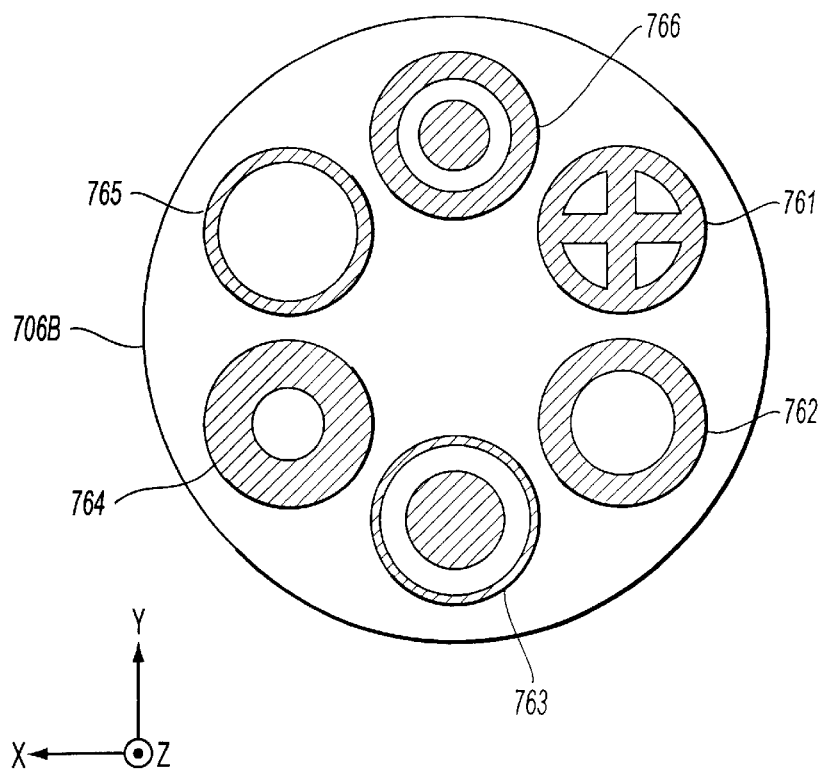
FIG. 30B shows a revolver with an exemplary set of interchangeable aperture stops used with the sixth embodiment.

The revolver 706A carries a plurality of diffractive optical devices 751, 752, 753 and a plurality of auxiliary fly-eye lenses 754, 755, 756, as shown in FIG. 30A. Moreover, the revolver 706A is structured in such a manner that the rotation of the revolver 706A around the optical axis AX by the driving motor MT1 enables the selection of the diffractive optical devices 751, 752, 753 and the auxiliary fly-eye lenses 754, 755, 756. Similarly, the aperture stops 761–766 are structured in such a manner that stops with various aperture shapes are selected by the revolver 706B, as shown in FIG. 30B.

When the auxiliary fly-eye lenses 754–756 are selected by rotating the revolver 706A, the illumination optical system becomes a double fly-eye lens system (double integrator system). The double fly-eye lens system is capable of forming multiple three-dimensional light source images matching the number m*n, a product of the number m of the lens elements in the auxiliary fly-eye lens and the number n of the lens elements in the fly-eye lens 708 on the exit surface of the fly-eye lens 708. Here, the auxiliary fly-eye lens 754 corresponds to the aperture stop 765, the fly-eye lens 755 corresponds to the stop 763, and the fly-eye lens 756 corresponds to the stop 764. A technology for reducing the amount of light loss for circular aperture stops with different diameters by switching the first fly-eye lens is disclosed, for example, in U.S. Pat. No. 5,392,094.

On the other hand, one of the merits of the present embodiment is that the first through the third diffractive optical devices 751–753 are also capable of being selected.

Figure 31A:
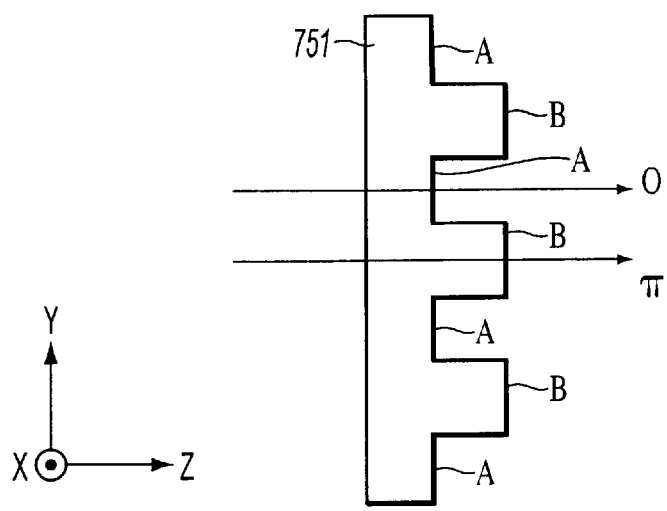
FIGS. 31A–C schematically show an exemplary arrangement for a diffractive optical element used with the sixth embodiment and an illumination configuration intensity profile formed by the diffractive optical element.
Figure 31B:
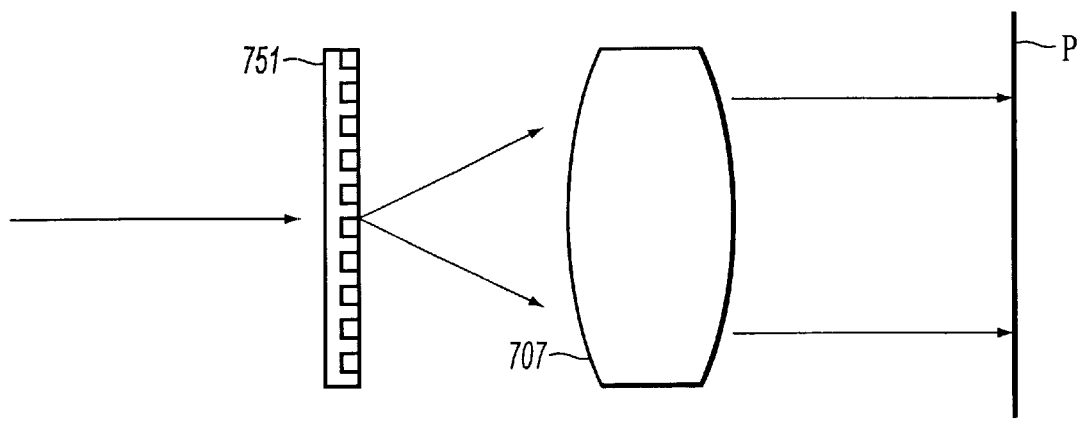
Figure 31C:

The first through third diffractive optical devices 751–753 preferably are phase-type diffractive optical devices and are structured by arranging a plurality of minute phase patterns and transmission rate pattern. FIG. 31A shows a cross-sectional shape of the diffractive optical device 751 viewed from the X direction. Light beams transmitted through the diffractive optical device 751 through the section denoted by A have a zero phase while the light beams transmitted through the section denoted by B have a delay phase n. Hence, wave optically, these two sets of light beams offset each other, resulting in the disappearance of $0^{th}$ order light beams (direct transmission light beams), as shown in FIG. 31B. Hence, light beams transmitted through the diffractive optical device 751 are diffracted and transmitted through the relay lens 7 as ±first order diffracted light beams (or ±second and higher order diffracted light beams). Moreover, light beams passing through the relay lens 707 become illumination having a delta function type intensity distribution I on the predetermined irradiation surface P, as shown in FIG. 31C. By using diffractive optical devices to which various phase patterns and transmission rate patterns are added, the desired light intensity distribution may be obtained on the irradiation surface P, namely the incident surface of the fly-eye lens 708. The diffractive optical device need not be arranged as shown in FIG. 31, but can be any device that diffracts light beams through differences in phases, transmission rates and refraction rates.

Figure 32A:
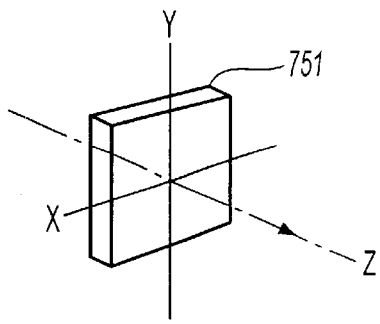
FIGS. 32A–C schematically show how a diffractive optical element used with the sixth embodiment diffuses received light.
Figure 32B:
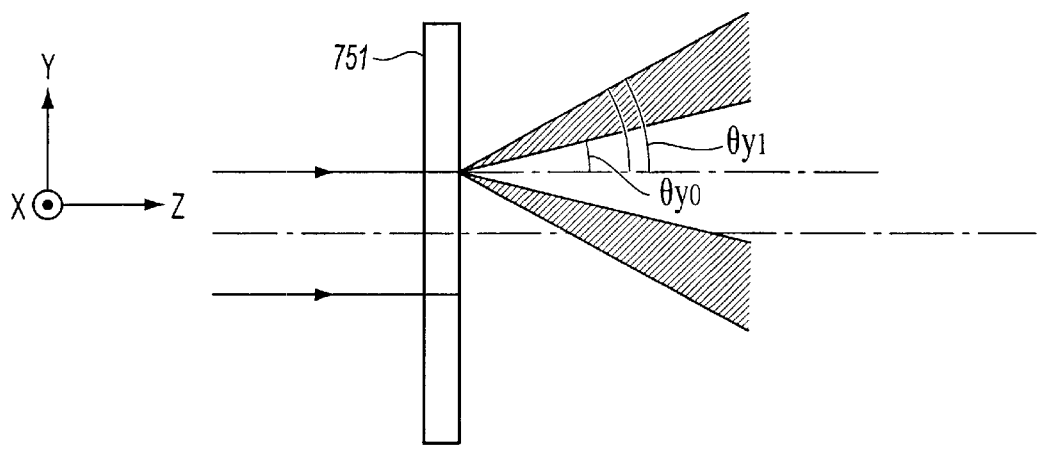
Figure 32C:
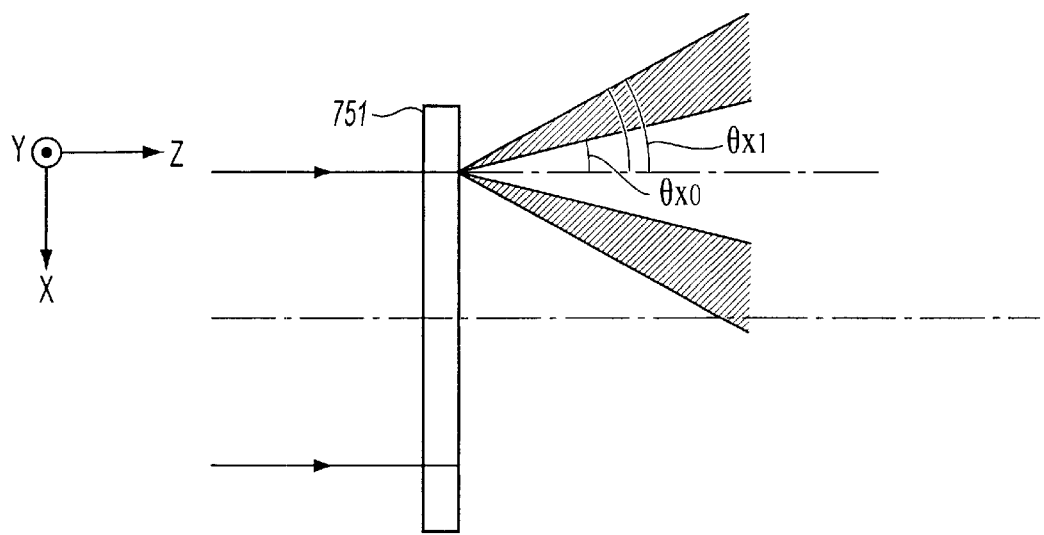

FIG. 32A is an oblique view showing the incidence state of light beams into the first diffractive optical device 751 as one example. FIG. 32B shows a state in which the diffraction light beams are viewed from the X direction, and FIG. 32C shows a state in which diffraction light beams are viewed from the Y direction. Here, assuming the optical axis to be the Z axis, and the vertical direction perpendicular to the Z axis to be the Y axis and the horizontal direction perpendicular to the Z axis to be the X axis, the angle in the ZY plane is denoted by $\Theta y$ and the angle in the ZX plane is denoted by $\Theta x$. Because the incidental light beams are diffracted within the diffraction angle ranges of $\Theta x0-\Theta x1$ and $\Theta y0-\Theta y1$ due to the first order diffraction characteristics, the cross-sectional shape of the diffraction light beams become nearly ring-shaped. Moreover, an annular-shaped light intensity distribution is formed on the incident surface of the fly-eye lens 708 through the relay lens 707.

Figure 33:
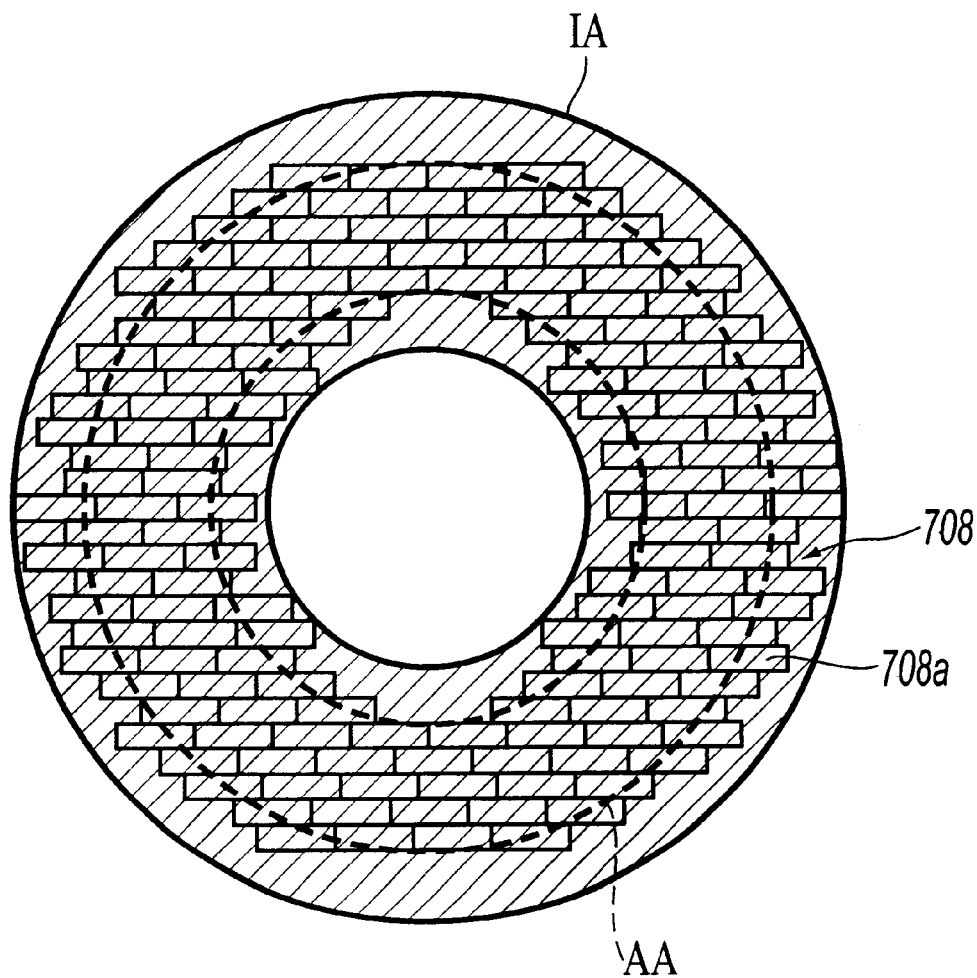
FIGS. 33 and 34A–C show exemplary modified illumination configurations formed on the optical integrator in the sixth embodiment.

FIG. 33 is a diagram illustrating an illumination region that is formed on the incident surface of the fly-eye lens 708 by the first diffractive optical device 751. When the first diffractive optical device 751 is used, the shape of the cross-section of the diffracted light beams becomes nearly ring-shaped due to the first diffraction characteristics. Moreover, light beams transmitted through the relay lens 707 form a nearly uniform light intensity distribution only in the ring-shaped illumination region IA denoted by the shaded area on the incident surface of the fly-eye lens 708. Here, the ring denoted by the dotted line is an aperture region AA formed by the aperture stop 766 which is arranged along the optical axis AX corresponding to the first diffractive optical device 751. As the figure shows clearly, only the element lenses 708a of the fly-eye lens 708 corresponding to the aperture shape of the aperture stop 766 may be illuminated by the ring-shaped light beams formed by the first diffractive optical device 751 and the relay lens 707, and the light from the light source 701 may be used with a high rate of efficiency.

The first diffractive optical device 751 may be made to only illuminate along the perimeter of element lenses 708a that contribute to the light beams transmitting through the annular-shaped aperture stop 766 in order to further increase the illumination efficiency. In this case, by altering the ranges of the diffraction angles $\Theta x$ and $\Theta y$ of the diffractive optical device 751 as needed, the multi-angle annular-shaped illumination region IA with different light intensity distributions at the central section and at the perimeter region may be formed on the incident surface of the fly-eye lens 708. Hence, since only the necessary element lenses 708a are illuminated, the annular-shaped aperture stop 766 may be illuminated with extremely high efficiency.

Figure 34A:
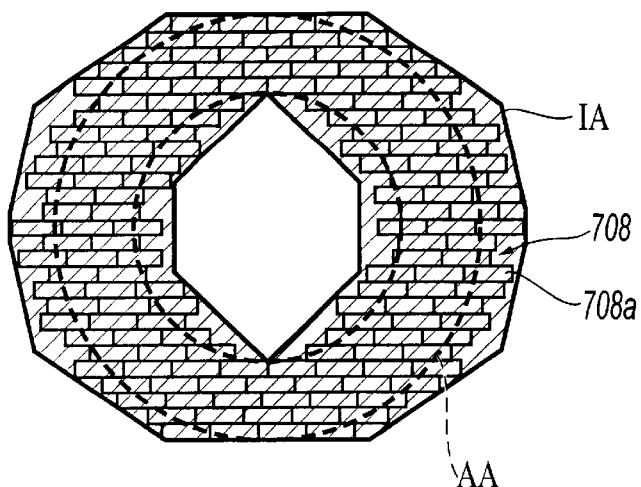
Figure 34B:
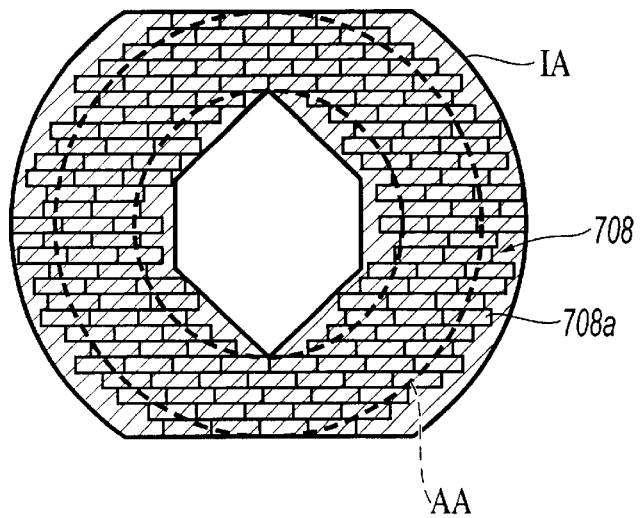

Moreover, a diffractive optical device having diffraction characteristics that transform the diffraction light beams into a polygonal ring-shaped band with the outer shape of a barrel and the inner shape of a hexagon may be used as the first diffractive optical device 751, as shown in FIG. 34B. In this case, an illumination region IA is formed corresponding to the size of only those element lenses 708a used for illumination among all of the lenses in the fly-eye lens 708, enabling an increase in illumination efficiency while maintaining uniform illumination.

Figure 34C:
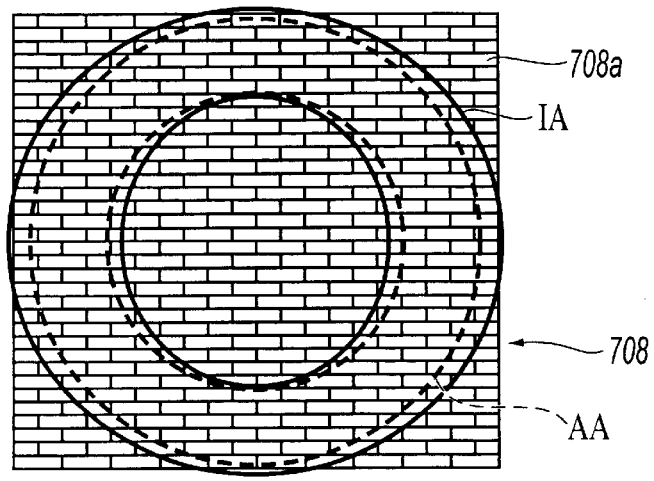

A diffractive optical device having diffraction characteristics to transform into the illumination region IA with both an outer and inner shape of an elliptic ring band may be used as the first diffractive optical device 751, as shown in FIG. 34C. In this case, only the element lenses 708a of all of the lenses in the fly-eye lens 708 used for illumination are illuminated, resulting in an increase in illumination efficiency while maintaining uniform illumination.

Figure 35A:
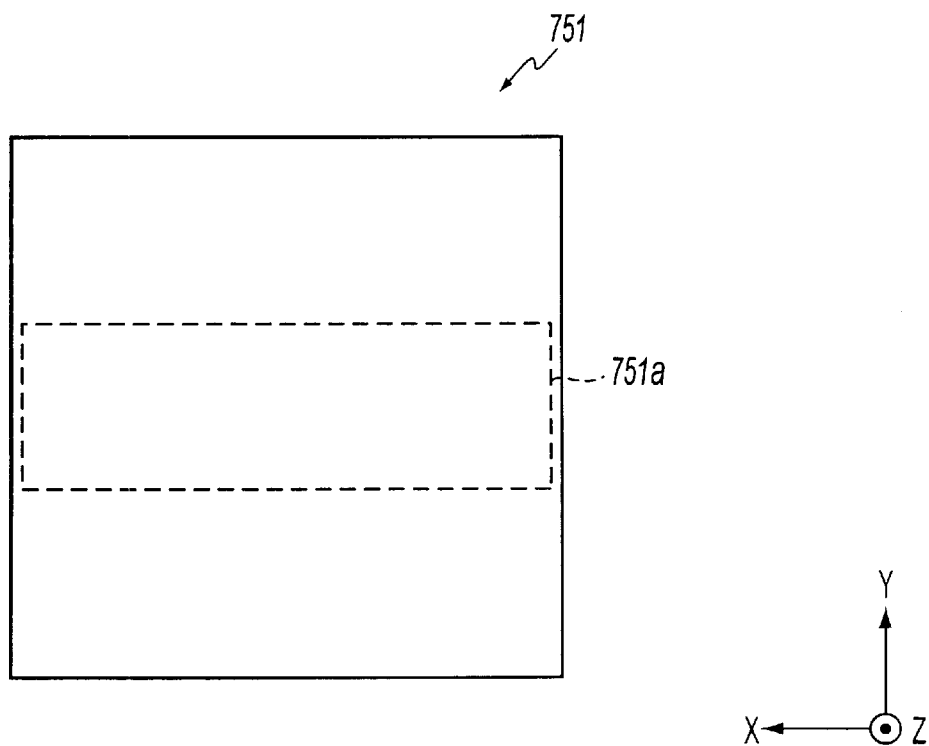
FIGS. 35A and 35B show the relationship between the effective region of the diffractive optical device and the element lenses of the optical integrator in the sixth embodiment.
Figure 35B:
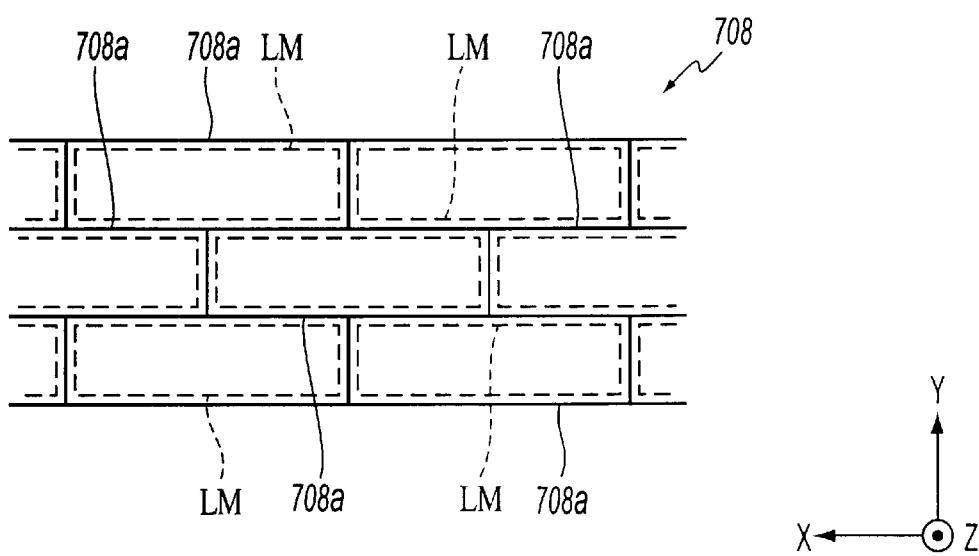

FIG. 35 shows the relationship between the effective region of the diffractive optical device 751 and the element lenses 708a of the fly-eye lens 708, with FIG. 35A showing the diffractive optical device 751 and FIG. 35B showing part of the fly-eye lens 708. As the figures clearly show, the effective region 751a of the diffractive optical device 751 and the XY cross-section of each of the element lenses 708A of the fly-eye lens 708 are set to be both rectangular and similar. By setting them in this manner, the macroscopic structure of the light point array LM that is formed at the exit surface of the fly-eye lens 708 is most dense. In fact, the uniformity of the macroscopic light intensity distribution at the position of the aperture stop 766 at the exit side of the fly-eye lens 708 may be improved, and further, the uniform illumination of reticle 714 and wafer 716 may be achieved.

The effective region 751a of the diffractive optical device 751 nearly coincides with the narrower one of the XY cross-section shape in the vicinity of the exit surface of the region out of the diffraction device 751 or the XY cross-section shape of the incident beam entering the diffractive optical device 751. In the present embodiment, both the region on which the optical element of the diffractive optical device 751 is formed and the shape of incident beam entering the diffractive optical element 751 are made to coincide with the cross-sectional shape of the element lenses 708a in the fly-eye lens 708.

In changing the illumination conditions, the revolver 706B may be rotated by the motor MT2, for example, so that the ring (annular)-shaped stop 763 with a larger diameter (the same shape but a different diameter than the stop 766) shown in FIG. 30B may be placed in the optical path. When the aperture stop is switched to a ring-band stop with a larger diameter in the above manner, the fly-eye lens 708 may be illuminated without loss in a slight amount while keeping the first diffractive optical element 751, as long as the relay lens 7 is a variable focal distance optical system (zoom optical system).

Figure 36A:
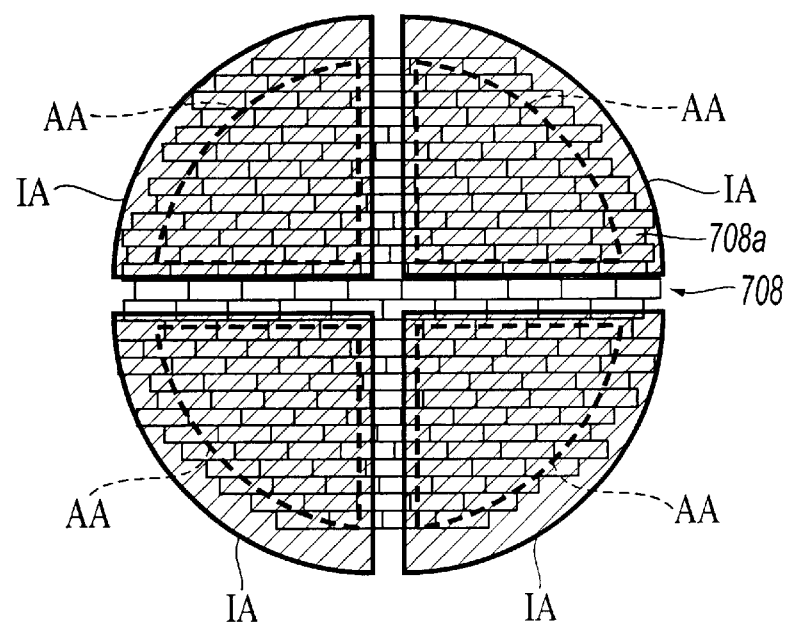
FIGS. 36A and 36B show exemplary modified illumination configurations with four regions on the incident surface in the optical integrator.

Moreover, when the revolver 706B is rotated by the motor MT2 and the aperture stop 761 is selected, the revolver 706A is also rotated by the motor MT1 to position the second diffractive optical device 752 in the optical path. The second diffraction device 752 has second diffraction characteristics. The cross-sectional shape of light beams diffracted by the second diffraction light device 752 have a shape that is scattered in four directions. Light beams form, after passing through the relay lens 707, an illumination region IA that has a light intensity distribution with four regions on the incident surface in the fly-eye lens 708, as shown in FIG. 36A. Hence, useless illumination of the cross-shape region at the center is eliminated, resulting in highly efficient illumination.

Figure 36B:
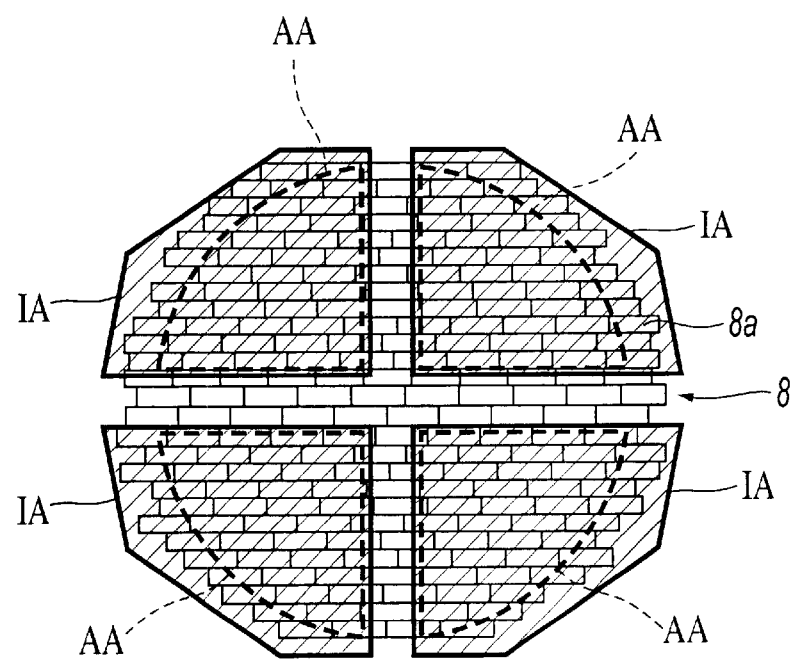

More preferably, when one of the four regions having a polygonal cross-section, particularly one with a pentagonal region such as that shown in FIG. 36B, is used, optimum illumination corresponding to the size of the element lenses 708a in the fly-eye lens 708 is achieved, resulting in a further improvement in illumination efficiency while maintaining the uniformity of the illumination.

If each of the element lenses 708a in the fly-eye lens is arranged randomly, namely not arranged in a lattice shape, optimum illumination corresponding to the size of the necessary element lenses 708a of all of the element lenses in the fly-eye lens 708 may be achieved by using a diffractive optical device having diffraction characteristics that make the outer shape of the four-region shape diffracted light into a polygonal shape.

When the present embodiment is applied to a scanning type projection exposure apparatus which performs exposure while moving the reticle as the original projection plate and the substrate as work relative to the projection optical system, each shape of the plurality of element lenses 708a of the fly-eye lens 708 is preferably made rectangular. In this case, if the direction of the edge of the illumination region being formed on the fly-eye lens 708 is parallel to the direction corresponding to the scanning direction (typically, the direction along the minor side), the intensity distribution on the wafer 716 may not be desirably distributed in the direction perpendicular to the scanning direction.

For this reason, particularly with quadrupolar illumination, the directions of the edges of four illumination regions formed on the incident surface of the fly-eye lens 708 by the diffractive optical device 752 and by the relay lens 707 are preferably inclined in the directions corresponding to the scanning direction of the plurality of element lenses 708a of the fly-eye lens 708.

Figure 37A:
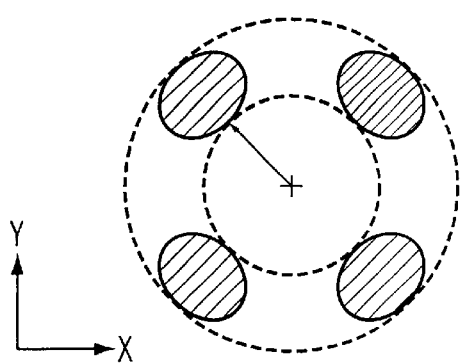
FIGS. 37A–37E show exemplary modified illumination configurations having multiple regions with edges of the regions continuously inclined relative to the scanning direction of the element lenses of the optical integrator.

In FIG. 37A, the shapes of four illumination regions IA are made to be elliptic in order to maintain the edges of the regions in the direction that is continuously inclined relative to the scanning direction in the element lenses 708a. Moreover, FIG. 37B describes the relationship between the illumination region IA and the incident surfaces of the plurality of element lenses 708a of the fly-eye lens 708.

Figure 37B:
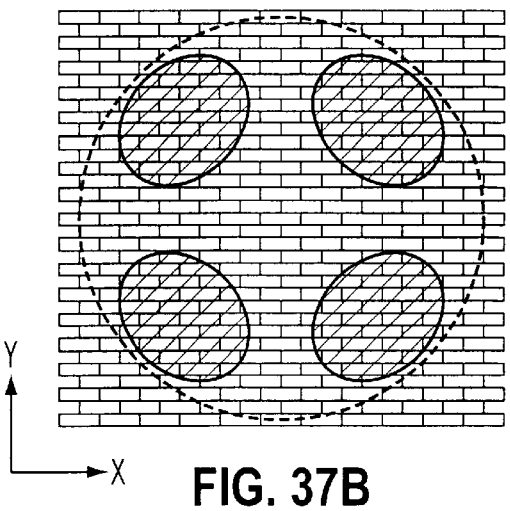

As FIG. 37B clearly shows, the edge of the elliptic illumination region IA does not intersect the plurality of the element lenses 708a at the sane location. Hence, unevenness (deviation from the desired distribution) of the intensity distribution on the surface being irradiated may be reduced.

In this case, using the aperture stop 766 on the exit side of the fly-eye lens 708, unevenness in illumination may be reduced even if the edges of the illumination regions in the plurality of the element lenses 708a that intersect are not shielded.

Furthermore, even if the aperture stop 766 is not used (or in the case of the maximum aperture), uneven illumination may be reduced. Hence, even if the positions of a plurality of illumination regions are continuously changed using the relay lens 707 as a zoom optical system, it is unnecessary to continuously change the positions of aperture unit of the illumination aperture stop 766 corresponding to the illumination regions.

Figure 37C:
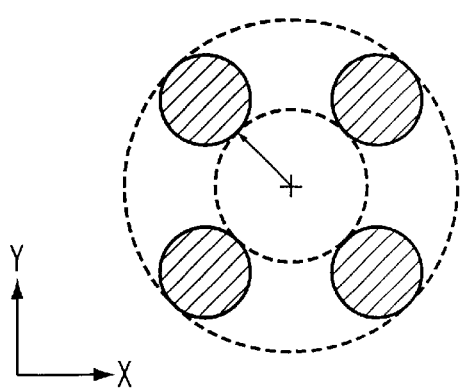

Moreover, as shown in FIG. 37C, the shape of four illumination regions IA may be made to be circular. From a point of view of improving imaging performance, it is more preferable to make the shape of a plurality of illumination regions IA elliptic as shown in FIG. 37A than to make them circular as shown in FIG. 37C, because it makes it possible to separate the light amount distribution of the third order light source from the optical axis.

Figure 37D:
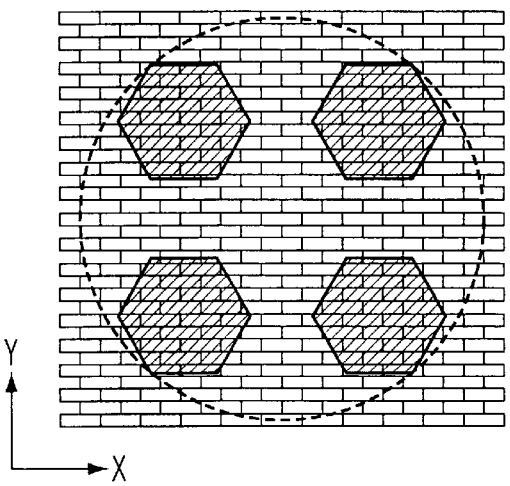

In a scanning type exposure apparatus, it is not necessary to consider the direction of the edges of a plurality of the illumination regions IA even if the direction is the same as the direction perpendicular to the scanning direction because the unevenness of illumination along this direction is integrated by the scanning exposure. Hence, the shapes of a plurality of the illumination regions IA which are formed by the diffractive optical device 752 and the relay lens 707 may be hexagonal, as shown in FIG. 37D. In this case, uneven illumination on the surface being irradiated may be reduced by setting the system in such a manner that the edges of the illumination regions IA intersect at an angle relative to the direction corresponding to the direction of scanning of the element lenses 708a.

Figure 37E:
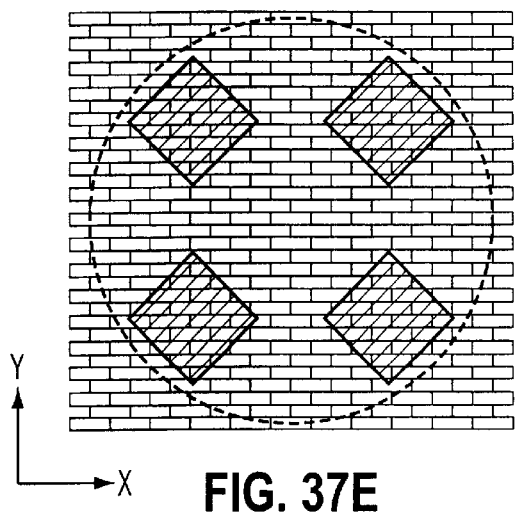

The shape of the illumination regions are not limited to hexagonal, but other polygonal shapes may be used as long as the system is set in such a manner that the edges of the illumination regions intersect at angle relative to the direction corresponding to the direction of scanning of the element lenses 708a. In fact, the shape of the illumination regions IA may be rectangular as shown in FIG. 37E.

Moreover, even if the shape of the illumination regions is hexagonal, uneven illumination is not reduced, which is undesirable, as long as the edges are parallel to the direction corresponding to the scanning direction of the element lenses 708a (for example the illumination region IA shown in FIG. 37D is rotated 30 around its center of gravity.)

In the above examples, four illumination regions are formed on the incident surface of the fly-eye lens 708 assuming quadrupolar illumination, but the examples may be applied to multiple polar illumination such as octopolar illumination.

As described above, when a plurality of illumination regions are formed by the diffractive optical device and the relay lens on the incident surface of the wavefront dividing (splitting) type integrator, imaging performance may be improved and light loss may be reduced while reducing uneven illumination on the surface being irradiated, by setting the system in such a manner that the edges of a plurality of illumination regions are inclined relative to the direction corresponding to the scanning direction of the wavefront dividing (splitting) type integrator element lenses. Here, the imaging performance may be further improved by setting the major axis of the illumination regions in the tangential direction (sagittal direction).

Application of this particular example may not be limited to the fifth embodiment, can be used with any of the embodiments described above and below.

Figure 38:
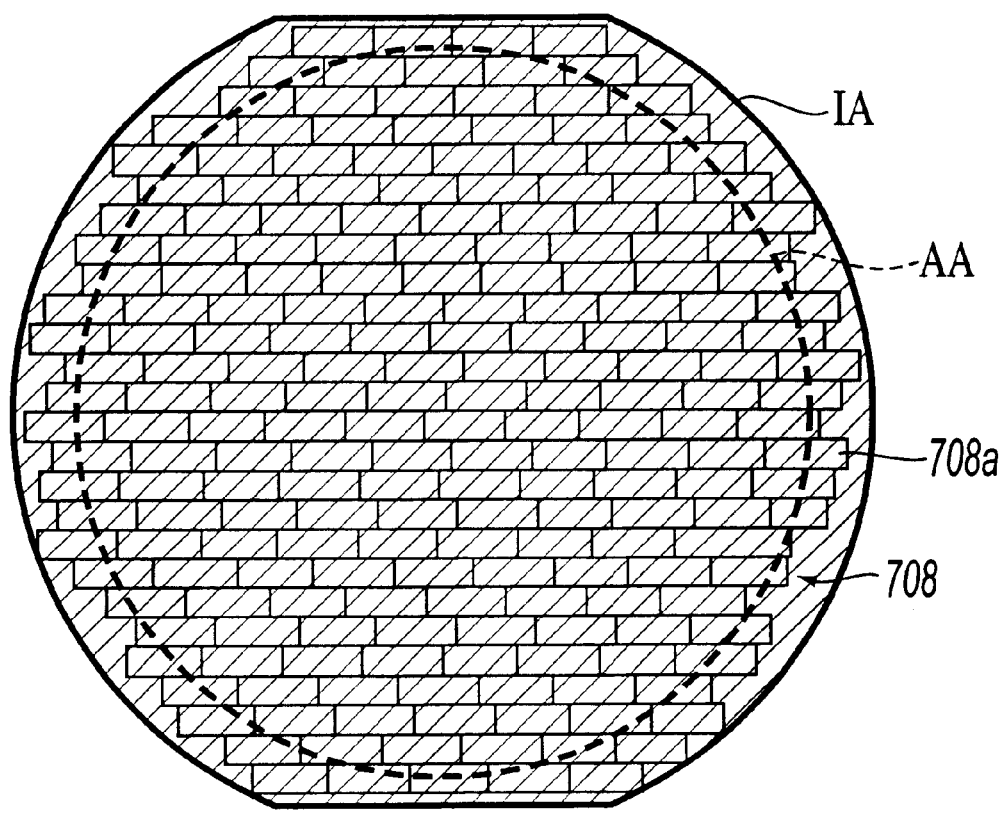
FIG. 38 shows another exemplary illumination configuration on the incident surface of the optical integrator.

Now, returning to FIG. 29, when the aperture stop 762 is selected by rotating the revolver 706B, the third diffractive optical device 753 is positioned in the optical path by rotating the revolver 706A. The third diffractive optical device 753 has third diffraction characteristics and across-section of the diffraction light beams are near circular (barrel shaped) as shown in FIG. 38. Moreover, the illumination region IA, which is a near circular light intensity distribution, is formed on the incident surface of the fly-eye lens 708 through the relay lens 707. For this reason, the illumination efficiency may be improved substantially compared to the case in which an auxiliary fly-eye lens of the prior art is used.

Although three diffractive optical devices 751–753 with different diffraction characteristics and three auxiliary fly-eye lenses with different focal lengths are used, only three diffractive optical devices 751–753 with different diffraction characteristics may be used, if desired.

If each of the element lenses 708a in the fly-eye lens 708 are arranged randomly, namely the element lenses are not arranged in a lattice, optimum illumination for the size of the element lenses 708a needed in the fly-eye lens 708 may be achieved by arranging the diffractive optical device with diffraction characteristics to make the outer shape of the diffraction light beams polygonal. As a result, the amount of light loss may be reduced substantially while maintaining uniformity of the illumination.

The effective region of the first diffractive optical device 751 is described above as being similar to the cross-section of the element lenses 708a of the fly-eye lens 708, but the effective regions of the second and the third diffractive optical devices 752, 753 can also be respectively similar to the cross-section of the element lenses 708a of the fly-eye lens 708. Hence, even when the second and the third diffractive optical devices are selected with changes in illumination conditions, the uniformity of the macroscopic light intensity distribution at the positions of aperture stops 761, 762 on the exit side of the fly-eye lens 708 may be improved, and further, the uniform illumination of the reticle 714 and the wafer 716 may be achieved.

Next, a case in which both the first diffractive optical device 751 with ring-shape divergent characteristics and a circular aperture stop 765 are used will be described.

In such combined illumination, the entire illumination region may be utilized as far as the interior section of the ring band illumination region formed by the diffractive optical device 751 due to the absence of an inner stop in the annular aperture. Hence, annular illumination may be achieved while holding light loss to a minimum. Combined use of the second diffractive optical device 752 having four-region dispersion characteristics and a circular stop 765 also results in a similar effect as a case in which the diffractive optical device 751 and the aperture stop 765 are used together.

Figure 39:
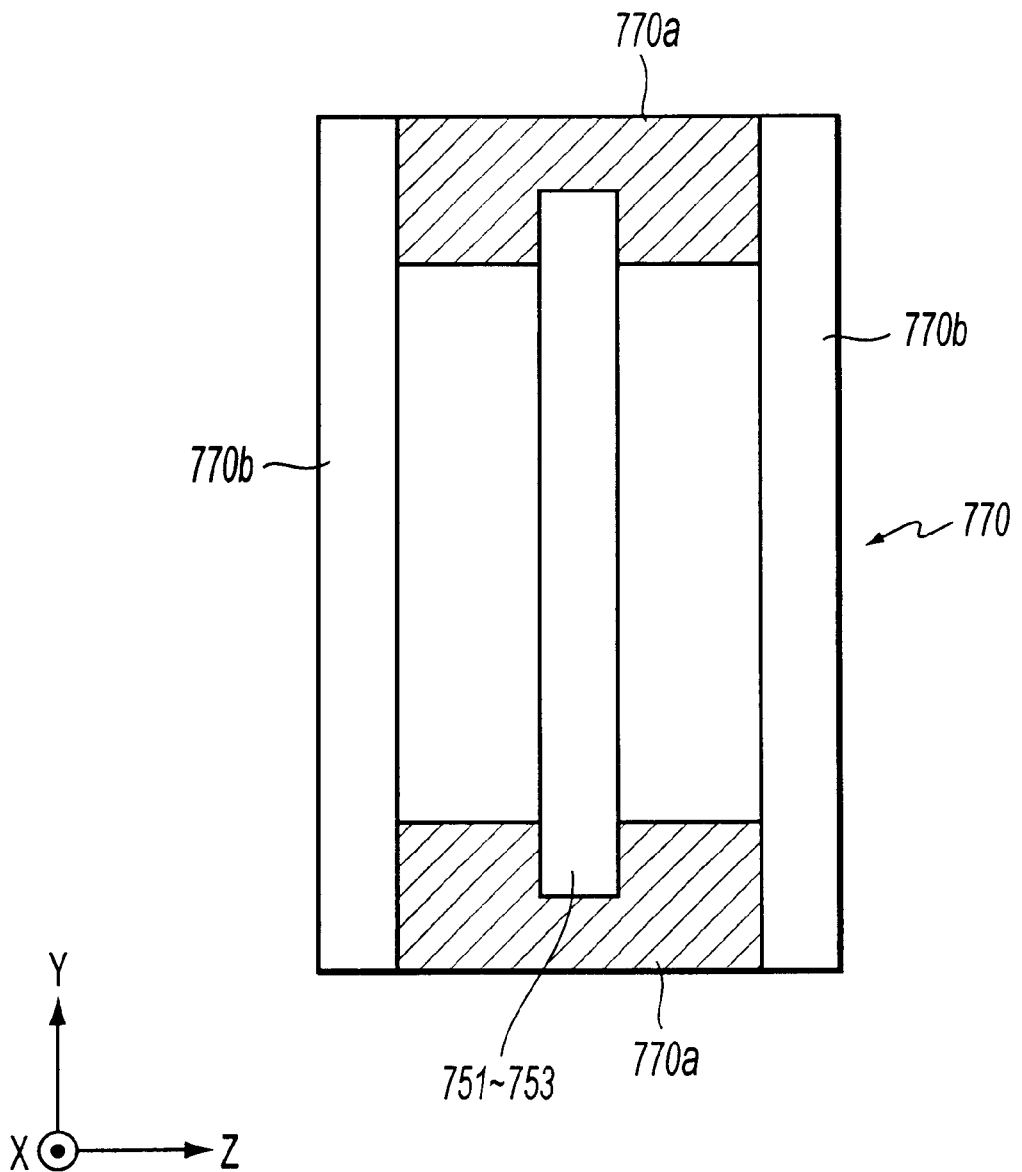
FIG. 39 schematically shows a protection container for the diffractive optical element in the sixth embodiment.

Next, a method of arranging diffractive optical devices 751–753 within the revolver 706A will be described. Each diffractive optical device is stored in a protection container 770 as shown in FIG. 39. The protection container 770 includes a metal holder 770a for supporting the diffractive optical devices 751–753, and a cover glass 770b which is a pair of protective optical members anchored by and held parallel to each other by the metal holder 770a. In other words, the diffractive optical devices 751–753 are protected, in the direction of the optical axis, by the pair of cover glasses 770b from foreign objects, such as gas generated by oxygen outside of the protection container 770 being excited by ultra-violet rays. In this case, the attachment of foreign objects occurs only on the cover glass 770b, hence, even if the transmission rate deteriorates due to the attachment of the foreign objects, the recovery of the transmission rate may be achieved by simply replacing the cover glass 770b without replacing the relatively more expensive diffractive optical device 751–753.

Returning to FIG. 29, the diffraction surfaces of the diffractive optical devices 751–753 are preferably set at a position offset from a front focus of a relay optical system that guides the diffraction light beams from any of the diffractive optical devices 751–753 into the fly-eye lens 708 (optical integrator), along the optical axis direction. In such a structure, it becomes possible to reduce the interference noise (interference fringe) being generated on the reticle 714 or the wafer 716.

It is preferable that the fly-eye lens 708 has an upstream cover glass with an obscuration region on the optical axis. The obscuration region shields the fly-eye lens 708 from $0^{th}$ order diffraction rays caused by the diffractive optical device 751–753, and prevents the fly-eye lens 708 from damage.

Seventh Embodiment

Figure 40:
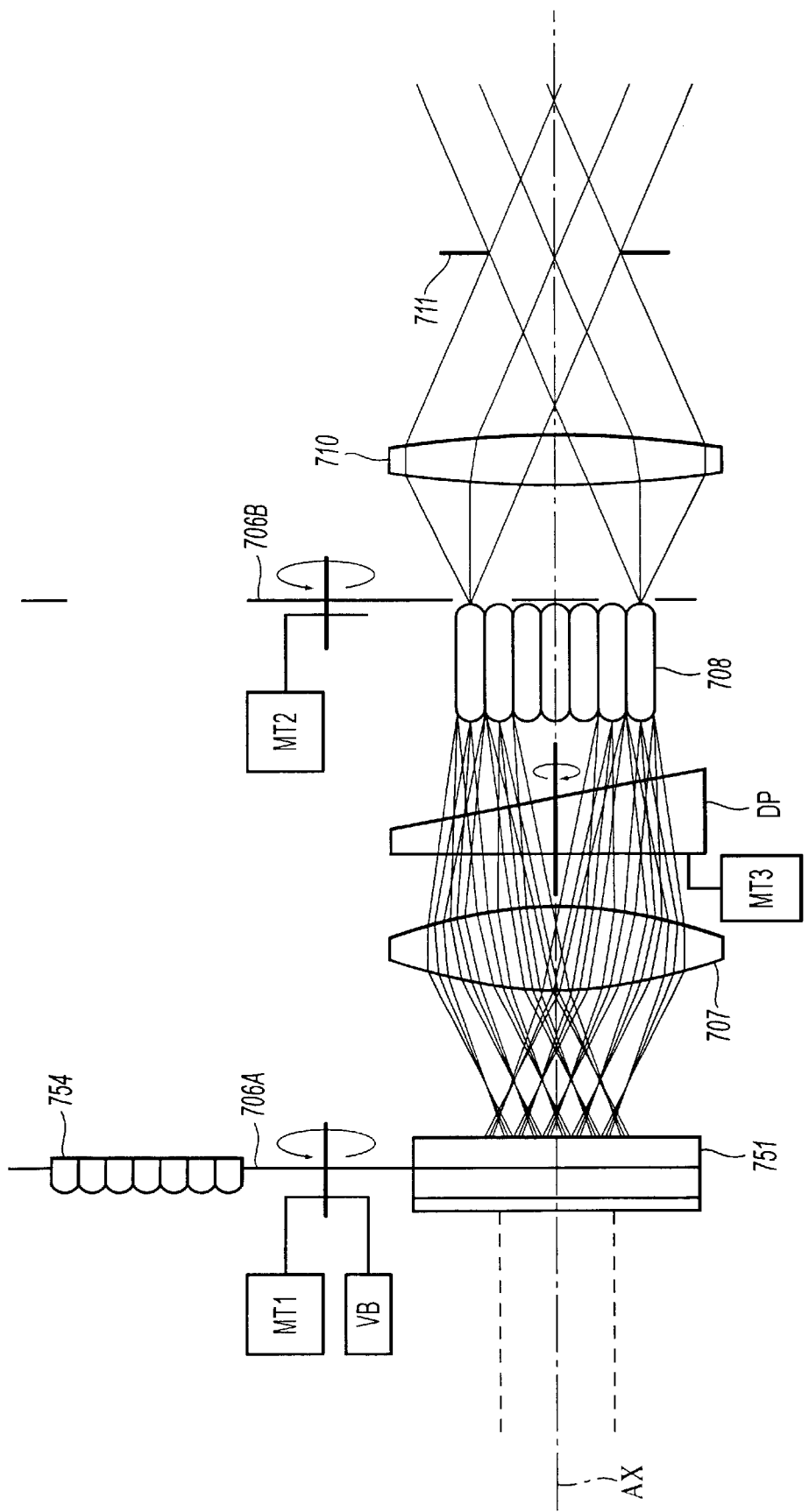
FIG. 40 is a schematic diagram of an illumination optical apparatus according to the seventh embodiment of the invention.

FIG. 40 shows an illumination optical system in accordance with a seventh embodiment of the invention. The basic structure is similar to the apparatus in the sixth embodiment, thus, the description of common portions or features is omitted.

When the first through the third diffractive optical devices 751–753 are positioned in the optical path, light beams passing through the diffractive optical device and irradiated onto the incident surface of the fly-eye lens 708 may result in a non-uniform illumination intensity distribution due to the noise caused by a speckled pattern. Hence, a speckled pattern on the incident surface of the fly-eye lens 708 is made to vibrate by vibrating the diffractive optical devices 751–753 together with the revolver 706A by the vibration mechanical unit VB. As a result, the speckled pattern becomes averaged over the exposure time period, and uniform light intensity distribution is obtained.

Furthermore, by arranging a v-shaped (a wedge shaped) deflection prism DP between the relay lens 707 and the fly-eye lens 708, and by rotating the prism under exposure by the motor MT3 with the center of said prism DP nearly coinciding with the optical axis AX, the light intensity distribution formed on the incident surface of the fly-eye lens 708 may be rotated. As a result, the speckled pattern also is rotated and the speckled pattern becomes averaged over the exposure time period, and light beams with uniform intensity may be obtained, as in the case of vibrating the diffractive optical devices 751–753. Either the vibration of the diffractive optical devices or the use of a deflection prism DP, or both may be adopted.

Moreover, in the case of the light source 701 emitting pulse light, the speckled pattern may become averaged by shifting or tilting the diffractive optical devices 751–753 over a predetermined number of pulses.

Eighth Embodiment

FIG. 41A is a schematic drawing of a portion of the illumination optical system according to a eighth embodiment of the invention. In this example, at least the position or the posture of a portion of relay lens between two optical integrators is changed. As a result, at least position matching or changing the size of the illumination region on the downstream optical integrator is executed, and adjustment of uneven illumination and adjustment of telecentricity are performed on the wafer. In FIG. 41A, only the structure between the upstream optical integrator (first optical integrator) and the downstream optical integrator (second optical integrator) is described.

In FIG. 41A, the relay optical system 807 which guides the light beams from the first optical integrator 805 to the second optical integrator comprises a front group 807a and a rear group 807b. A vibration mirror 807c is also arranged between the front group 807a and the rear group 807b. In FIG. 41A, a folded optical path by vibration mirror 807c is shown in an unfolded state. The front group 807a and/or the rear group 807b are arranged in such a manner that minute three dimensional motion and small rotation around a pair of axes perpendicular to the optical axis is enabled. A vibration mechanism 872 is connected to the front group 807a and/or the rear group 807b and changes the position and the posture of at least the front group 807a or the rear group 807b.

A driving mechanism 872 either moves the front group 807a and/or the rear group 807b perpendicular to the optical axis, or tilts the front group 807a and/or the rear group 807b relative to the optical axis to perform position matching between the illumination region formed by the first optical integrator and the incident surface of the fly-eye lens 808.

A driving mechanism 873 is also provided for the vibration mirror 807c to enable three dimensional minute movement or small rotation around the pair of axes perpendicular to the optical axis of the vibration mirror 807c. A driving mechanism that changes an angle of the vibration mirror 807c during exposure time to reduce interference noise is not shown here and is provided separately from the driving mechanism 873. Position matching of the illumination regions on the second optical integrator may be performed by tilting the vibration mirror 807c relative to the direction perpendicular to the optical axis.

The size of the illumination region on the incident surface of the fly-eye lens 808 may be adjusted by moving at least the front group 807a or the rear group 807b toward the optical axis using the driving mechanism 872. In this case, due to the movement of at least the front group 807a or the rear group 807b toward the optical axis, the deformation of the relay optical system 807 itself changes and the position of the image formed by the relay optical system 807 moves toward the optical axis. Hence, the surface light source formed by the fly-eye lens 808 changes, enabling adjustment of at least uneven illumination or telecentricity on the wafer.

By appropriately operating driving mechanisms 872, 873 described above, uneven illumination and telecentricity may be adjusted accurately on the pattern surface of the reticle or on the exposure surface of the wafer. Here, telecentricity refers to the small amount of tilt of the illumination light beams entering the wafer 716 and the like, and to the imaging isotropy on the exposure surface and the like of wafer 716. Uneven illumination and telecentricity are adjusted by shifting or tilting the optical elements contained in the condenser optical system provided at the rear stage of the fly-eye lens 808, but even more precise adjustment is enabled by combining the minute movement of the optical elements which constitute the relay lens 807 provided in the front stage of the fly-eye lens.

FIG. 41B is a schematic drawing describing a portion of the illumination optical system of a variation of the eighth embodiment in an unfolded state. In this example, the relay optical system is made to be a zoom optical system with a continuously variable focal length as opposed to the relay optical system being a fixed focal length optical system.

In FIG. 41B, the relay optical system 907 which guides light from the first optical integrator 905 to the second optical integrator 908 comprises, in the following order from the first optical integrator 905 side, a positive lens group 907a, a negative lens group 907b, a positive lens group 907c, and a positive lens group 907d. Out of a plurality of lens groups 907a–907d, the lens groups 907b–907d are able to move in the direction of the optical axis along a predetermined track denoted by an arrow in the figure. The focal length of the relay optical system 907 is changed by the movement of the lens groups 907b–907d.

At least one of the lens groups 907a–907d is structured to move in the direction of the optical axis independent of the aforementioned movement for changing the focal length. By this movement, the deformation of the relay optical system 907 itself is changed, and the position, in the direction of optical axis, of the image formed by the relay optical system 907 also changes. As a result, the image being formed on the second optical integrator 908 becomes out of focus and the surface light source formed by the second optical integrator 908 changes.

The driving mechanism 972 is connected to at least one of lens groups 907b–907d which move in the direction of optical axis during the focal length change or the lens groups 907a–907d (at least one out of 907a–907d) which move along optical axis during defocusing. The driving mechanism 972 is controlled by a control system connected to the input unit which receives information corresponding to the type of reticle to be imaged. To be more specific, the control system controls the driving mechanism 972 so that the positions of a plurality of lens groups 907b–907d are changed to the desired positions based on information corresponding to the type of reticle. Moreover, the driving mechanism 972 changes the positions, in the direction of the optical axis, of each lens group 907a–907d.

At this time, the type of reticle or illumination condition, and the position of each lens group may be stored beforehand in the memory connected to the control system, and control of said driving mechanism 972 may be performed by referring to the data stored in said memory. Here, intensity distribution on the wafer surface may be measured and the data stored in the memory may be updated using the results of the measurement.

Moreover, instead of storing data in the aforementioned memory relating to the type of reticle or to the relationship between the position of each lens group, data concerning the relationship between the amount of movement of each lens group and the amount of change of uneven illumination may be pre-stored, and each lens group may be controlled to operate based on a relationship equation.

An illumination meter for measuring the intensity distribution on the wafer surface is connected beforehand to a control system so that the position of each lens group may be changed depending on the intensity distribution on the wafer surface measured by the illumination meter.

At least one of the lens groups 907a–907d of the relay optical system 907 may be made movable on the surface perpendicular to the optical axis and/or made to be tiltable relative to the direction perpendicular to the optical axis.

Now, a case will be examined in which aforementioned diffractive optical device 751 is adopted as the first optical integrator 905. In this case, by changing the focal length of the relay optical system 907, the outer diameter of the annulus may be changed while maintaining the annular ratio of the illumination region formed on the second optical integrator 908 constant. Moreover, by defocusing the imaging position of the relay optical system 907, the annular ratio may be changed.

In this example, a four-group zoom lens was adopted for the relay optical system 907, but a two-group zoom lens, three-group zoom lens or five-group zoom lens may be adopted instead of the four-group zoom lens. In order to change the focal length while maintaining the position of the image from the relay optical system 907 itself constant, it is sufficient to configure the relay optical system 907 with at least two movable lens groups. In order to maintain the telecentricity at the second optical integrator 908 constant while maintaining the image position constant during the time of changing the focal length, the movable lens group in the relay optical system 907 is preferably a three- or larger group zoom lens.

In an illumination apparatus employing a wave surface splitting type integrator and an inner surface reflection type integrator, the optical system, for arranging the exit surface of the wave surface splitting type optical integrator and the incident surface of the inner surface reflection type integrator to be conjugate of each other, may be arranged between the two integrators. In applying such an illumination apparatus to the above examples, it is sufficient to make the posture and/or the position of the portion of the optical system arranged between the two integrators changeable.

Moreover, variations described above may be applied to any of aforementioned embodiments. For example, in applying to the second through fourth embodiments, the relay optical system 7 (or 7a) between the first fly-eye lens 6 and the second fly-eye lens 8 can be replaced with the relay optical system 907.

As applied to the first embodiment, the relay optical system 7 between the diffractive optical device 6 and the first fly-eye lens 8 can be replaced with the relay optical system 907.

As applied to the fifth embodiment shown in FIG. 23, the relay optical system 607 between the specialty fly-eye lens 606 and the fly-eye lens 608 can be replaced with the relay optical system 907.

As applied to the sixth embodiment, the relay optical system 707 between the diffractive optical device 751 (–753) and the fly-eye lens 708 can be replaced with the relay optical system 907.

It is also possible to combine the first through eighth embodiments mentioned above.

Ninth Embodiment

Figure 42:
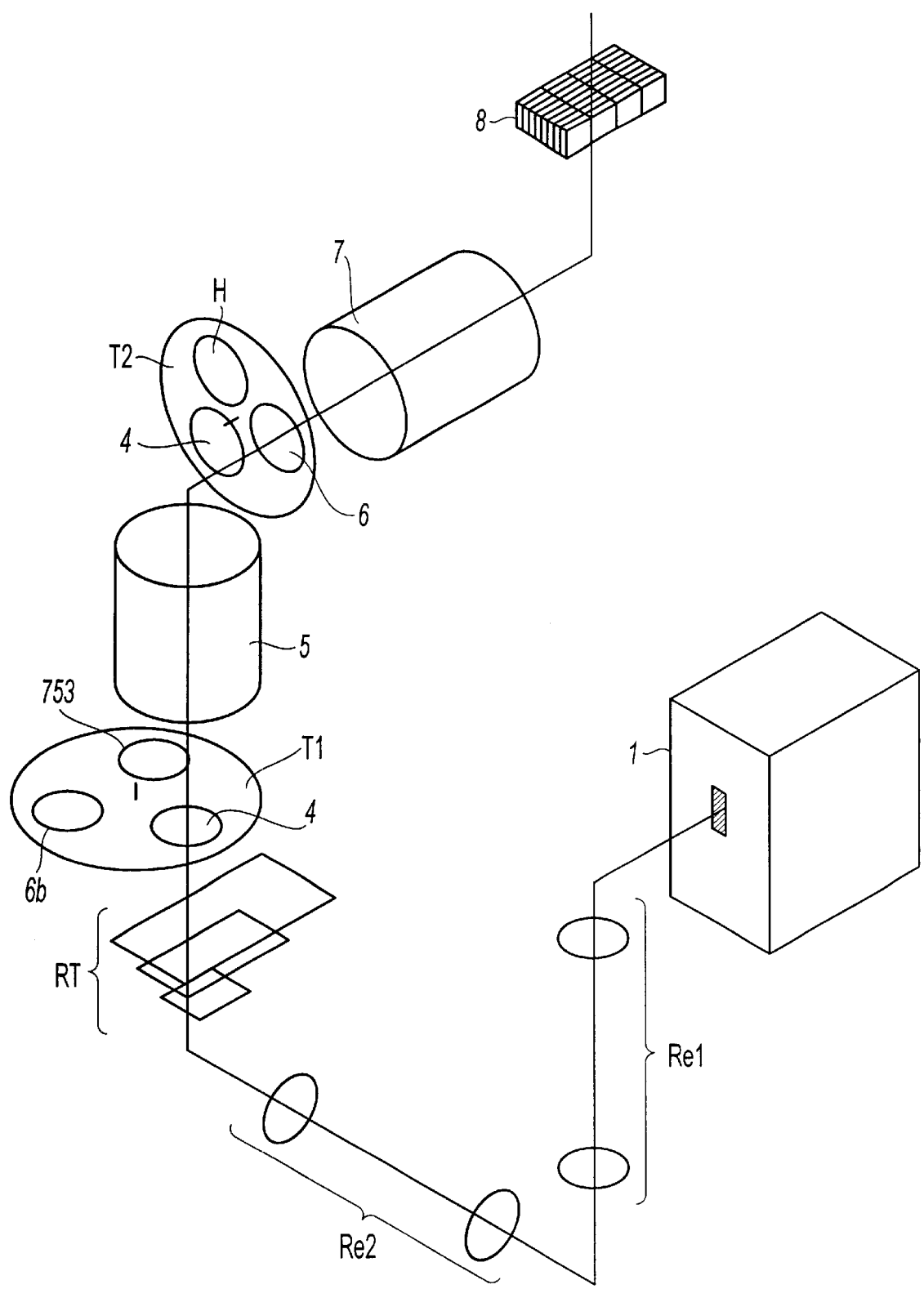
FIG. 42 is a schematic diagram of an illumination optical apparatus according to a ninth embodiment of the invention.

FIG. 42 is a schematic diagram of an illumination optical system of an ninth embodiment of the invention. In this example, the micro fly's eye lens 4 of the first embodiment, diffractive optical device 6b of the third embodiment, and the diffractive optical device 753 of the sixth embodiment are attached to a turret T1. One of these devices is selected and inserted within illumination optical path. Moreover, the diffractive optical device 6 of the first embodiment and the fly-eye lens (micro fly's eye lens) 4 of the third embodiment are attached to a turret T2. Moreover, the turret T2 also contains an aperture (hole) H. One of these devices and the hole H is selected and arranged within the illumination optical path.

Plural sets of magnification relay optical systems Re1, Re2 and an optical path delaying optical system RT are arranged between the laser light source 1 and the turret T1. The optical path delaying optical system is described in Japanese Unexamined Patent Publication No. Hei. 11-174365, and U.S. patent application Ser. No. 09/300,660, filed Apr. 27, 1999, which are hereby incorporated by reference in their entirety. The afocal zoom optical system 5 described in the first through fourth embodiments is arranged between the turret T1 and the turret T2, and a zoom optical system 7 is arranged between the turret T2 and the fly-eye lens 8.

By setting the micro array lens 4 on the turret T1 and the diffractive optical device 6 on the turret T2 on the illumination optical path, annular illumination is obtained. Moreover, by setting the diffractive optical device 6b on the turret T1 and the fly-eye lens 4 on the turret T2 in the illumination optical path, quadrupolar illumination is obtained. By setting the diffractive optical device 753 on the turret T1 and the hole H on the turret T2 in the illumination optical path, a regular circular illumination is obtained.

Tenth Embodiment

Figure 43:
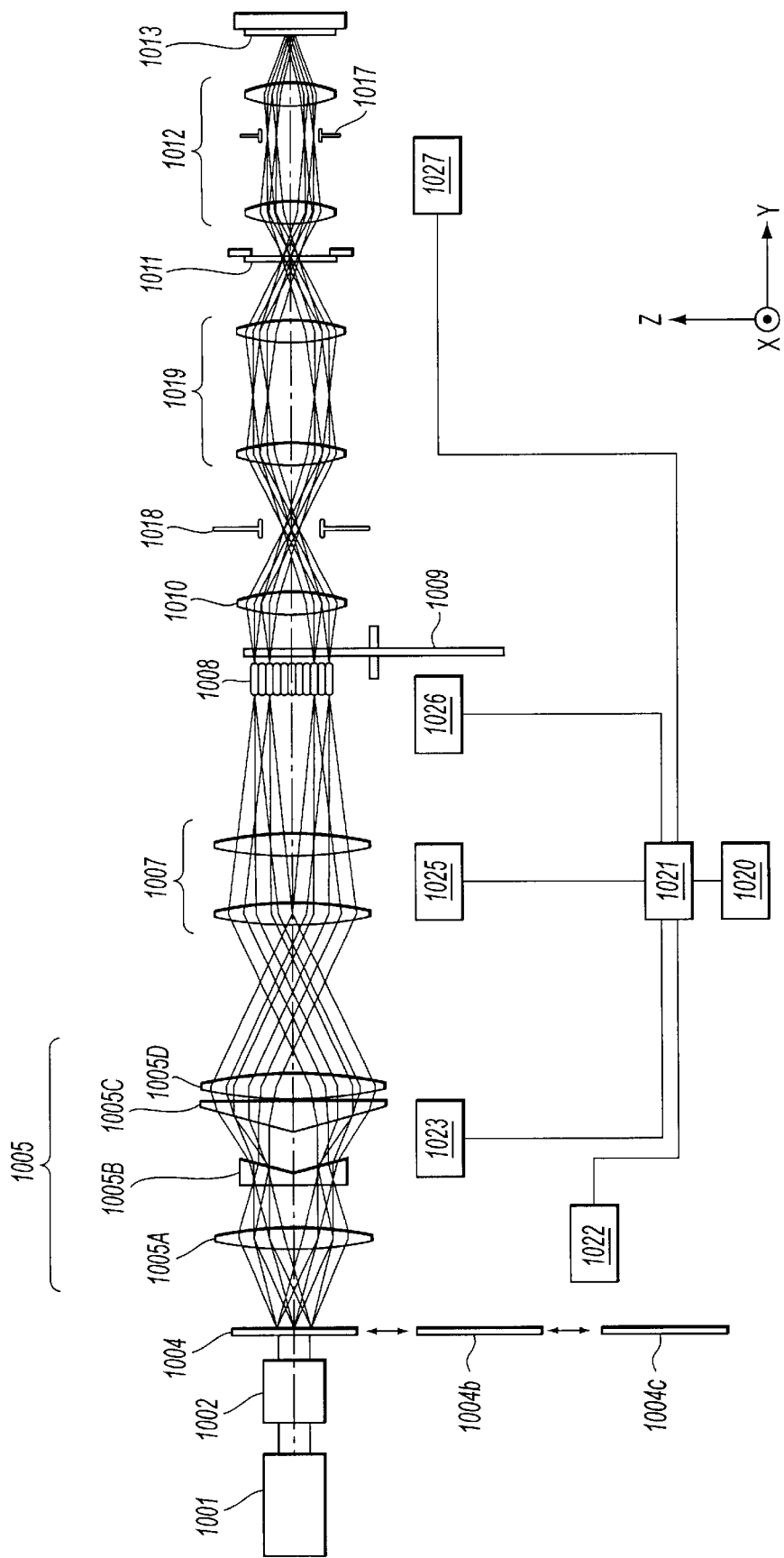
FIG. 43 is a schematic diagram of an illumination optical apparatus according to a tenth embodiment of the invention.

FIG. 43 is a schematic diagram of an illumination optical system in accordance with a tenth embodiment of the invention.

The light source 101 is preferably either KrF (oscillation wavelength 248 nm) or ArF excimer laser light source (oscillation wavelength 193 nm), but other light sources can be used. Nearly parallel light beams emitted from the light source 1001 in the direction of the Y-axis enter the diffractive optical device 1004 through a magnification relay optical system 1002.

The diffractive optical device 1004 transforms and emits the entering excimer laser beam with a rectangular cross-section to have a nearly ring shaped cross-section in the far field (Fraunhofer diffraction region) of the diffractive optical device 1004. The diffractive optical device 1004 is equivalent to the diffractive optical device 751 of the sixth embodiment. Here, the diffractive optical device 1004 is provided in such a manner that it is interchangeable with the diffractive optical device 1004b which is equivalent to the diffractive optical device 752 in the sixth embodiment and with the diffractive optical device 1004c, which is equivalent with the diffractive optical device 753.

In the lower side of the diffractive optical device 1004, lens group 1005A, a concave prism member 1005B with a concave cone shape refraction surface, a convex prism member 1005C with a convex cone refraction surface facing the concave surface of the concave prism member 1005B, and an annular ratio variable optical system 1005 with a lens group 1005D are arranged.

The convex prism member 1005C is movable in the direction along the optical axis of the illumination apparatus. Instead of moving the convex prism member 1005C, the concave prism member 1005B may be moved, or both the concave prism member 1005B and the convex prism member 1005C may be moved. Here, the order of the concave prism member 1005B and the order of the convex prism member 1005C may be reversed.

Downstream of the annular ratio variable optical system 1005, a zoom optical system 1007 with a plurality of lens groups is arranged. A zoom optical system equivalent of the zoom optical system 907 in the eighth embodiment is used, for example, as the zoom optical system 1007.

Downstream of the zoom optical system 1007, a fly-eye lens 1008 is arranged as a wave surface splitting type optical integrator, and downstream of the fly-eye lens 1008, a variable aperture stop 1009 is arranged.

At the exit side of the fly-eye lens 1008, a variable aperture stop 1009, a condenser lens 1010, an illumination field stop 1018 and an illumination field stop imaging optical system 1019 are arranged. Light beams from the fly-eye lens 1008 form an annular shaped surface light source due to the function of the variable aperture stop 609 which restricts a portion of the light beams. Light beams from the annular shaped surface light source, after being overlapped by the condenser lens 1010, illuminate the illumination field stop 1018. The aperture unit of the illumination field stop 1018 and the reticle 1011 are substantially in a conjugate relationship due to the illumination field stop imaging optical system 1019, and the illumination region, which is an image of the aperture unit of the illumination field stop 1018, is formed on the reticle 1011.

In this instance, the systems from the reticle 1011 to the wafer 1013 are similar to each of aforementioned embodiments, hence any further explanation is omitted.

Now, the conjugate relationship of each member will be described. First, the variable aperture stop 1009 is arranged at the pupil surface of the illumination apparatus, and the positions nearly conjugate to the pupil surface of the illumination apparatus are the front side (incident side) focal plane of the zoom optical system 1007, the diffraction surface of the diffractive optical device 1004, and the pupil of the illumination field stop imaging optical system 1019. Here, the diffraction surface of the diffractive optical device 1004 may be set at the defocus position relative to the pupil conjugate surface.

The incident surface of the fly-eye lens 1008 is positioned at a position conjugate to the wafer 1013, and the positions nearly conjugate to the wafer 1013 are the pupil surface of the annular ratio variable optical system 1005 (the surface on which the rear focus of the lens (group) 1005A and the front focus of the lens (group) 1005D coincide), the incident surface of said fly-eye lens 1008 and the illumination field stop 1018, and the pattern surface of the reticle 1011.

In the annular ratio variable optical system 1005, the concave cone prism 1005B receives light beams in a nearly annular shaped cross-section which are diffracted by the diffractive optical device 1004. By changing the distance between the concave cone prism 1005B and the convex cone prism 1005C, the angle of light beams emitted from the annular ratio variable optical system 1005 to the zoom optical system 1007 is changed.

Once the angle of light beams received by the zoom optical system 1007 is changed, the outer diameter (inner diameter) is changed while the width of the annulus of the annular shape illumination region formed in the vicinity of the incident surface of the fly-eye lens 1008 is maintained constant. Moreover, when the focal length of the zoom optical system 1007 is changed, the outer diameter (inner diameter) is changed, while the annular ratio (the ratio of the inner diameter and the outer diameter of the ring) of the annular shape illumination region formed in the vicinity of the incident surface of the fly-eye lens 1008 is maintained constant.

As a result, the annular shaped illumination region formed on the incident surface of the fly-eye lens 1008 may be changed to have an arbitrary outer diameter (inner diameter) and an arbitrary annular ratio by combining the movement of the prism member in the annular ratio variable optical system 1005 and the motion to change the focal length of the zoom optical system 1007. Furthermore, the outer diameter (inner diameter) and the annular ratio of the annular shaped secondary light source formed on the exit side of the fly-eye lens 1008 may be set to arbitrary values.

A first driving system 1022 for interchanging the diffractive optical devices 1004, 1004b, 1004c, a second driving system 1023 for changing the distance between prism members 1005B and 1005C in the annular ratio variable optical system 1005 in order to change the angle of light beams from the annular ratio variable optical system 1005, a fourth driving system 1025 for moving at least one of the plurality of lens groups in the zoom lens 1007 in the direction of the optical axis in order to change the focal length of the zoom lens 1007, a fifth driving system 1026 for driving the variable aperture stop 1009 to specify the size and the shape of the surface light source (secondary light source), and a sixth driving system 1027 for driving the variable aperture stop 1017 in the projection optical system 1012 to specify the aperture number of the projection optical system 1012.

An input unit 1020 for entering information concerning the type of reticle (mask), and a control system 1021 for controlling said first sixth driving systems 1022–1027 based on the information from the input unit 1020 are also provided.

When performing quadrupolar (multi-polar) illumination, the diffractive optical device 1004b is inserted in the illumination path. In this case, the positions of four illumination regions formed on the incident surface of the fly-eye lens 1008 may be changed by controlling the distance between the prism members 1005B and 1005C in the annular ratio variable optical system 1005, and the sizes of the four illumination regions may be changed by changing the focal length of the zoom optical system 1007. By controlling these two optical systems (the annular ratio variable optical system 1005 and the zoom optical system 1007), the size and the distance from the optical axis of four surface light sources formed at the pupil position of the illumination apparatus may be adjusted freely.

In performing quadrupolar illumination, a pyramid shaped prism member is preferably used instead of a cone shape prism member. In this case, interchanging the cone-shaped prism member with a pyramid shaped prism member may be automatically executed with the interchanging of the diffractive optical devices.

When performing normal illumination, the diffractive optical device 1004c is inserted in the illumination optical path by the first driving system 1022. In this case, the size of the circular surface light source formed at the pupil position of the illumination apparatus may be adjusted freely by changing the focal length of the zoom optical system 1007.

In each of the embodiments above, the downstream-most optical integrator preferably has a wave splitting number (integral number) of 300 or larger. Thus, unevenness of illumination on the surface being irradiated may be reduced by the aperture unit of the illumination aperture stop arranged on the exit side of the optical integrator, even if the edge section of the surface light source including many light sources formed by the wave surface splitting type optical integrator is not specified.

The reasons for above are described hereafter. First, the case in which the shape of each of a plurality of element optical systems (a plurality of lens surfaces or a plurality of reflection surfaces) is square and in which a circular irradiation region is formed on the incident surface of the wave surface splitting type optical integrator will be examined. In this case, the integral number N (the number of wave surface splits) of the wave surface splitting type optical integrator is given by the formula:

$$N = \pi(R^2/d^2) \tag{16}$$

where d is the length of the side of the element optical system and R is the radius of the irradiation region.

In the wave surface splitting region (corresponding to the irradiation region above) of the wave surface splitting optical integrator, the number Ns of the splitting regions which exist around the perimeter is given by the formula:

$$Ns = 2\pi(R/d) \tag{17}$$

Here, the interior of the splitting regions that exist around the perimeter may suffer uneven illumination with a maximum uneven illumination in one splitting region around the perimeter being 100%. However, the intensity of light beams reaching the splitting regions around the perimeter is weaker than the regions around the center. Hence, the effect of uneven illumination becomes small and the degree of the absolute effect on the surface being irradiated also becomes small.

Based on a comprehensive analysis of the above factors, uneven illumination which occurs in one split region around the perimeter may be estimated as ⅓ the unevenness of that in the region around the center. Moreover, due to the statistical randomness in the regions around the perimeter, the square root of the number Ns of the splitting regions around the perimeter may have an effect on uneven illumination on the surface being irradiated.

Hence, in order to reduce the uneven illumination on the surface being irradiated to 1% or less, the condition;

$$((\tfrac{1}{3})Ns^{(\tfrac{1}{2})})/N<0.01 \quad (18)$$

is preferably satisfied. Substituting (16) and (17) above in (18), $$N>249 \quad (19)$$

is obtained.

Hence, the wave surface splitting number by the optical integrator must exceed about 300 in order to control uneven illumination on the surface being irradiated, which leads to even control of uneven illumination on the surface being irradiated, and particularly when, the illumination conditions are changed.

In an optical integrator of the illumination apparatus which is applied to a scanning type exposure apparatus, the shape of the element optical system is rectangular, but an argument similar to above argument may be applied. Moreover, the argument used above is based on the integrator in which the element optical system such as fly-eye lenses is arranged in a two-dimensional matrix, but the above argument may be applied to an inner reflection type integrator such as a rod-type integrator (light pipe, light tunnel, glass rod).

In conclusion, in an illumination apparatus employing an optical integrator which splits incidental light beams from the light source and which uses the split light beams to illuminate the surface being irradiated overlappingly, the integral number for the optical integrator is preferably set to be 300 or larger. As a result, changes in uneven illumination on the surface being irradiated may be minimized even if the illumination regions on the incident surface (the opening angle (aperture angle) of incident light beams in the case of a wave surface splitting type optical integrator and in the case of an inner reflection type integrator) of the optical integrator change.

Figure 44:
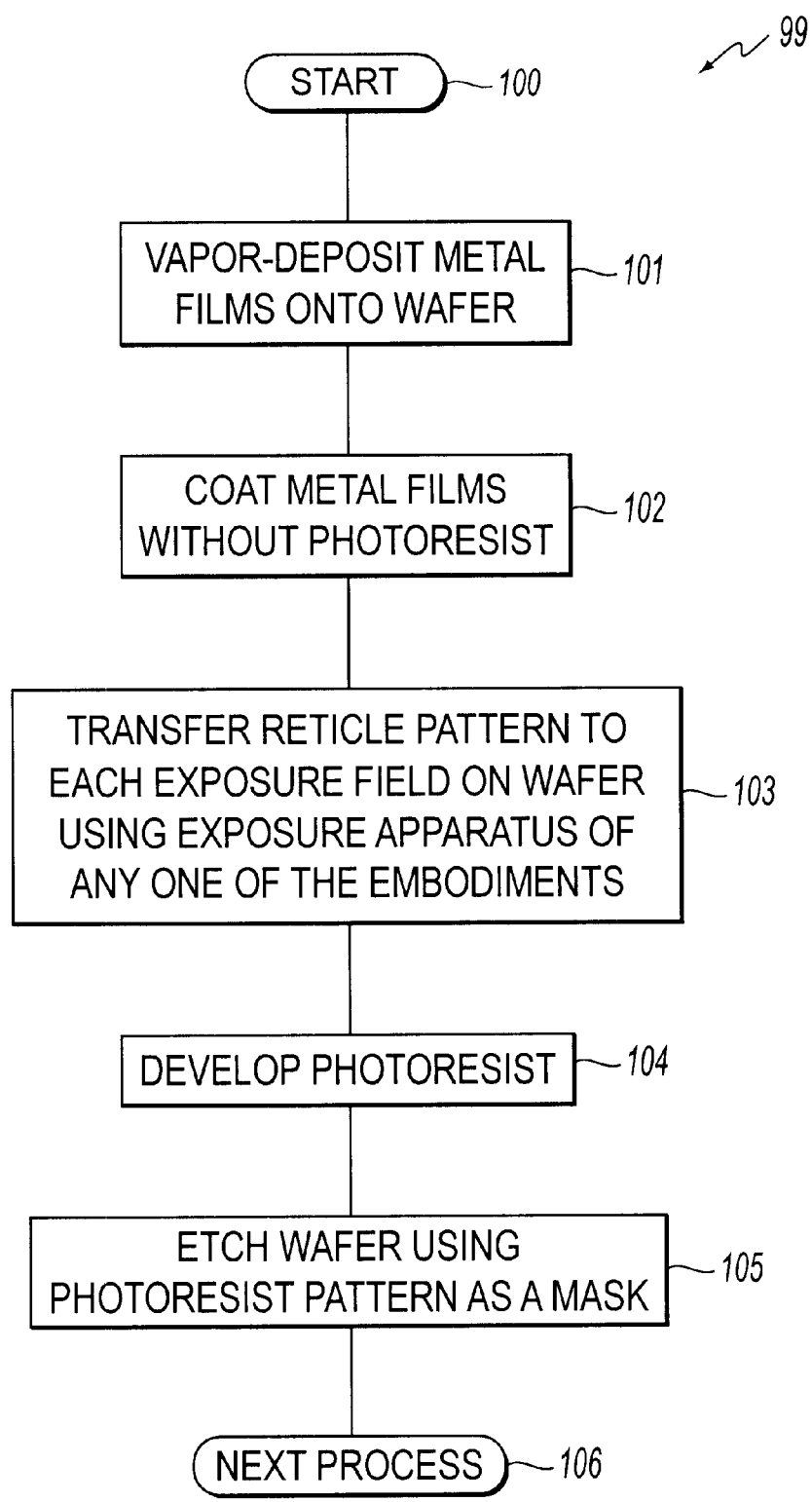
FIG. 44 is a flowchart of steps of a method for forming a pattern of an original on a substrate using an imaging device in accordance with the invention.

The following explains one example of operation when forming a predetermined circuit pattern on a wafer using an exposure apparatus of the above embodiments with reference to the flowchart 99 shown in FIG. 44.

First, after the "start" step 100, in step 101, metal films are deposited onto each wafer in a lot of wafers. In step 102, photoresist is coated onto the metal films of each wafer in the lot of wafers. Subsequently, in step 103, using the exposure apparatus of any one of above embodiments, the image of the pattern on the reticle is sequentially exposed and transferred onto the photoresist (photosensitive material) on each exposure region on each wafer. Subsequently, in step 104, the photoresist on each wafer in the lot of wafers is developed. By performing etching using the resist patterns as a mask in step 105, the circuit pattern corresponding to the pattern on the reticle is formed in each exposure region on each wafer. Subsequently, the manufacture of devices like a semiconductor device is completed by further forming circuit patterns on upper layers, as indicated by step 106, "next process."

In addition, detailed description of the diffractive optical element that can be used in above embodiments is disclosed in U.S. Pat. No. 5,850,300, which is hereby incorporated by reference in its entirety.

In the above embodiments, it is possible to form the diffractive optical element for example of silica glass because exposure light having a wavelength of not less than 180 nm is utilized by using as the light source a KrF excimer laser (wavelength: 248 nm) or an ArF excimer laser (wavelength: 193 nm) or the like.

When a wavelength of 200 nm or less is used for the exposure light, it is preferable for the diffractive optical element to be formed of material selected from among fluorite, silica glass doped with fluorine, silica glass doped with fluorine and hydrogen, silica glass with a structure determining temperature of 1200 K or less and an OH-radical concentration of 1000 ppm or greater, silica glass with a structure determining temperature of 1200 K or less and a chlorine concentration of 50 ppm or less, and silica glass with a structure determining temperature of 1200 K or less and a hydrogen molecule concentration of $1\times10^{17}$ molecules/cm$^3$ or greater and a chlorine concentration of 50 ppm or less.

Silica glass with a structure determining temperature of 1200 K or less and an OH-radical concentration of 1000 ppm or greater is disclosed in Japanese patent 2,770,224 (which corresponds to European patent 720970 B) by the present applicant, while silica glass with a structure determining temperature of 1200 K or less and a hydrogen molecule concentration of $1\times10^{17}$ molecules/cm$^3$ or greater, silica glass with a structure determining temperature of 1200 K or less and a chlorine concentration of 50 ppm or less, and silica glass with a structure determining temperature of 1200 K or less and a hydrogen molecule concentration of $1\times10^{17}$ molecules/cm$^3$ or greater and a chlorine concentration of 50 ppm or less are disclosed in Japanese patent 2,936,138 (which corresponds to U.S. Pat. No. 5,908,482) by the present applicant.

In addition, in the above described embodiments, the fly-eye lens 8, 608, 708, 808, 908 and 1008 are formed by integrating a plurality of element lenses, but it is also possible to make this a micro fly-eye lens. A micro fly-eye lens is created by providing a plurality of microlens surfaces in a matrix shape through a method such as etching or the like on an optically transmissive substrate. With regard to forming a plurality of light source images, there is no material difference in function between a fly-eye lens and a micro fly-eye lens, but a micro fly-eye lens has the benefits of enabling the size of the aperture of a single element lens (microlens) to be made extremely small, allowing a large reduction in production costs and greatly reducing the thickness in the optical axis direction. Moreover, the microlens surface on the incident and/or exit sides can be formed in an aspherical shape.

Figures 45A, 45B, 45C, 45D:
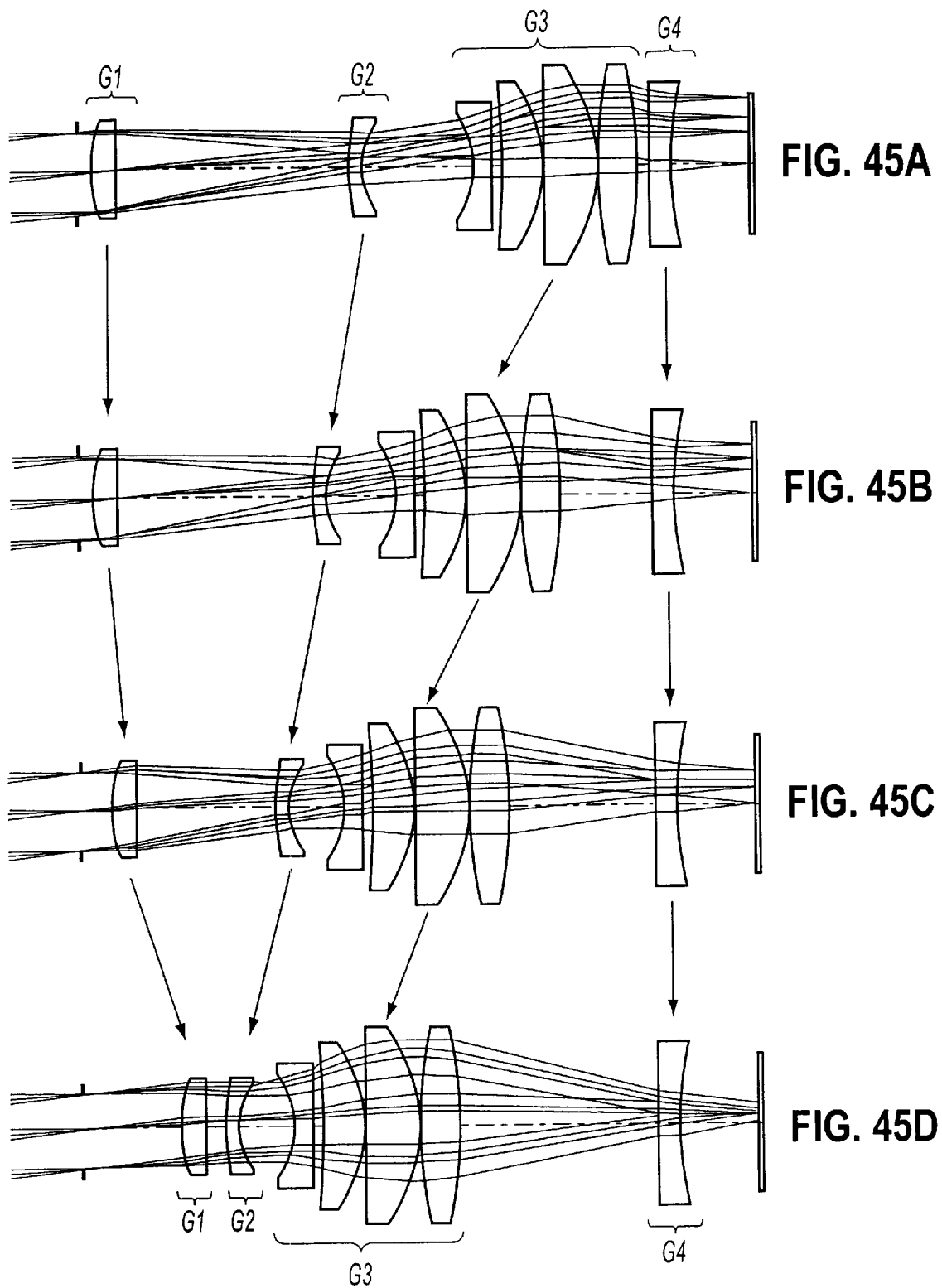
FIGS. 45A–45D show cross sections of a numerical value example.

In the above-mentioned embodiments, a zoom optical system having the numerical value example shown in FIG. 45 can be used as the zoom optical systems 7, 607, 707 and 710. FIGS. 45A–D are diagrams showing the movement path of the respective lens groups along with the change of the focal length from a maximum focal length state to a minimum focal length state of the zoom optical system according to the first numerical value embodiment. FIG.

45A shows a maximum focal length state (focal length F=570 mm). FIG. 45B shows a first intermediate focal length state (focal length F=380 mm). FIG. 45C shows a second intermediate focal length state (focal length F=285 mm). FIG. 45D shows a minimum focal length state (focal length F=190 mm).

The zoom optical system relating to this numerical value embodiment has a first lens group G1 having a positive refractive power, a second lens group G2 having a negative refractive power, a third lens group G3 having a positive refractive power, and a fourth lens group G4 having a negative refractive power.

Furthermore, in the zoom optical system of this numerical value embodiment, with respect to a change of the focal length from the maximum focal length state to the minimum focal length state, the first lens group G1 through the third lens group G3 move along the paths shown in FIGS. 45A–D, and the fourth lens group G4 is fixed. That is, with respect to a change of a focal length from the maximum focal length state to the minimum focal length state, the first lens group G1 moves toward the image side (downstream fly eye lens 8 side), and the second lens group G2 moves toward the object side (the upstream side). Furthermore, in the minimum focal length state, the first lens group G1 and the second lens group G2 approach each other.

Furthermore, with respect to a change of the focal length from the maximum focal length state to the minimum focal length state, the third lens group G3 moves toward the object side from a position (in FIG. 45A) where it approached the fixed fourth lens group G4.

Thus, in the zoom optical system of this numerical value embodiment, the interval between the first lens group G1 and the second lens group G2 in the maximum focal length state is larger than the interval between G1 and G2 in the minimum focal length state, and the interval between the third lens group G3 and the fourth lens group G4 in the maximum focal length state is smaller than the interval between G3 and G4 in the minimum focal length state.

Thus, in the zoom optical systems of this numerical value embodiment, when it is considered that an aperture diaphragm is arranged at a position in which the light source image (secondary light source) is formed and the incident surface of the fly eye lens 8 is an image plane, the structure is such that the positions of the exit pupil and of the entrance pupil and the positions of the image plane and the object plane do not substantially change when the focal length changes.

The following Table 3 shows lens data of a zoom optical system of this numerical value embodiment. In Table 3, F is the focal length of the zoom optical system, f1 is the focal length of the first lens group G1, f2 is the focal length of the second lens group G2, f3 is the focal length of the third lens group G3, and f4 is the focal length of a fourth lens group G4. Furthermore, d1 is an axial variable interval between an aperture diaphragm (light source image formation position, which is pupil conjugate position) and the first lens group G1, d3 is an axial variable interval between the first lens group G1 and the second lens group G2, d5 is an axial variable interval between the second lens group G2 and the third lens group G3, and d13 is an axial variable interval between the third lens group G3 and the fourth lens group G4. Furthermore, the surface numbers are the respective lens surfaces along the direction in which the light beam proceeds, r is the radius of curvature (mm) of the respective surfaces, d is the axial interval, that is, a surface interval (mm) of the respective surfaces, and n is the refractive index with respect to wavelength of exposure light.

TABLE 3

(General system data)

Focal length F: 570 mm~380 mm~285 mm~190 mm
Zoom ratio: 3
Aperture diaphragm diameter φ (Diameter): 60 mm
Light beam incident angle to the aperture diaphragm A: 0°, 2.5°, 3.6°, 5.1°

(Lens data)

| Surface number | r | d | n |
|---|---|---|---|
| 1 | (Aperture diaphragm) | (d1 = Variable) | |
| 2 | 171.43815 | 18.000000 | 1.50839 (First lens group G1) |
| 3 | −1132.08474 | (d3 = Variable) | |
| 4 | 171.92962 | 10.000000 | 1.50839 (Second lens group G2) |
| 5 | 64.53113 | (d5 = Variable) | |
| 6 | −60.25508 | 13.000000 | 1.50839 (Third lens group G3) |
| 7 | 723.78037 | 8.551388 | |
| 8 | −675.45783 | 30.000000 | 1.50839 |
| 9 | −110.00000 | 1.000000 | |
| 10 | 1541.19265 | 40.000000 | 1.50839 |
| 11 | −130.00000 | 1.000000 | |
| 12 | 288.43523 | 30.000000 | 1.50839 |
| 13 | −274.48506 | (d13 = Variable) | |
| 14 | −1242.27153 | 13.000000 | 1.50839 (Fourth lens group G4) |
| 15 | 173.46912 | 60.000000 | |
| 16 | (Image plan) | | |

(Variable interval for zooming)

| | Minimum focal length state | Second intermediate focal length state | First intermediate focal length state | Maximum focal length state |
|---|---|---|---|---|
| F | 190.0 | 285.0 | 380.0 | 570.0 |
| d1 | 77.96687 | 24.25432 | 10.00000 | 10.00000 |
| d3 | 15.00000 | 105.08205 | 145.98277 | 172.83221 |
| d5 | 40.00000 | 42.40557 | 51.65276 | 81.87262 |
| d13 | 142.49166 | 103.70659 | 67.81301 | 10.74371 |

Furthermore, the following Table 4 shows ray tracing data for a light beam that has an incident angle A on the aperture diaphragm of 0°, a light beam (R1) with an incident angle A of 2.5°, a light beam (R2) with an incident angle A of a 3.6°, and a light beam (R3) with an incident angle A of 5.1°.

In Table 4, θ is the angle of the chief ray (the light beam crossing the optical axis in the aperture diaphragm), with respect to the optical axis, and Y is the distance, that is, the image height, from the optical axis of the chief ray that reaches the image plane. Furthermore, the inclination angle of the chief ray at the image plane is the inclination angle of the chief ray with respect to the optical axis at the image plane.

TABLE 4

(Maximum focal length state)

| | |
|---|---|
| Focal length F | 570 mm |
| Axial interval between the aperture diaphragm and the image plane | 500 mm |
| Inclination angle of the chief ray at the image plane | 5.4' (R1:θ = 2.5°) |
| Inclination angle of the chief ray at the image plane | 4.5' (R2:θ = 3.6°) |
| Inclination angle of the chief ray at the image plane | 4.7' (R3:θ = 5.1°) |
| Image height Y | 24.9 mm (R1:θ = 2.5°) |
| Image height Y | 35.8 mm (R2:θ = 3.6°) |
| Image height Y | 50.7 mm (R3:θ = 5.1°) |

(First intermediate focal length state)

| | |
|---|---|
| Focal length F | 380 mm |
| Axial interval between the aperture diaphragm and the image plane | 500 mm |
| Inclination angle of the chief ray at the image plane | 3.0' (R1:θ = 2.5°) |
| Inclination angle of the chief ray at the image plane | 3.0' (R2:θ = 3.6°) |
| Inclination angle of the chief ray at the image plane | 0.4' (R3:θ = 5.1°) |
| Image height Y | 16.6 mm (R1:θ = 2.5°) |
| Image height Y | 23.9 mm (R2:θ = 3.6°) |
| Image height Y | 33.8 mm (R3:θ = 5.1°) |

(Second intermediate focal length state)

| | |
|---|---|
| Focal length F | 285 mm |
| Axial interval between the aperture diaphragm and the image plane | 500 mm |
| Inclination angle of the chief ray at the image plane | 5.2' (R1:θ = 2.5°) |
| Inclination angle of the chief ray at the image plane | 6.9' (R2:θ = 3.6°) |
| Inclination angle of the chief ray at the image plane | 7.9' (R3:θ = 5.1°) |
| Image height Y | 12.4 mm (R1:θ = 2.5°) |
| Image height Y | 17.9 mm (R2:θ = 3.6°) |
| Image height Y | 25.3 mm (R3:θ = 5.1°) |

(Minimum focal length state)

| | |
|---|---|
| Focal length F | 190 mm |
| Axial interval between the aperture diaphragm and the image plane | 500 mm |
| Inclination angle of the chief ray at the image plane | 3.0' (R1:θ = 2.5°) |
| Inclination angle of the chief ray at the image plane | 4.8' (R2:θ = 3.6°) |
| Inclination angle of the chief ray at the image plane | 8.1' (R3:θ = 5.1°) |
| Image height Y | 8.3 mm (R1:θ = 2.5°) |
| Image height Y | 11.9 mm (R2:θ = 3.6°) |
| Image height Y | 16.8 mm (R3:θ = 5.1°) |

Furthermore, if the light beam incident upon the fly eye lens 8 that follows the zoom optical system is inclined with respect to the optical axis of the respective lens elements of the fly eye lens 8, eclipse of the light beam is generated at the exit surface of the fly eye lens 8 and the effectiveness of illumination deteriorates. According to a general design example, in order to substantially avoid eclipse of the light beam at the emitting surface of the fly eye lens 8, the inclination angle needs to be within approximately ±5° with respect to the optical axis of the chief ray at the image plane of the zoom optical system, and preferably within approximately ±1° in order to properly suppress the change of the illumination distribution on the mask.

With reference to Table 4, in the zoom optical system of the numerical value embodiment, the inclination angle is extremely small with respect to the optical axis of the chief ray at the image plane, and the position of the exit pupil hardly changes from an infinite distance when the focal length changes. Additionally, there is absolutely no change in the position of the image plane when the focal length changes. In addition, needless to say, there is absolutely no change in the position of the entrance pupil as well.

Thus, in the zoom optical system of this numerical value embodiment, all the lens components are arranged toward the image plane from the pupil plane, and a desired zoom ratio can be secured without substantially changing the positions of the emitting pupil and the incident pupil and the positions of the image plane and the object plane with respect to the change of the focal length.

Furthermore, in the above-mentioned numerical value example, a positive.negative.positive.negative refractive power arrangement was used, but a negative.positive.negative.positive refractive power arrangement can also be used as shown in the following Table 5.

TABLE 5

(General system data)

Focal length F: 600 mm~400 mm~300 mm~200 mm
Zoom ratio: 3
Aperture diaphragm diameter φ (Diameter): 60 mm
Light beam incident angle A to the aperture diaphragm A:
0°, 2.4°, 3.3°, 4.8°

(Lens data)

| Surface number | r | d | n | |
|---|---|---|---|---|
| 1 | (Aperture diaphragm) | (d1 = Variable) | | |
| 2 | −185.06450 | 13.000000 | 1.50839 | (First lens group G1) |
| 3 | 3586.41632 | (d3 = Variable) | | |
| 4 | 384.28464 | 27.438625 | 1.50839 | (Second lens group G2) |
| 5 | −271.20132 | 1.000000 | | |
| 6 | 97.04956 | 39.594311 | 1.50839 | |
| 7 | −2482.11415 | 1.000000 | | |
| 8 | 93.60504 | 21.938153 | 1.50839 | |
| 9 | 144.92710 | 17.078265 | | |
| 10 | −219.42806 | 8.000000 | 1.50839 | |
| 11 | 52.67801 | (d11 = Variable) | | |

TABLE 5-continued

| 12 | −100.31175 | 13.000000 | 1.50839 (Third lens group G4) |
| 13 | −199.93788 | (d13 = Variable) | |
| 14 | 713.30899 | 21.983709 | 1.50839 (Fourth lens group G4) |
| 15 | −168.61553 | 60.000000 | |
| 16 | (Image plan) | | |

(Variable interval for zooming)

| | Minimum focal length state | Second intermediate focal length state | First intermediate focal length state | Maximum focal length state |
|---|---|---|---|---|
| F | 200.0 | 300.0 | 400.0 | 600.0 |
| d1 | 29.834241 | 8.531256 | 15.409789 | 8.531256 |
| d3 | 176.157154 | 121.422675 | 70.994410 | 10.000000 |
| d11 | 60.419144 | 30.985358 | 60.209359 | 162.073170 |
| d13 | 9.456398 | 114.927649 | 129.253380 | 95.262510 |

While the present invention has been described with reference to preferred ements thereof, it is to be understood that the invention is not limited to the dsed embodiments or constructions. To the contrary, the invention is intended to various modifications and equivalent arrangements. In addition, while the various elements of the disclosed invention are shown in various combinations and configurations, that are exemplary, other combinations and configurations, including more, less or only a single element, are also within the spirit and scope of the invention.

What is claimed is:

1. An illumination optical system for a projection imaging apparatus, comprising:

a light source that emits an illumination light;

a light beam converter having a diffractive optical device that diffracts the light from the light source and divides a wavefront of the light from the light source, and an optical device that converts the light from the light source into light having a predetermined sectional shape at a predetermined plane;

an optical integrator that forms a substantially planar light source based on light from the light beam converter; and an optical system that guides the light from the optical integrator, wherein a diffractive characteristic of said diffractive optical device is changeable for forming different light intensity distributions at said predetermined plane, and wherein the light intensity distribution comprising a light intensity distribution differs in light intensity between a central region of said predetermined plane and a peripheral region of said predetermined plane with a nearly even light intensity distribution.

2. The system of claim 1, wherein:

said light beam converter includes a first diffractive optical device having a first diffractive characteristic and a second diffractive optical device having a second diffractive characteristic; and said first and second diffractive optical devices can be selectively positioned among a position within an optical path of said system and a position outside of said optical path.

3. The system of claim 2, wherein:

the first diffractive optical device forms the light intensity distribution different in light intensity between the central region of said predetermined plane and the peripheral region of said predetermined plane; and the second diffractive optical device forms the nearly even light intensity distributions.

4. The system of claim 2, wherein:

the light beam converter has a zoom optical system arranged in an optical path between the diffractive optical device and the predetermined plane.

5. The system of claim 4, wherein:

the optical device has a zoom optical system.

6. The system of claim 1, wherein:

the light beam converter has a zoom optical system arranged in an optical path between the diffractive optical device and the predetermined plane.

7. A projection imaging apparatus for imaging a pattern image of a mask onto a workpiece, comprising:

an illumination optical system of claim 1 that illuminates the mask; and a projection optical system, arranged in an optical path between the mask and the workpiece, that images the pattern image of the mask onto the workpiece.

8. A method of imaging a pattern image of a mask onto a workpiece, comprising the steps of:

illuminating the mask with an illumination optical system of claim 1; and projecting the pattern image of the mask onto the workpiece.

9. An illumination optical system for a projection imaging apparatus, comprising:

a light source that emits an illumination light having a predetermined wavelength;

a wavefront dividing type optical integrator that forms a substantially planar light source;

a condenser that guides the light from the wavefront dividing type optical integrator into a mask surface or a mask conjugate surface, in a superposing manner; and a light beam converter, disposed between said light source and said wavefront dividing type optical integrator, having a diffractive optical device that diffracts the light from the light source and divides the wavefront of the light from the light source, and an optical device that converts the light from the light source into light having a predetermined sectional shape at a predetermined plane, wherein an entrance surface of said wavefront dividing type optical integrator is substantially disposed in said predetermined plane, and wherein the predetermined sectional shape at the predetermined plane comprising a sectional shape differs in light intensity between a central region of said predetermined plane and a peripheral region of said predetermined plane and the sectional shape with a nearly even light intensity distribution.

10. The system of claim 9, wherein:

said light beam converter includes a first diffractive optical device having a first diffractive characteristic and a second diffractive optical device having a second diffractive characteristic; and said first and second diffractive optical devices can be selectively positioned among a position within an optical path of said system and a position outside of said optical path.

11. The system of claim 10, wherein:

the first diffractive optical device forms the light intensity distribution different in light intensity between the central region of said predetermined plane and the peripheral region of said predetermined plane; and the second diffractive optical device forms the nearly even light intensity distribution.

12. The system of claim 10, wherein:

the optical device has a zoom optical system.

13. The system of claim 9, wherein:

the optical device has a zoom optical system.

14. A projection imaging apparatus for imaging a pattern image of a mask onto a workpiece, comprising:

an illumination optical system of claim 9 that illuminates the mask; and a projection optical system, arranged in an optical path between the mask and the workpiece, that images the pattern image of the mask onto the workpiece.

15. A method of imaging a pattern image of a mask onto a workpiece, comprising the steps of:

illuminating the mask with an illumination optical system of claim 9; and projecting the pattern image of the mask onto the workpiece.

16. An illumination optical system for a projection imaging apparatus, comprising:

a light source that emits illumination light;

a light beam converter having a diffractive optical device that diffracts the light from the light source, and converts the light into light having a predetermined sectional shape at a predetermined plane;

an optical integrator that forms a substantially planar light source based on light from the light beam converter; and an optical system that guides light from the optical integrator;

wherein said diffractive optical device is disposed in an enclosed space formed by a pair of covering optical members.

17. The system of claim 16, wherein:

said diffractive optical device within said light beam converter includes a diffractive characteristic for forming a light intensity distribution that differs in light intensity between a central region of said predetermined plane and a peripheral region of said predetermined plane.

18. A projection imaging apparatus for imaging a pattern image of a mask onto a workpiece, comprising:

an illumination optical system of claim 16 that illuminates the mask; and a projection optical system, arranged in an optical path between the mask and the workpiece, that images the pattern image of the mask onto the workpiece.

19. A method of imaging a pattern image of a mask onto a workpiece, comprising the steps of:

illuminating the mask with an illumination optical system of claim 16; and projecting the pattern image of the mask onto the workpiece.

20. An illumination optical system for a scanning projection imaging apparatus, comprising:

a light source that emits an illumination light;

a diffractive optical device that diffracts the light from the light source; and an optical integrator that forms a substantially planar light source based on light from the diffractive optical device, wherein said optical integrator includes a plurality of optical elements having a first direction corresponding to a scanning direction, a second dimension crossing the first direction, a first dimension along the first direction and a second direction along the second direction, the first direction differs from the second direction, wherein said diffractive optical device forms an illumination region on said plurality of optical elements, and wherein said illumination region has an edge that inclines in a direction corresponding to the scanning direction.

21. The system of claim 20, wherein:

said illumination region has a plurality of illumination sub-regions separated from each other.

22. The system of claim 21, wherein:

said illumination sub-regions have a substantially elliptical shape.

23. A scanning projection imaging apparatus imaging a pattern image of a mask onto a workpiece, comprising:

an illumination optical system of claim 20 that illuminates the mask; and a projection optical system, arranged in an optical path between the mask and the workpiece, that images the pattern image of the mask onto the workpiece.

24. A method of scanning projecting a pattern image of a mask onto a workpiece, comprising the steps of:

illuminating the mask with an illumination optical system of claim 20; and projecting the pattern image of the mask onto the workpiece.

* * * * *